United States Patent
Ito et al.

(12) United States Patent    (10) Patent No.: US 6,758,550 B2
   (45) Date of Patent:    Jul. 6, 2004

(54) SYSTEM AND METHODS FOR MANUFACTURING A COLOR FILTER USING A SCANNING INK JET HEAD

(75) Inventors: Tatsuya Ito, Matsumoto (JP); Hisashi Aruga, Fujimi-machi (JP); Satoru Katagami, Hara-mura (JP); Tomomi Kawase, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 61 days.

(21) Appl. No.: 10/186,427

(22) Filed: Jul. 2, 2002

(65) Prior Publication Data

US 2003/0007033 A1 Jan. 9, 2003

(30) Foreign Application Priority Data

Jul. 4, 2001 (JP) .................................... 2001-203807
May 27, 2002 (JP) .................................... 2002-152294

(51) Int. Cl.$^7$ ................................................ B41J 2/15
(52) U.S. Cl. ................................................ 347/40
(58) Field of Search ............................ 347/40, 20, 41, 347/42, 43, 47, 5, 9, 12, 13; 349/106, 104, 84

(56) References Cited

U.S. PATENT DOCUMENTS 5,501,535 A * 3/1996 Hastings et al.

* cited by examiner

Primary Examiner—Raquel Yvette Gordon
(74) Attorney, Agent, or Firm—Oliff & Berridge, PLC

(57) ABSTRACT

The invention provides a system and methods for manufacturing an optical member, such as a color filter, using a scanning ink-jet head, where all nozzles of the ink-jet head precisely scan formation regions of pixels. In accordance with the invention, the accuracy of discharge position of ink from each nozzle is increased, the utilization of the nozzle (printing efficiency) is heightened, variations in color from pixel to pixel are controlled, and optical characteristics of an optical member is thus made uniform in plan view. In the method for manufacturing a color filter, a plurality ink-jet heads 22, each head having a plurality of nozzles 27, performs a main scan and a sub scan. Further, in accordance with the invention, if W represent the spacing between two closest nozzles at the closest ends of the two adjacent ink-jet heads 22 with one nozzle in one head 22 and the other nozzle in the other head 22, and D represent a constant layout pitch D of the nozzles 27, then the following equation holds:

$W = mD$ ($m$ is an integer of 2 or larger).

Additionally, if P represent a sub scanning motion pitch of the head 22, then the following equation holds:

$P = nD$ ($n$ is an integer of 1 or larger).

48 Claims, 28 Drawing Sheets

FIG. 1
(a)
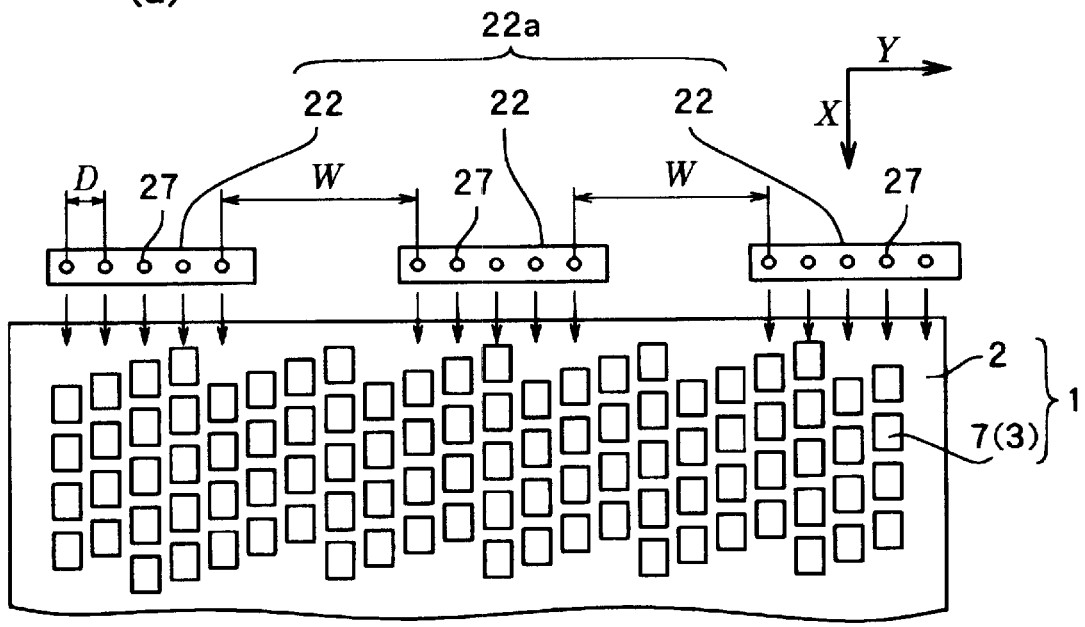
(b)
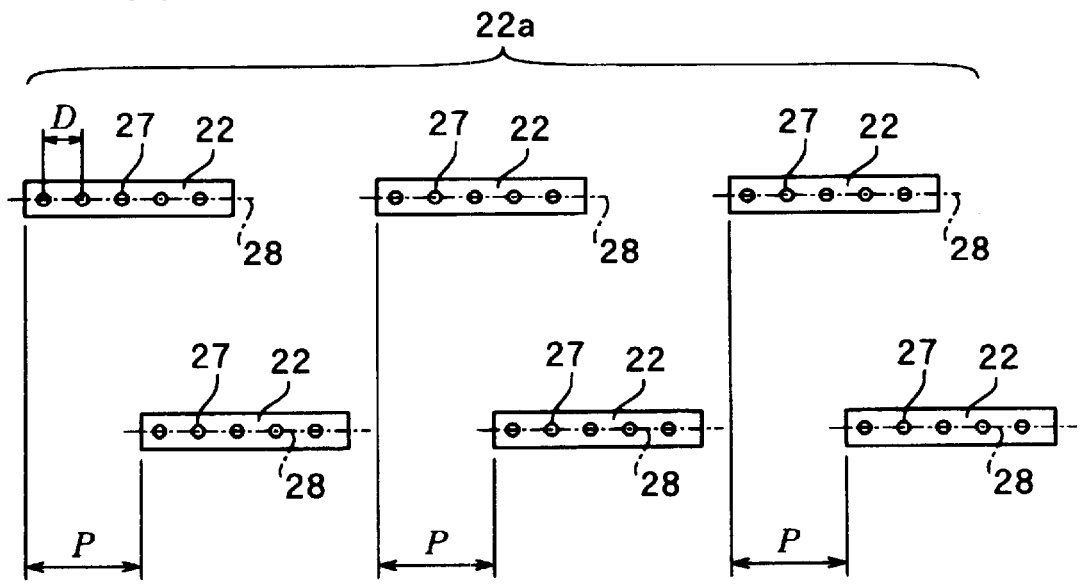

FIG. 5
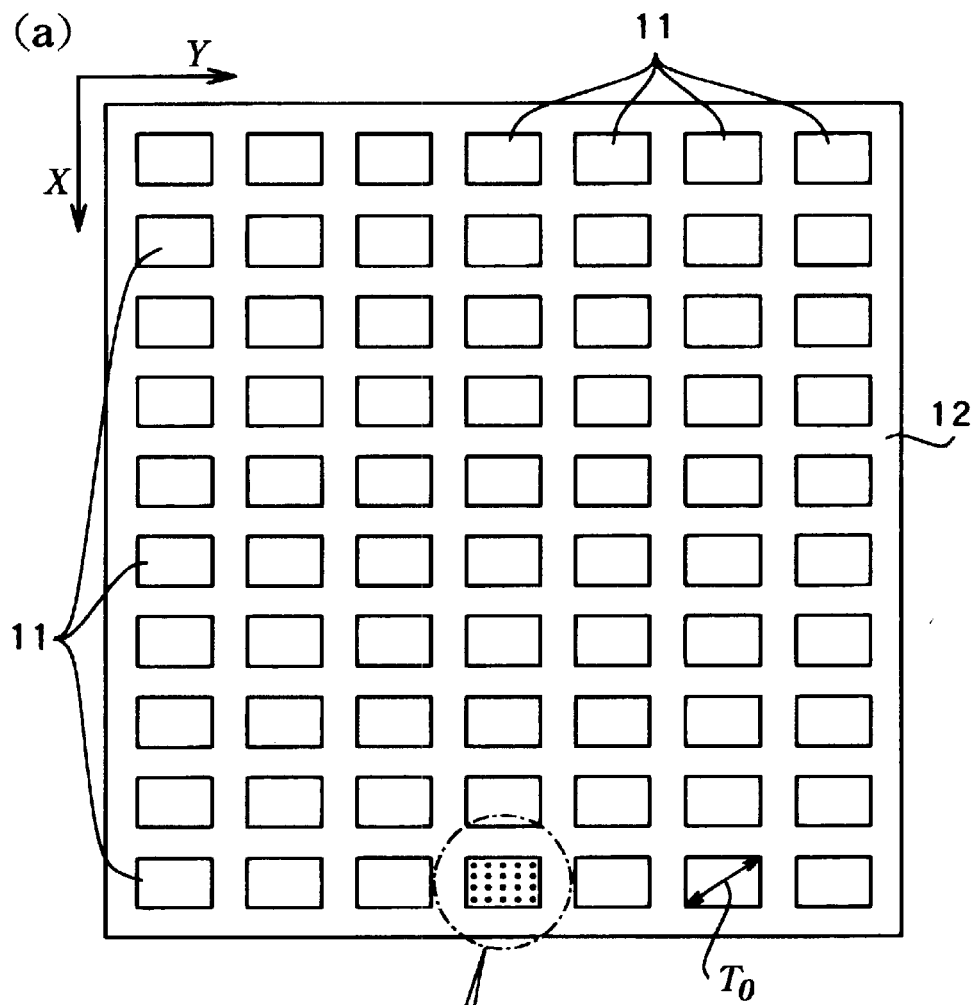
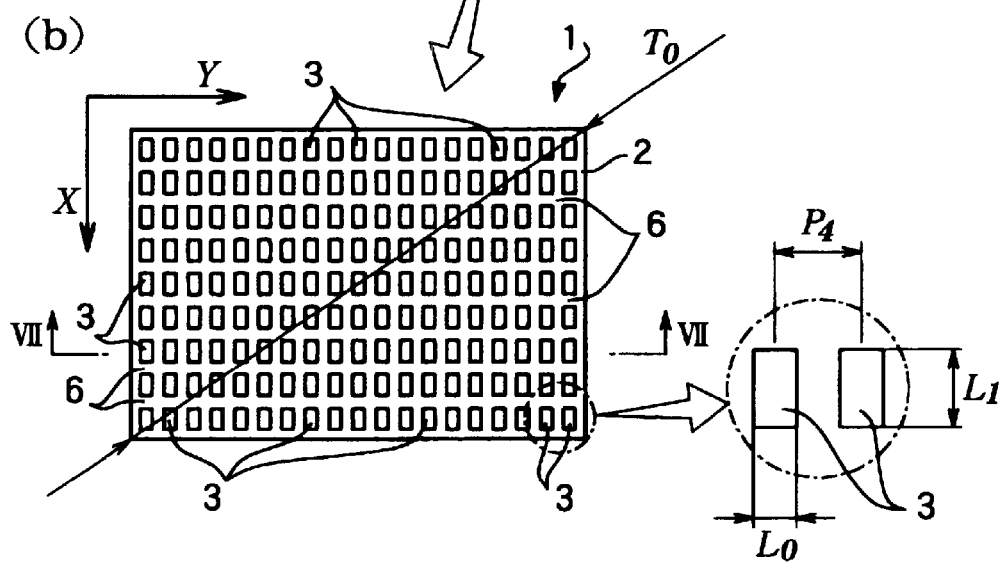

FIG. 6
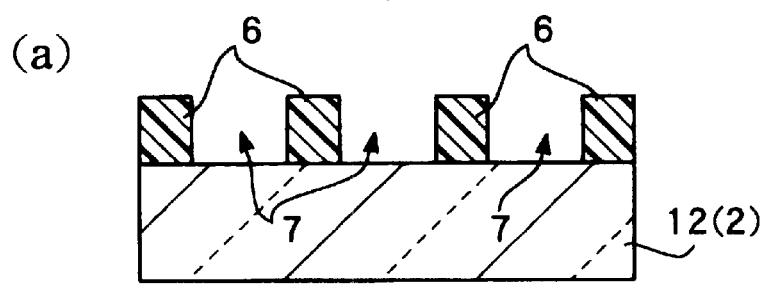
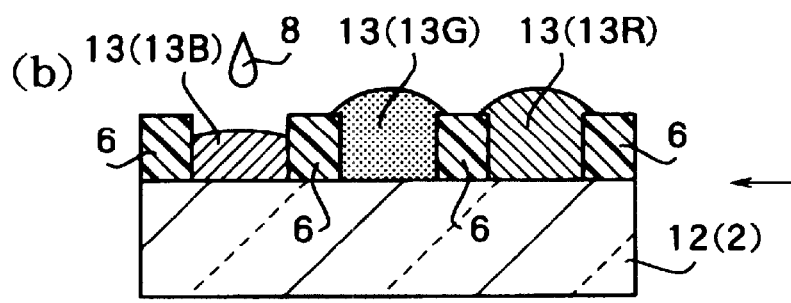
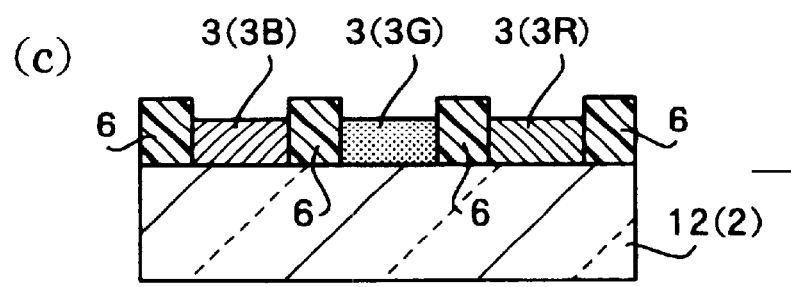
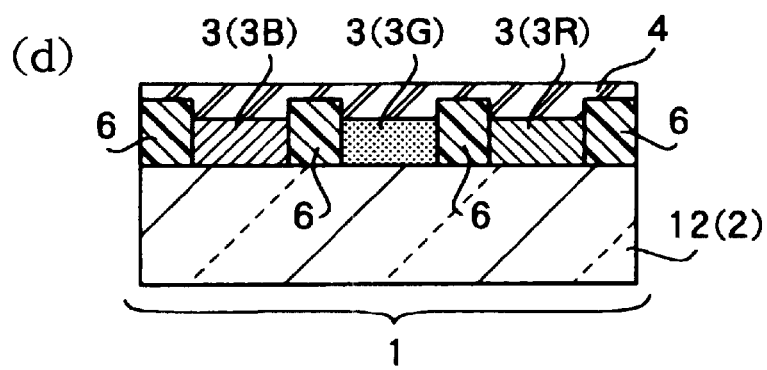

(a) STRIPE (b) MOSAIC (c) DELTA

FIG. 15
(a)
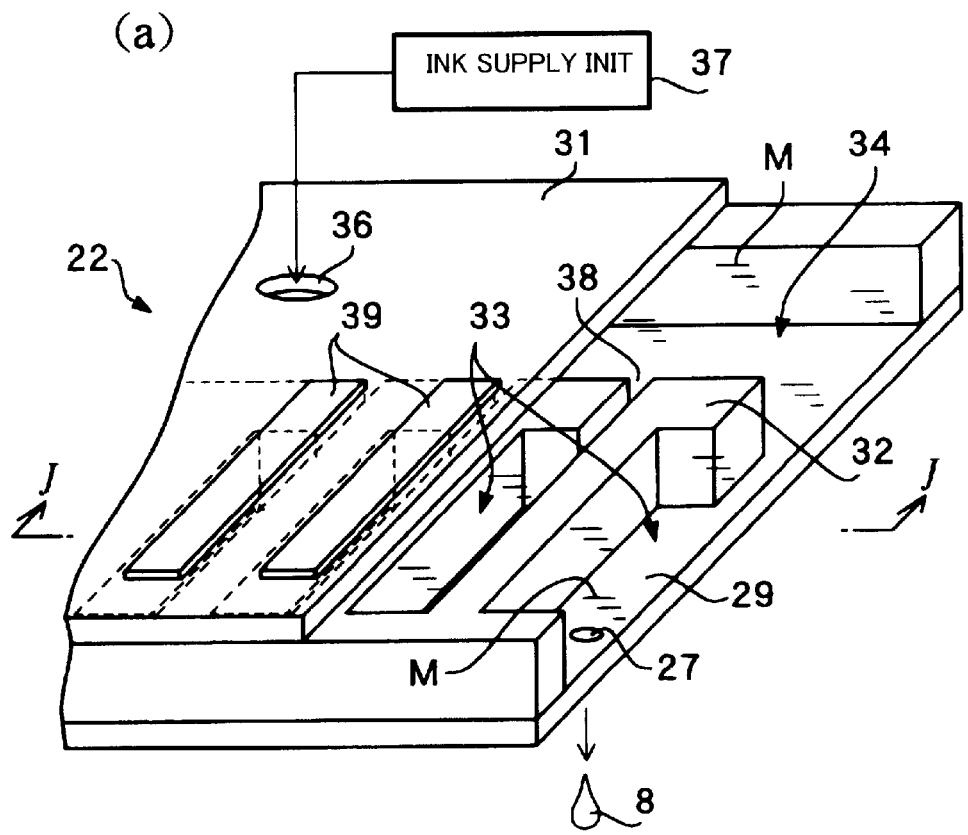
(b)
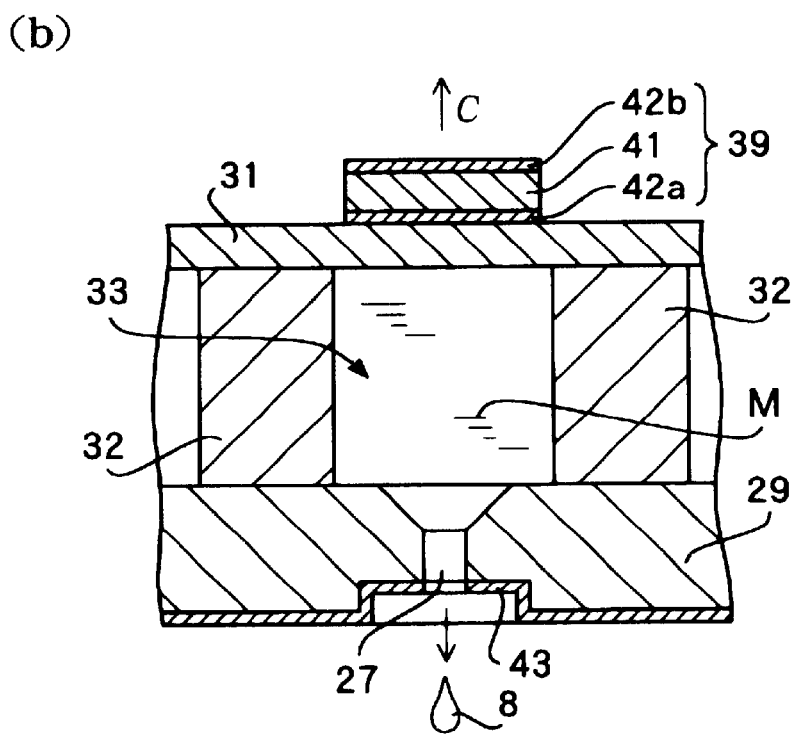

FIG. 25
(a)
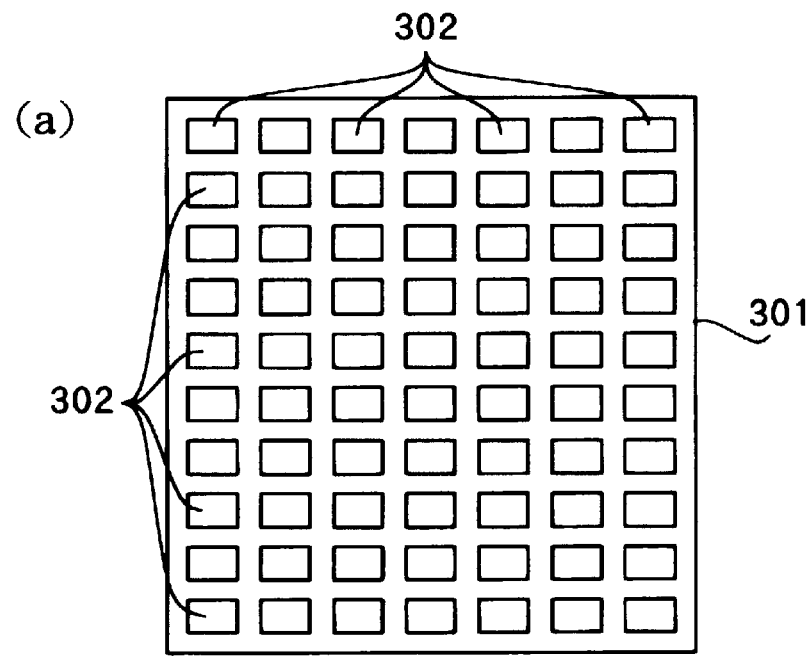
(b)
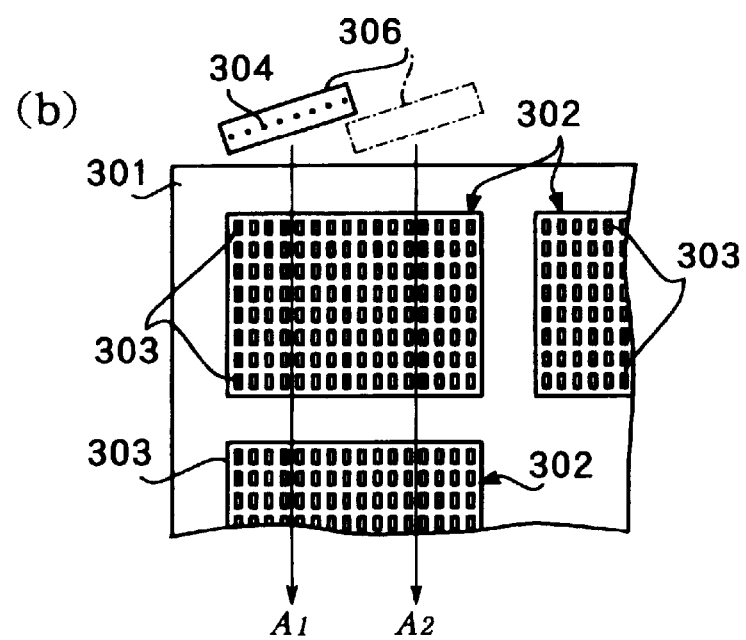
(c)
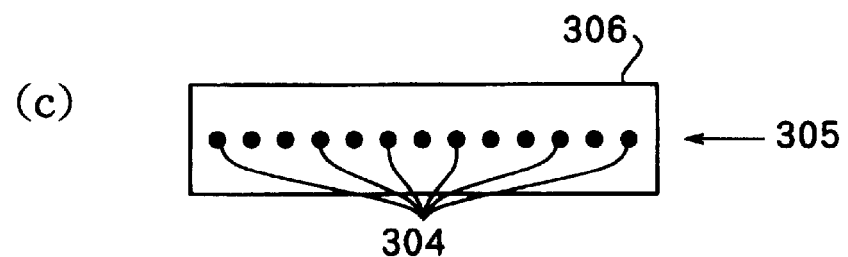

FIG. 26
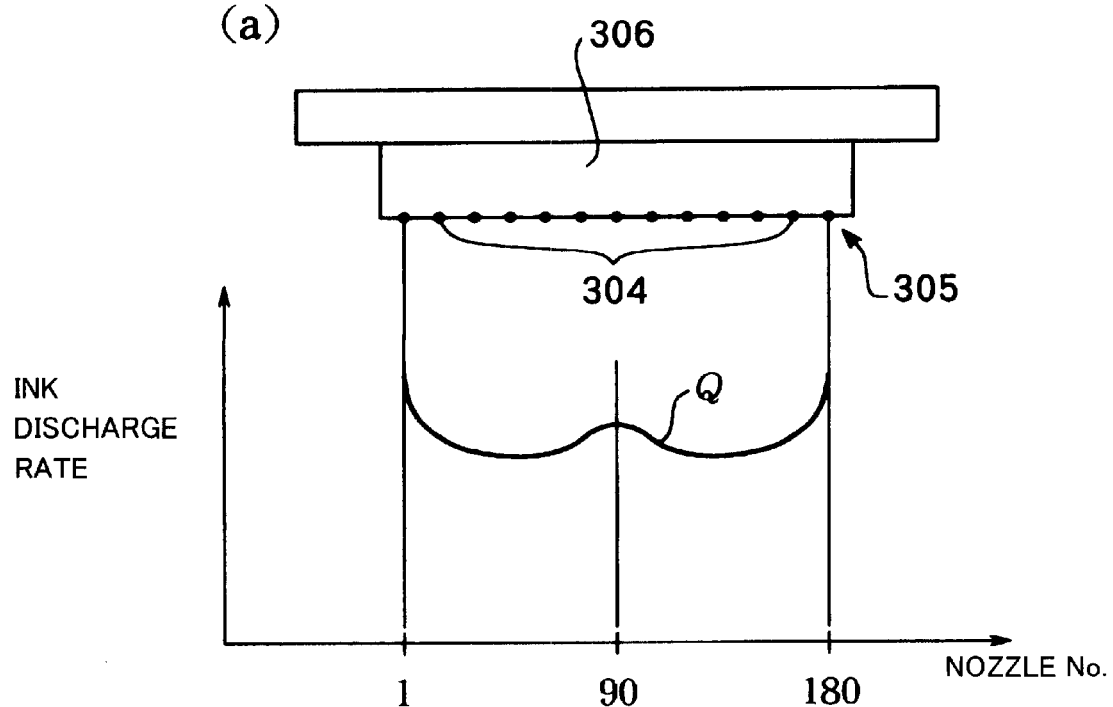
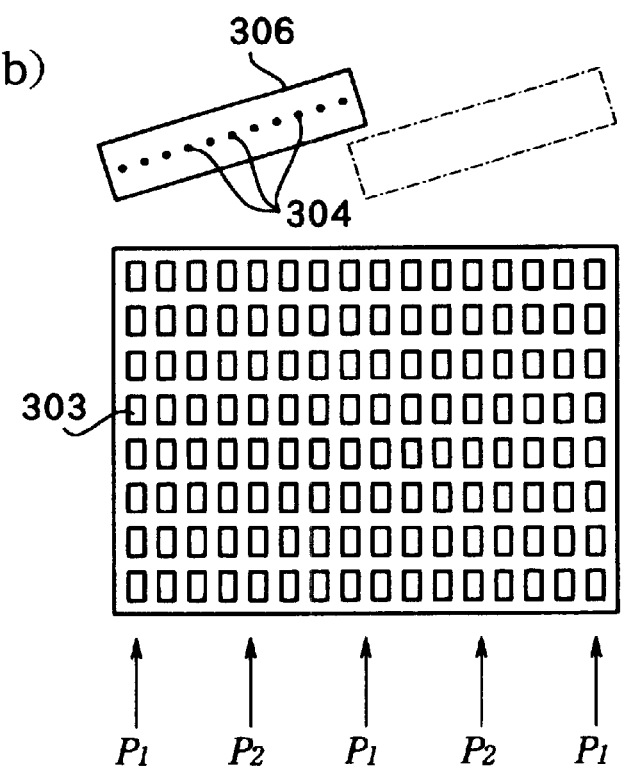

FIG. 28
(A)
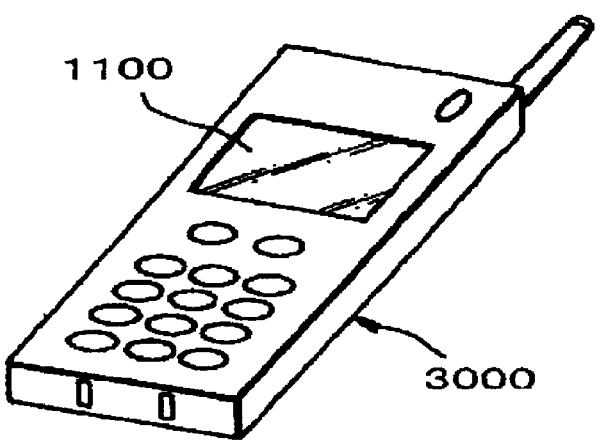
(B)
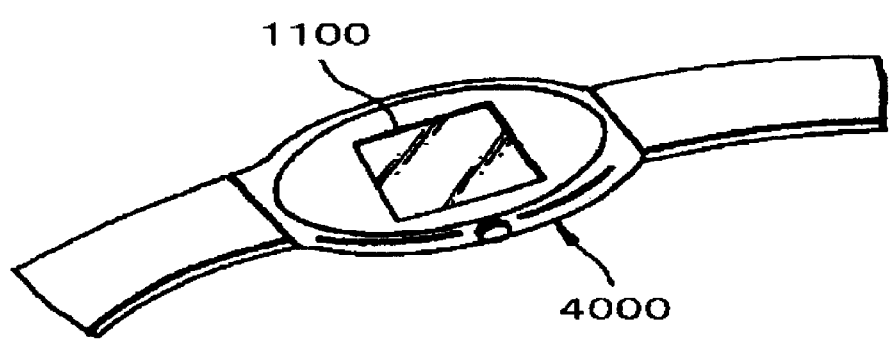
(C)
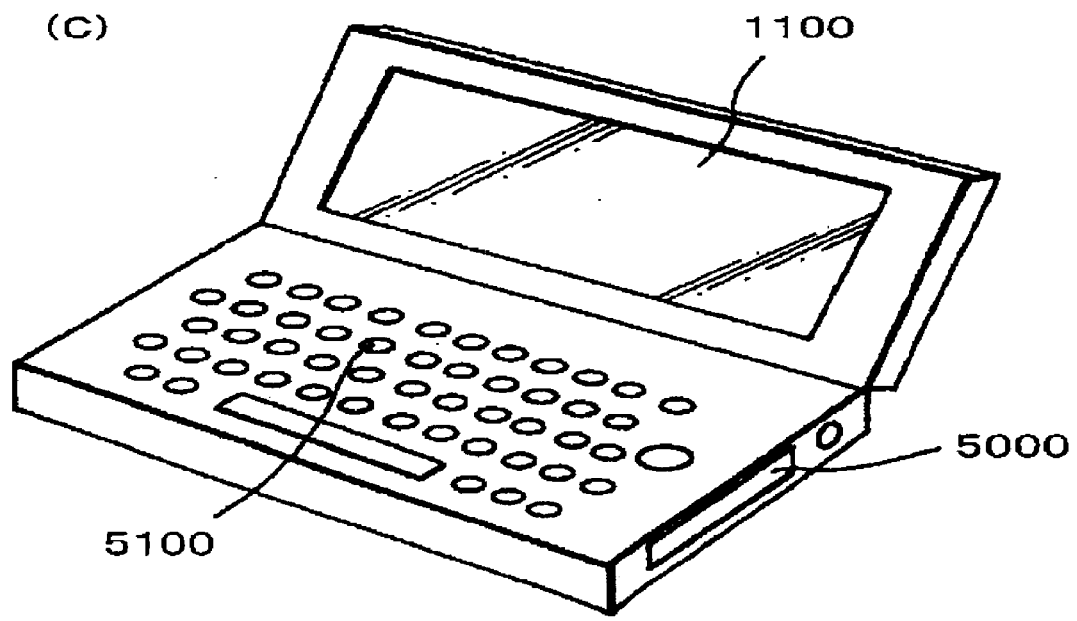

SYSTEM AND METHODS FOR MANUFACTURING A COLOR FILTER USING A SCANNING INK JET HEAD

BACKGROUND OF THE INVENTION

1. Field of Invention

The present invention relates to a method and apparatus for manufacturing a color filter, a liquid-crystal display, an electroluminescence emission layer substrate, and an electroluminescence device. The present invention also relates to a scanning method and a scanning apparatus for a head that scans a substrate while ejecting a discharge material to the substrate. The present invention further relates to a method and apparatus for forming a film on a substrate. The present invention still further relates to an electrooptical device and a method for manufacturing the electrooptical device, and electronic equipment.

2. Description of Related Art

Currently, displays, such as a liquid-crystal display and an electroluminescence device, are widely used for electronic equipment, such as a mobile telephone or a mobile computer. The display of the electronic equipment typically presents a full-color display.

The full-color display of the liquid-crystal display is presented by transmitting light modulated by a liquid-crystal layer through a color filter. The color filter is formed by arranging R (red), G (green), and B (blue) color filter dot elements in a predetermined layout such as a stripe configuration, a delta configuration, or a mosaic configuration on the surface of a substrate fabricated of glass, plastic, etc.

In the electroluminescence device, an electroluminescence device can be formed by arranging R (red), G (green), and B (blue) color light emission layers in a predetermined layout, such as a stripe configuration, a delta configuration, or a mosaic configuration on the surface of a substrate fabricated of glass, plastic, etc. The light emission layer of the electroluminescence substrate is sandwiched between a pair of electrodes, forming a plurality of display dots. A current or voltage applied between the electrodes is controlled dot by dot to cause each display dot to emit light in a desired color.

When the filter elements of R (red), G (green), and B (blue) of the conventional color filter are patterned, or when the light emission layers of R (red), G (green), and B (blue) of the conventional electroluminescence substrate are patterned, the photolithographic technique has been used. The photolithographic technique performs complex steps, such as exposure, development, and cleaning steps using pattern masks different from display dot to display dot. A great deal of color material and photoresist are used, leading to costly units.

To resolve this problem, methods have been proposed in which a filter material or a light emission layer forming material is ejected in dots using an ink-jet technique to produce the filter element or the light emission layer. The ink-jet technique uses an ink-jet head with a piezoelectric thin film element, for example.

Through the ink-jet technique, ink for forming a pixel is stored in a pressure chamber of an ink-jet head, and is then ejected in response to a change in the volume of the pressure chamber due to the vibration of the piezoelectric element. A pixel is thus formed on the substrate of the color filter. The ink-jet technique heightens the production yield of the color filter. Furthermore, the ink-jet technique allows the amount of ink to be precisely controlled, thereby efficiently producing a high-resolution color filter.

FIG. 25 and FIG. 26 illustrate methods for forming a filter element or a light emission layer in a dot-like configuration wherein a filter material and a light emission layer forming material is ejected using the ink-jet technique.

Referring to FIG. 25(a), a plurality of panel regions 302 are formed on the surface of substrate (a mother substrate) 301 having a large area fabricated of glass or plastic. Referring to FIG. 25(b), a plurality of filter elements 303 arranged in a dot-like configuration are formed in the internal area of each of the panel regions 302. Referring to FIG. 25(c), an ink-jet head 306 having a nozzle row 305 formed of a plurality of nozzles 304 are used to form the plurality of filter elements 303 through the ink-jet technique.

Referring to FIG. 25(b), the ink-jet head 306 is moved in a main scan operation in directions designated by an arrow A1 and an arrow A2, a plurality of times for a single panel region 302, twice in FIG. 25(b). During the main scan, the plurality of nozzles 304 selectively ejects ink, for example, a filter material, thereby forming a filter element 303 at a desired location.

The filter element 303 is formed by arranging R (red), G (green), and B (blue) colors in a stripe configuration, a delta configuration, a mosaic configuration, etc. When the filter element 303 is formed by the ink-jet head 306 shown in FIG. 25(b), three types of ink-jet heads 306 respectively ejecting the inks of the three colors of R (red), G (green), and B (blue) are prepared. The ink-jet heads 306 are then successively used for the three colors, thereby arranging the three colors of R (red), G (green), and B (blue) on a single mother substrate 301.

SUMMARY OF THE INVENTION

The plurality of nozzles 304 forming a nozzle row 305 in the ink-jet head 306 suffers from variations in the amount of ejected ink. For example, the ink-jet head 306 has ink discharge characteristics Q as shown in FIG. 26(a), specifically, the amount of ejected ink is largest at the both ends of the nozzle row 305, next largest in the center of the nozzle row 305, and smallest in the middle between the end and the center of the nozzle row 305. The number of nozzles 304 is 180 in FIG. 26(a).

When the ink-jet head 306 produces the filter elements 303 as illustrated in FIG. 25(b), dense streaks are formed in a formation area P1 of the filter elements 303 corresponding to both ends of the ink-jet head 306, and in a formation area P2 of the filter elements 303 corresponding to the center of the ink-jet head 306, because of variations in the amount of ejected ink. Thus, planar light transmissivity or light reflectivity of the color filter suffers from non-uniformity. There are times when very dense streaks appear in both the formation area P1 and the formation area P2.

When the color filter is produced through such an ink-jet method, the ink-jet head needs to be precisely moved so that the nozzle of the ink-jet head precisely scans the region of a pixel, namely, of a display dot and then ejects ink at an appropriate position. There are still no satisfactory solutions available to this problem.

This problem is specifically discussed. Ink is ejected during the formation of the filter element or the light emission layer, namely, during the formation of the pixel. Color mixing could happen if ink to be deposited on one pixel formation region leaks into another adjacent pixel formation region. To prevent such color mixing, the nozzle must pass right above the pixel formation region, thereby depositing an ink drop to the center of the pixel as close as possible. If the nozzle is not positioned right above the pixel formation region, the nozzle must not eject ink.

Besides such a problem, the spacing of pixels (namely, a filter element pitch or a pixel pitch) in the head line-feed direction (namely, a sub scan direction) never agrees with the spacing of nozzles (namely, a nozzle pitch) in the sub scan direction. If the ink-jet head is simply moved in a main scan operation, the ink-jet head has some nozzles unable to pass right above the pixel formation region, namely, some nozzles that must not be used. The utilization of the nozzles (namely, the printing efficiency of the nozzles) thus drops. Conventional solution to this problem is not satisfactory enough.

The present invention has been developed in view of the problem, and it is an object of the present invention to increase the utilization of nozzles (the printing efficiency of the nozzles) by causing all nozzles of an ink-jet head to precisely pass right over pixel formation regions during the scan of an ink-jet head when a color filter or an electroluminescence substrate is formed.

It is another object of the present invention to make, uniform in plan view, optical characteristics of an optical member, such as light transmissivity characteristics of a color filter, color display characteristics of a liquid-crystal display, and light emission characteristics of a light emission layer by ejecting ink at an appropriate position on an object through precisely moving an ink-jet head with respect to the object.

The above problem can be resolved when each of (W) and (P) is set to substantially equal an integer multiple of (D), wherein (W) is the spacing between the nozzle at one end of one head and the nozzle at an adjacent end of an adjacent head with the two nozzles closest to each other from among a plurality of ink-jet print heads, (P) is a sub scanning motion pitch of the print ink-jet head when the print ink-jet head (the liquid-drop ejecting mechanism) is moved in a head scan direction or a head line-feed direction (namely, a vertical direction) in a main scan operation and in a sub scan operation, and (D) is a constant layout pitch of the nozzles. The present invention provides a method and apparatus for manufacturing a color filter, a liquid-crystal display, an electroluminescence substrate, and an electroluminescence device, a film forming method and a film forming apparatus, an electrooptical device and a method for manufacturing the electrooptical device, and electronic equipment.

A method of the present invention for manufacturing a color filter, can include a step of scanning a substrate for main scan by moving a plurality of heads in a head scan direction, each head having a plurality of nozzles arranged at a predetermined layout pitch, and a step of scanning the substrate for sub scan by moving the heads with a predetermined motion pitch in a head line-feed direction which is perpendicular to the head scan direction, and a step of ejecting a filter material through the plurality of nozzles to filter element formation regions of the substrate. A relational equation of $W=mD$ (m is an integer of 2 or larger) substantially holds where (W) is the spacing between a nozzle at one end of a head and a nozzle at the adjacent end of an adjacent head, and (D) is the constant layout pitch of the nozzles, and wherein a relational equation of $P=nD$ (n is an integer of 1 or larger) substantially holds where (P) is the sub scanning motion pitch of the heads and (D) is the constant layout pitch of the nozzles.

This arrangement reduces the possibility that a single main scan of the head ejects a filter material to a pixel adjacent to a pixel for which the filter material is intended when the head scans a formation area of the intended pixel. In all main scans, the nozzles that must not eject the filter material are reduced in number or entirely eliminated. The utilization of the nozzles (namely, printing efficiency) is thus enhanced. Filter elements are efficiently arranged for the number of scans of the head.

With the filter material in an amount substantially equal to the actually required amount thereof, the filter elements are produced within a desired area. Unlike the photolithographic technique, the present invention does not need complex steps, such as exposure, development, and cleaning steps. Furthermore, the present invention reduces the amount of filter material consumed in production.

In the method for manufacturing a color filter, preferably, the heads can be arranged at an angle $\theta$ with respect to the head line-feed direction, the angle $\theta$ being within a range of $0°<\theta<180°$, a relational equation of $W=mD \cos \theta$ (m is an integer of 2 or larger) substantially holds where (W) is the spacing between a nozzle at one end of a head and a nozzle at the adjacent end of an adjacent head, and (D $\cos \theta$) is the layout pitch of the nozzles in the head line-feed direction. A relational equation $P=nD \cos \theta$ (n is an integer of 1 or larger) substantially holds where (P) is the sub scanning motion pitch of the heads in the head line-feed direction and (D $\cos \theta$) is the layout pitch of the nozzles in the head line-feed direction.

In this arrangement, the spacing between the filter elements in the sub scan direction (namely, a filter element pitch) substantially equals an integer multiple of the nozzle layout pitch. All nozzles in the liquid-drop material discharge head (the ink-jet head) are efficiently used to form the filter elements.

In the method for manufacturing a color filter, preferably, the nozzle positioned at the end of the head is designed not to eject the filter material to the filter element formation region of the substrate.

In this arrangement, the liquid-drop material discharge head (the ink-jet head) ejects an appropriate amount of ink even when the liquid-drop material discharge head having substantial variations in distribution characteristics of the ejected filter material is used. For this reason, a filter element having a uniform planar configuration and a uniform thickness is formed in the filter element formation region of the substrate, namely, the pixel formation region. Variations in color from pixel to pixel are thus controlled.

In the method for manufacturing a color filter, the filter material contains liquid materials of a plurality of colors, and the plurality of nozzles in each of the plurality of heads ejects a liquid material of one of the plurality of colors.

If all heads eject the liquid material of one color, another device for a different color must be used to apply the different color or the liquid material must be replaced with the different color material. In accordance with the above arrangement, color materials different in color are respectively and concurrently ejected from respective heads. This arrangement enhances the utilization of the nozzles, namely, the printing efficiency of the nozzles when the filter elements are formed in the element formation regions or the pixel formation regions of the substrate.

The plurality of colors typically refers to the three types of ink of R (red), G (green), and B (blue). Alternatively, C (cyan), M (magenta), and Y (yellow) may be used.

In the method for manufacturing a color filter, the filter material contains liquid materials of a plurality of colors, and the plurality of nozzles in each of the plurality of heads respectively ejects the liquid materials of the plurality of colors.

If the nozzles in each head eject a liquid material of one color, in other words, all nozzles in one head eject the liquid material of the same type, another device for a different color must be used to apply the different color or the liquid material must be replaced with the different color material. In accordance with the above arrangement, color materials different in color are respectively and concurrently ejected from respective nozzles. This arrangement enhances the printing efficiency of the nozzles when the filter elements are formed in the element formation regions or the pixel formation regions of the substrate.

The plurality of colors typically refers to the three types of ink of R (red), G (green), and B (blue). Alternatively, C (cyan), M (magenta), and Y (yellow) may be used.

An apparatus of the present invention for manufacturing a color filter, includes a plurality of nozzles for ejecting a filter material in droplets, a plurality of heads, each head having a plurality of nozzles arranged with a constant layout pitch of (D), main scan driving means for moving the heads in a head scan direction, and sub scan driving means for moving the heads with a predetermined motion pitch (P) in a head line-feed direction which is perpendicular to the head scan direction, wherein a relational equation of W=mD (m is an integer of 2 or larger) substantially holds where (W) is the spacing between a nozzle at one end of a head and a nozzle at the adjacent end of an adjacent head, and (D) is the constant layout pitch of the nozzles, and wherein a relational equation of P=nD (n is an integer of 1 or larger) substantially holds where (P) is the sub scanning motion pitch of the heads and (D) is the constant layout pitch of the nozzles.

This arrangement reduces the possibility that a single main scan of the head ejects a filter material to a pixel adjacent to a pixel for which the filter material is intended when the head scans a formation area of the intended pixel. In all main scans, the nozzles that must not eject the filter material are reduced in number or entirely eliminated, The utilization of the nozzles (namely, the printing efficiency of the nozzles) is thus enhanced. Filter elements are efficiently arranged for the number of scans of the head.

In the apparatus for manufacturing a color filter, the heads are arranged at an angle θ with respect to the head line-feed direction, the angle θ being within a range of 0°<θ<180°, a relational equation of W=mD cos θ (m is an integer of 2 or larger) substantially holds where (W) is the spacing between a nozzle at one end of a head and a nozzle at the adjacent end of an adjacent head, and (D cos θ) is the layout pitch of the nozzles in the head line-feed direction. A relational equation P=nD cos θ (n is an integer of 1 or larger) substantially holds where (P) is the sub scanning motion pitch of the heads in the head line-feed direction and (D cos θ) is the layout pitch of the nozzles in the head line-feed direction.

In this arrangement, the spacing between the filter elements in the sub scan direction (namely, a filter element pitch) substantially equals an integer multiple of the nozzle layout pitch. All nozzles in the liquid-drop material discharge head (the ink-jet head) are efficiently used to form the filter elements.

In the method for manufacturing a liquid-crystal display including a step of forming a color filter, the color filter is preferably formed in accordance with the above-referenced method for manufacturing a color filter. The manufacturing method for manufacturing the color filter efficiently produces the liquid-crystal display having the color filter with excellent optical characteristics and featuring color display characteristics uniform in plan view.

In the apparatus for manufacturing a liquid-crystal display including a color filter, the apparatus for manufacturing the liquid-crystal display includes the apparatus for manufacturing the color filter. The apparatus for manufacturing the liquid-crystal display efficiently produces the liquid-crystal display having a color filter with excellent optical characteristics and featuring color display characteristics uniform in plan view.

A method of the present invention for manufacturing an electroluminescence substrate, includes a step of scanning a substrate for main scan by moving a plurality of heads in a head scan direction, each head having a plurality of nozzles arranged with a predetermined layout pitch, a step of scanning the substrate for sub scan by moving the heads with a predetermined motion pitch in a head line-feed direction which is perpendicular to the head scan direction, and a step of ejecting a functional layer forming material through the plurality of nozzles to functional layer forming regions of the substrate. A relational equation of W=mD (m is an integer of 2 or larger) substantially holds where (W) is the spacing between a nozzle at one end of a head and a nozzle at the adjacent end of an adjacent head, and (D) is the constant layout pitch of the nozzles. A relational equation of P=nD (n is an integer of 1 or larger) substantially holds where (P) is the sub scanning motion pitch of the heads and (D) is the constant layout pitch of the nozzles.

This arrangement reduces the possibility that a single main scan of the head ejects a functional layer forming material to a functional layer formation region adjacent to a functional layer formation region for which the functional layer material is intended when the head scans the intended functional layer formation region. In all main scans, the nozzles that must not eject the filter material are reduced in number or entirely eliminated. The utilization of the nozzles (namely, the printing efficiency nozzles) is thus enhanced. Filter elements are efficiently arranged for the number of scans of the head.

With the functional layer material in an amount substantially equal to the actually required amount thereof, the functional layers are produced within a desired area. Unlike the photolithographic technique, the present invention does not need complex steps, such as exposure, development, and cleaning steps. Furthermore, the present invention reduces the amount of functional layer material consumed in production.

In the method for manufacturing an electroluminescence, the heads are arranged at an angle θ with respect to the head line-feed direction, the angle θ being within a range of 0°<θ<180°, a relational equation of W=mD cos θ (m is an integer of 2 or larger) substantially holds where (W) is the spacing between a nozzle at one end of a head and a nozzle at the adjacent end of an adjacent head, and (D cos θ) is the layout pitch of the nozzles in the head line-feed direction. A relational equation P=nD cos θ (n is an integer of 1 or larger) substantially holds where (P) is the sub scanning motion pitch of the heads in the head line-feed direction and (D cos θ) is the layout pitch of the nozzles in the head line-feed direction.

In this arrangement, the spacing between the functional layers in the sub scan direction (namely, a functional layer pitch) substantially equals an integer multiple of the nozzle layout pitch. All nozzles in the liquid-drop material discharge head (the ink-jet head) are efficiently used to form the functional layers.

In the method for manufacturing an electroluminescence substrate, the nozzle positioned at the end of the head is designed not to eject the functional layer forming material to the functional layer formation region of the substrate.

In this arrangement, the liquid-drop material discharge head (the ink-jet head) ejects an appropriate amount of liquid material even when the liquid-drop material discharge head (the ink-jet head) having substantial variations in distribution characteristics of the ejected functional layer forming material, namely, the liquid material is used. For this reason, the functional layer having a uniform planar configuration and a uniform thickness is formed in a functional layer formation region of the substrate, namely, the pixel formation region. Variations in color from pixel to pixel, in other words, from functional layer to functional layer, are thus controlled. Colors with variations thereof controlled include blue-based colors which have characteristic spectral transmittance and spectral reflectance (Yxy).

In the method for manufacturing an electroluminescence substrate, the functional layer forming material is preferably a light emission layer forming material.

In the method for manufacturing an electroluminescence substrate, the functional layer forming material is preferably a hole injection and transport layer forming material.

In the method for manufacturing an electroluminescence substrate, the functional layer forming material preferably includes a material selected from the group consisting of a light emission layer forming material and a hole injection and transport layer forming material.

In the method for manufacturing an electroluminescence substrate, preferably, the light emission layer forming material contains a plurality of materials different from each other in emission color, and the plurality of nozzles in each head ejects one of the plurality of materials different from each other in emission color. If all heads eject the light emission material of one color, another device for a different color must be used to apply the different color or the light emission layer forming material must be replaced with the different color material. In accordance with the above arrangement, light emission layer forming materials different in color are respectively and concurrently ejected from respective heads. This arrangement enhances the printing efficiency, namely, the utilization of the nozzles when the light emission layers are formed in the light emission layer formation regions, namely, the pixel formation regions of the substrate.

The plurality of colors typically refers to the three types of ink of R (red), G (green), and B (blue). Alternatively, light emission layer forming materials of C (cyan), M (magenta), and Y (yellow) may be used.

In the method for manufacturing an electroluminescence substrate, the light emission layer forming material contains a plurality of materials different from each other in emission color, and each of the plurality of nozzles in each head ejects a respective one of the plurality of materials different from each other in emission color.

If the nozzles in each head eject a light emission layer forming material of one color, in other words, all nozzles in one head eject the light emission layer forming material of the same type, another device for a different color must be used to apply the different color or the light emission layer forming material must be replaced with the different color material. In accordance with the above arrangement, color materials different in color are respectively and concurrently ejected from respective nozzles. This arrangement enhances the printing efficiency when the light emission layers are formed in the light emission layer formation regions or the pixel formation regions of the substrate.

The plurality of colors typically refers to the three types of light emission layer forming materials of R (red), G (green), and B (blue). Alternatively, C (cyan), M (magenta), and Y (yellow) may be used.

An apparatus of the present invention for manufacturing an electroluminescence substrate, includes a plurality of nozzles for ejecting a functional layer forming material in droplets, a plurality of heads, each head having a plurality of nozzles arranged with a constant layout pitch of (D), main scan driving means for moving the heads in a head scan direction, and sub scan driving means for moving the heads with a predetermined motion pitch (P) in a head line-feed direction which is perpendicular to the head scan direction. A relational equation of W=mD (m is an integer of 2 or larger) substantially holds where (W) is the spacing between a nozzle at one end of a head and a nozzle at the adjacent end of an adjacent head, and (D) is the constant layout pitch of the nozzles. A relational equation of P=nD (n is an integer of 1 or larger) substantially holds where (P) is the sub scanning motion pitch of the heads and (D) is the constant layout pitch of the nozzles.

This arrangement reduces the possibility that a single main scan of the head ejects a functional layer forming material to a functional layer formation region, namely, a pixel, adjacent to a functional layer formation region for which the functional layer forming material is intended for when the head scans the intended functional layer formation region, namely, the intended formation region of the pixel. In all main scans, the nozzles that must not eject the functional layer forming material are reduced in number or entirely eliminated. The utilization of the nozzles (namely, the printing efficiency of the nozzles) is thus enhanced. The functional layers are efficiently arranged for the number of scans of the head.

With the functional layer material in an amount substantially equal to the actually required amount thereof, the functional layers are produced within a desired area. Unlike the photolithographic technique, the present invention does not need complex steps, such as exposure, development, and cleaning steps. Furthermore, the present invention reduces the amount of filter material consumed in production.

In the apparatus for manufacturing an electroluminescence substrate, the heads are arranged at an angle θ with respect to the head line-feed direction, the angle θ being within a range of 0°<θ<180°, a relational equation of W=mD cos θ (m is an integer of 2 or larger) substantially holds where (W) is the spacing between a nozzle at one end of a head and a nozzle at the adjacent end of an adjacent head, and (D cos θ) is the layout pitch of the nozzles in the head line-feed direction, and a relational equation P=nD cos θ (n is an integer of 1 or larger) substantially holds where (P) is the sub scanning motion pitch of the heads in the head line-feed direction and (D cos θ) is the layout pitch of the nozzles in the head line-feed direction.

In this arrangement, the spacing between the functional layers in the sub scan direction (namely, a functional layer pitch) substantially equals an integer multiple of the nozzle layout pitch. All nozzles in the liquid-drop material discharge head (the ink-jet head) are efficiently used to form the functional layers.

In the method for manufacturing an electroluminescence device, including a step of forming a functional layer, the functional layer is formed in accordance with the above-referenced method for manufacturing the electroluminescence substrate. The method for manufacturing the electroluminescence device efficiently produces the electroluminescence device having the electroluminescence substrate excellent in optical characteristics and featuring uniform display characteristics in plan view.

In the apparatus for manufacturing an electroluminescence device including an electroluminescence substrate, the apparatus for manufacturing the electroluminescence device includes the apparatus for manufacturing the above-referenced electroluminescence substrate. The apparatus for manufacturing the electroluminescence device efficiently produces the electroluminescence device having the electroluminescence substrate excellent in optical characteristics and featuring uniform display characteristics in plan view.

A head scanning method of the present invention includes a step of scanning a substrate for main scan by moving a plurality of heads in a head scan direction, each head having a plurality of nozzles arranged with a predetermined layout pitch, a step of scanning the substrate for sub scan by moving the heads with a predetermined motion pitch in a head line-feed direction which is perpendicular to the head scan direction, and a step of ejecting a discharge material through the plurality of nozzles to the substrate. A relational equation of W=mD (m is an integer of 2 or larger) substantially holds where (W) is the spacing between a nozzle at one end of a head and a nozzle at the adjacent end of an adjacent head, and (D) is the constant layout pitch of the nozzles. A relational equation of P=nD (n is an integer of 1 or larger) substantially holds where (P) is the sub scanning motion pitch of the heads and (D) is the constant layout pitch of the nozzles.

This arrangement reduces the possibility that a single main scan of the head ejects a discharge material to an element adjacent to an element for which the discharge material is intended when the head scans the intended element. In all main scans, the nozzles that must not eject the discharge material are reduced in number or entirely eliminated. The utilization of the nozzles (namely, the printing efficiency of the nozzles) is thus enhanced. The discharge materials are efficiently arranged for the number of scans of the head.

With the discharge material in an amount substantially equal to the actually required amount thereof, the elements are produced within a desired area. Unlike the photolithographic technique, the present invention does not need complex steps, such as exposure, development, and cleaning steps. Furthermore, the present invention reduces the amount of discharge material consumed in production. The above-referenced head scanning method finds applications in a wide range of industrial use in which a fine pattern is formed on a substrate. For example, the head scanning method may be applied in the formation of a variety of semiconductor devices (such as thin-film transistors, thin-film diodes), wiring patterns, and insulators.

The discharge material may be any material depending on the element to be formed. For example, besides the filter material and the functional layer forming material, the discharge material may be a silica glass precursor, an electrically conductive material such as a metallic compound, a dielectric material, or a semiconductor material.

In the head scanning method, the heads are arranged at an angle $\theta$ with respect to the head line-feed direction, the angle $\theta$ being within a range of $0°<\theta<180°$, a relational equation of W=mD cos $\theta$ (m is an integer of 2 or larger) substantially holds where (W) is the spacing between a nozzle at one end of a head and a nozzle at the adjacent end of an adjacent head, and (D cos $\theta$) is the layout pitch of the nozzles in the head line-feed direction. A relational equation P=nD cos $\theta$ (n is an integer of 1 or larger) substantially holds where (P) is the sub scanning motion pitch of the heads in the head line-feed direction and (D cos $\theta$) is the layout pitch of the nozzles in the head line-feed direction.

In this arrangement, the spacing between the elements in the sub scan direction substantially equals an integer multiple of the nozzle layout pitch. All nozzles in the liquid-drop material discharge head (the ink-jet head) are efficiently used to deposit the discharge material.

In the head scanning method, the nozzle positioned at the end of the head is designed not to eject the discharge material to a discharge material deposit region of the substrate.

In this arrangement, the liquid-drop material discharge head (the ink-jet head) ejects an appropriate amount of discharge object, namely, discharge material even when the liquid-drop material discharge head (the ink-jet head) having substantial variations in distribution characteristics of the discharge object is used. For this reason, the element having a uniform planar configuration and a uniform thickness is formed in an element formation region of the substrate, namely, the pixel formation region. Variations in color from element to element are thus controlled.

In the head scanning method, preferably, the discharge material contains a plurality of materials different from each other in characteristics, and the plurality of nozzles in each head ejects one of the plurality of materials different from each other in the characteristics. If all heads eject the discharge material of one color, another device for a different color must be used to apply the different color or the discharge material must be replaced with a discharge material of different color. In accordance with the above arrangement, discharge materials different in characteristics are respectively and concurrently ejected from respective heads. This arrangement enhances the printing efficiency of the nozzles, namely, the utilization of the nozzles when the elements are formed in the element formation regions or the pixel formation regions of the substrate.

In the head scanning method, the discharge material contains a plurality of materials different from each other in characteristics, and each of the plurality of nozzles in each head ejects a respective one of the plurality of materials different from each other in the characteristics. If the nozzles in each head eject a discharge material of one color, in other words, all nozzles in one head eject the discharge material of the same type, another device for a different color must be used to apply the different color or the discharge material must be replaced with a discharge material of the different color. In accordance with the above arrangement, discharge materials different in characteristics are respectively and concurrently ejected from respective nozzles. This arrangement enhances the printing efficiency when the elements are formed in element formation regions of the substrate.

A head scanning apparatus of the present invention can include a plurality of nozzles for ejecting a discharge material in droplets, a plurality of heads, each head having a plurality of nozzles arranged with a constant layout of pitch of (D), main scan driving means for moving the heads in a head scan direction, and sub scan driving means for moving the heads with a predetermined motion pitch (P) in a head line-feed direction which is perpendicular to the head scan direction. A relational equation of W=mD (m is an integer of 2 or larger) substantially holds where (W) is the spacing between a nozzle at one end of a head and a nozzle at the adjacent end of an adjacent head, and (D) is the constant layout pitch of the nozzles. A relational equation of P=nD (n is an integer of 1 or larger) substantially holds where (P) is the sub scanning motion pitch of the heads and (D) is the constant layout pitch of the nozzles.

This arrangement reduces the possibility that a single main scan of the head ejects a discharge object, namely, ink to an element adjacent to an element for which the discharge object is intended when the head scans the intended element. In all main scans, the nozzles that must not eject the discharge material are reduced in number or entirely eliminated. The utilization of the nozzles (namely, the printing efficiency of the nozzles) is thus enhanced. The elements are efficiently arranged for the number of scans of the head.

With the discharge material in an amount substantially equal to the actually required amount thereof, the elements are produced within a desired area. Unlike the photolithographic technique, the present invention does not need complex steps, such as exposure, development, and cleaning steps. Furthermore, the present invention reduces the amount of discharge material consumed in production.

In the head scanning apparatus, the heads are arranged at an angle $\theta$ with respect to the head line-feed direction, the angle $\theta$ being within a range of $0° < \theta < 180°$, a relational equation of $W = mD \cos \theta$ (m is an integer of 2 or larger) substantially holds where (W) is the spacing between a nozzle at one end of a head and a nozzle at the adjacent end of an adjacent head, and ($D \cos \theta$) is the layout pitch of the nozzles in the head line-feed direction. A relational equation $P = nD \cos \theta$ (n is an integer of 1 or larger) substantially holds where (P) is the sub scanning motion pitch of the heads in the head line-feed direction and ($D \cos \theta$) is the layout pitch of the nozzles in the head line-feed direction.

In this arrangement, the spacing between the elements in the sub scan direction substantially equals an integer multiple of the nozzle layout pitch. All nozzles in the liquid-drop material discharge head (the ink-jet head) are efficiently used to form the elements.

A film forming method of the present invention includes a step of scanning a substrate for main scan by moving a plurality of heads in a head scan direction, each head having a plurality of nozzles arranged with a predetermined layout pitch, a step of scanning the substrate for sub scan by moving the heads with a predetermined motion pitch in a head line-feed direction which is perpendicular to the head scan direction, and a step of ejecting a film forming material through the plurality of nozzles to film formation regions of the substrate. A relational equation of $W \approx mD$ (m is an integer of 2 or larger) holds where (W) is the spacing between a nozzle at one end of a head and a nozzle at the adjacent end of an adjacent head, and (D) is the constant layout pitch of the nozzles. A relational equation of $P \approx nD$ (n is an integer of 1 or larger) holds where (P) is the sub scanning motion pitch of the heads and (D) is the constant layout pitch of the nozzles.

This arrangement reduces the possibility that a single main scan of the head ejects a film forming material to a region adjacent to a region for which the film forming material is intended (hereinafter referred to as a discharge target region) when the head scans the discharge target region. In all main scans, the nozzles that must not eject the film forming material are reduced in number or entirely eliminated. The utilization of the nozzles (namely, the printing efficiency of the nozzles) is thus enhanced. The films are efficiently formed for the number of scans of the head.

With the film forming material in an amount substantially equal to the actually required amount thereof, the films are produced within a desired area. Unlike the photolithographic technique, the present invention does not need complex steps, such as exposure, development, and cleaning steps. Furthermore, the present invention reduces the amount of film forming material consumed in production.

In the film forming method, the heads are arranged at an angle $\theta$ with respect to the head line-feed direction, the angle $\theta$ being within a range of $0° < \theta < 180°$, a relational equation of $W \approx mD \cos \theta$ (m is an integer of 2 or larger) holds where (W) is the spacing between a nozzle at one end of a head and a nozzle at the adjacent end of an adjacent head, and ($D \cos \theta$) is the layout pitch of the nozzles in the head line-feed direction. A relational equation $P \approx nD \cos \theta$ (n is an integer of 1 or larger) holds where (P) is the sub scanning motion pitch of the heads in the head line-feed direction and ($D \cos \theta$) is the layout pitch of the nozzles in the head line-feed direction.

In this arrangement, the spacing between the discharge target regions in the sub scan direction substantially equals an integer multiple of the nozzle layout pitch. All nozzles in the liquid-drop material discharge head (the ink-jet head) are efficiently used to eject the film forming material.

In the film forming method, the nozzle positioned at the end of the head is designed not to eject the film forming material to the film formation region of the substrate.

In this arrangement, the liquid-drop material discharge head (the ink-jet head) ejects an appropriate amount of film forming material, namely, a liquid material even when the liquid-drop material discharge head (the ink-jet head) having substantial variations in distribution characteristics of the ejected film forming material is used. For this reason, the film having a uniform planar configuration and a uniform thickness is formed in a film formation region of the substrate. Variations in characteristics from position to position are thus controlled.

In the film forming method, preferably, the film forming material contains a plurality of materials different from each other in characteristics, and the plurality of nozzles in each head ejects one of the plurality of materials different from each other in the characteristics. If all heads eject the film forming material of one type, another device for the film forming material of a different type must be used to apply the different type or the film forming material must be replaced with the film forming material of different type. In accordance with the above arrangement, film forming materials different in characteristics are respectively and concurrently ejected from respective heads. This arrangement enhances the utilization of the nozzles, namely, the printing efficiency of the nozzles when the film forming materials are ejected to film formation regions of the substrate.

In the film forming method, preferably, the film forming material contains a plurality of materials different from each other in characteristics, and each of the plurality of nozzles in each head ejects a respective one of the plurality of materials different from each other in the characteristics. If the nozzles in each head eject a film forming material of one type, another device for another type of film forming material must be used to apply the other type or the film forming material must be replaced with a film forming material of the different type. In accordance with the above arrangement, film forming materials different in characteristics are respectively and concurrently ejected from respective nozzles. This arrangement enhances the printing efficiency of the nozzles when the film forming materials are ejected to film formation regions of the substrate.

A film forming apparatus of the present invention includes a plurality of nozzles for ejecting a film forming material in droplets, a plurality of heads, each head having a plurality of nozzles arranged with a constant layout of pitch of (D), main scan driving means for moving the heads in a head scan direction, and sub scan driving means for moving the heads with of a predetermined motion pitch (P) in a head line-feed direction which is perpendicular to the head scan direction. A relational equation of W≈mD (m is an integer of 2 or larger) holds where (W) is the spacing between a nozzle at one end of a head and a nozzle at the adjacent end of an adjacent head, and (D) is the constant layout pitch of the nozzles. A relational equation of P≈nD (n is an integer of 1 or larger) holds where (P) is the sub scanning motion pitch of the heads and (D) is the constant layout pitch of the nozzles.

This arrangement reduces the possibility that a single main scan of the head ejects a film forming material to a region adjacent to a region for which the film forming material is intended (hereinafter referred to as a discharge target region) when the head scans the discharge target region. In all main scans, the nozzles that must not eject the film forming material are reduced in number or entirely eliminated. The utilization of the nozzles (namely, the printing efficiency of the nozzles) is thus enhanced. The films are efficiently formed for the number of scans of the head.

With the film forming material in an amount substantially equal to the required amount thereof, the films are produced within a desired area. Unlike the photolithographic technique, the present invention does not need complex steps, such as exposure, development, and cleaning steps. Furthermore, the present invention reduces the amount of film forming material consumed in production.

In the film forming apparatus, the heads are arranged at an angle θ with respect to the head line-feed direction, the angle θ being within a range of 0°<θ<180°. A relational equation of W≈mD cos θ (m is an integer of 2 or larger) holds where (W) is the spacing between a nozzle at one end of a head and a nozzle at the adjacent end of an adjacent head, and (D cos θ) is the layout pitch of the nozzles in the head line-feed direction. A relational equation P≈nD cos θ (n is an integer of 1 or larger) holds where (P) is the sub scanning motion pitch of the heads in the head line-feed direction and (D cos θ) is the layout pitch of the nozzles in the head line-feed direction.

In this arrangement, the spacing between the discharge target regions in the sub scan direction substantially equals an integer multiple of the nozzle layout pitch. All nozzles in the liquid-drop material discharge head (the ink-jet head) are efficiently used to eject the film forming material.

A method of the present invention for manufacturing an electrooptical device uses the film forming method described above.

An electrooptical device of the present invention is manufactured in accordance with the method for manufacturing an electrooptical device described above.

Electronic equipment of the present invention includes the electrooptical device described above.

Electronic equipment includes a liquid-crystal display manufactured in accordance with the method for manufacturing the liquid-crystal display described above.

Electronic equipment includes the electroluminescence device manufactured in accordance with the method for manufacturing an electroluminescence device described above.

BRIEF DESCRIPTION OF THE DRAWINGS

The invention will be described with reference to the accompanying drawings, wherein like numerals reference like elements, and wherein:

FIGS. 1(a) and 1(b) are plan views illustrating major process steps of a method for manufacturing a color filter in accordance with one embodiment of the present invention;

FIGS. 5(a) and 5(b) are plan views illustrating the color filter manufactured in accordance with the method and apparatus of the present invention for manufacturing the color filter, wherein FIG. 5(a) illustrates an entire mother substrate prior to dicing into color filters, and FIG. 5(b) illustrates a single color filter diced from the mother substrate;

FIGS. 6(a) through 6(d) are cross-sectional views illustrating the structure of the color filter in major process steps in the method of the present invention for manufacturing the color filter, taken along line VII—VII in FIG. 5(b), wherein FIG. 6(a) illustrates the color filter prior to the ejection of a filter material, FIG. 6(b) illustrates the color filter immediately subsequent to the ejection of the filter material, FIG. 6(c) illustrates the color filter with a filter element arranged, and FIG. 6(d) illustrates the color filter with a protective film formed thereon;

FIGS. 15(a) and 15(b) illustrate the internal structure of the ink-jet head (liquid-drop material discharge head), wherein FIG. 15(a) is a perspective view with the internal structure partly broken away, and FIG. 15(b) is a cross-sectional view of the ink-jet head taken along line J—J in FIG. 15(a);

FIGS. 25(*a*), 25(*b*) and 25(*c*) are plan views illustrating a conventional method for manufacturing a color filter;

FIGS. 26(*a*) and 26(*b*) illustrate characteristics of a conventional color filter;

FIGS. 28(A)–28(C) illustrate examples of the electronic equipment of the present invention, wherein FIG. 28(A) illustrates a mobile telephone, FIG. 28(B) illustrates a wristwatch, and FIG. 28(C) illustrates a mobile information terminal.

DETAILED DESCRIPTION OF PREFERRED EMBODIMENTS

Figure 2:
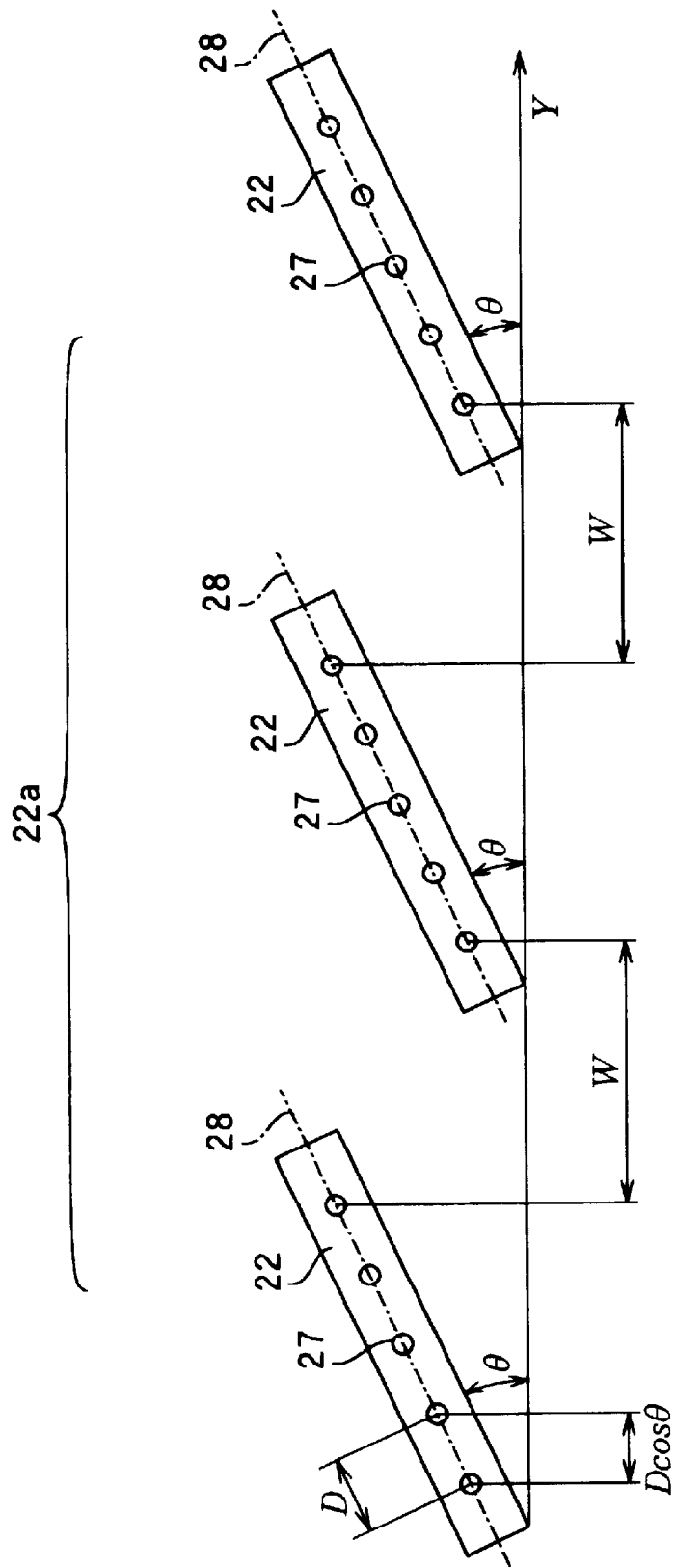
FIG. 2 is a plan view illustrating a method for manufacturing the color filter in accordance with another embodiment of the present invention, wherein an ink-jet head (liquid-drop material discharge head) 22 is arranged at an inclination angle θ with respect to a head line-feed direction Y.

The embodiments of the present invention are discussed below specifically referring to the drawings. FIG. 1 illustrates the operation of an ink-jet head (a liquid-drop material discharge head) 22 used in the method for manufacturing a color filter in accordance with one embodiment of the present invention. This embodiment uses a print head (a liquid-drop material discharge mechanism) 22*a* in which at least one ink-jet head (a liquid-drop material discharge head) 22 is arranged at predetermined intervals. Each ink-jet head (liquid-drop material discharge head) 22 includes a plurality of nozzles 27 arranged in a row with a predetermined layout pitch D.

The print head (liquid-drop material discharge mechanism) 22*a* scans a substrate 2 for main scan in a head scan direction at a fixed direction (namely, an X direction which is a vertical direction in FIG. 1(*a*)) while scans, with a predetermined motion pitch P, the substrate 2 for sub scan in a head line-feed direction (namely, a Y direction which is a horizontal direction in FIG. 1(*a*)) which is perpendicular to the head scan direction X.

Each ink-jet head (liquid-drop material discharge head) 22 ejects a filter material as ink from each of the plurality of nozzles 27. The ejected filter materials are selectively deposited on a plurality of filter element formation regions 7, namely, pixel formation regions on the substrate 2. As required, the ink-jet head (liquid-drop material discharge head) 22 repeats the main scan and the sub scan, thereby depositing the filter material on the filter element formation region 7 of the substrate 2 to a predetermined shape and to a predetermined thickness. In this way, a filter element 3 having the predetermined shape and the predetermined thickness, namely, the pixel is formed on the substrate 2.

When color is presented using the filter elements 3 corresponding to the three primary colors of R (red), G (green), and B (blue) in accordance with the present embodiment, a single filter element 3 forms a single display dot, and three display dots of R (red), G (green), and B (blue) form a single pixel as a unit.

In the present embodiment, let "D" represent the constant layout pitch of the nozzles 27 and let "W" represent the spacing between two closest nozzles 27 at the closest ends of the two adjacent ink-jet head (liquid-drop material discharge head) 22, and the following equation holds:

$$W = mD \text{ (}m\text{ is an integer of 2 or larger).}$$

In other words, the spacing W between two mutually closest nozzles 27 at the closest ends of the two adjacent ink-jet heads (liquid-drop material discharge heads) 22 equals an integer multiple of the layout pitch D of the nozzles 27.

Similarly, referring to FIG. 1(*b*), let "P" represent a sub scanning motion pitch of the print head (liquid-drop material discharge mechanism) 22*a* in the head line-feed direction, and let "D" represent a constant layout pitch of the nozzles 27, and the following equation holds:

$$P = nD \text{ (}n\text{ is an integer of 1 or larger).}$$

The sub scanning motion pitch P of the ink-jet head (liquid-drop material discharge head) 22 equals an integer multiple of the layout pitch D of the nozzles 27.

When the above relationships hold among the nozzle spacing W between the adjacent ink-jet heads (the liquid-drop material discharge heads), the sub scanning motion pitch P, and the layout pitch D of the nozzles, all nozzles 27 are precisely aligned with the filter element formation regions 7, and then pass right above the filter element formation regions 7. For this reason, the printing efficiency of the nozzles 27 is heightened, and ink is ejected at an appropriate position. The filter element 3, namely, the pixel having a uniform surface shape and a uniform thickness is formed on the substrate 2.

FIG. 2 illustrates the operation of the ink-jet head (liquid-drop material discharge head) 22 in the manufacturing method of the color filter in accordance with another embodiment of the present invention. In this embodiment, at least one and each of ink-jet head (liquid-drop material discharge head) 22 is arranged at an inclination angle of θ with respect to the head line-feed direction Y. The angle θ is greater than 0° but smaller than 180°.

Now, let "D" represent the constant layout pitch of the nozzles 27, and "D cos θ" is the layout pitch of the nozzles 27 in the head line-feed direction. Let "W" represent the spacing between two mutually closest nozzles 27 at the closest ends of the two adjacent ink-jet heads (liquid-drop material discharge head) 22, and the following equation holds:

$$W = mD \cos\theta \text{ (}m\text{ is an integer of 2 or larger).}$$

The spacing W between two mutually closest nozzles 27 at the closest ends of the two adjacent ink-jet heads (liquid-drop material discharge head) 22 is an integer multiple of D cos θ, namely, the layout pitch of the nozzles 27 in the head line-feed direction.

At the same time, the sub scanning motion pitch P (see FIG. 1(*b*)) of the print head (liquid-drop material discharge mechanism) 22*a* in the head line-feed direction is set to equal an integer multiple of D cos θ, namely, the layout pitch of the nozzles 27 in the head line-feed direction. The following equation thus holds:

$$P = nD \cos \theta \ (n \text{ is an integer of 1 or larger}).$$

This arrangement allows all nozzles 27 of the ink-jet head (liquid-drop material discharge head) 22 to pass correctly right above the pixel formation regions even when the spacing (namely, the filter element pitch) between the filter elements 3 (see FIG. 1(*a*)) is different from the nozzle layout pitch D. All nozzles 27 are used to discharge ink to correct positions on the substrate 2. The success rate of pixel formation of the color filter, namely, the printing efficiency is increased.

In the print head (liquid-drop material discharge mechanism) 22*a* illustrated in FIG. 1 or FIG. 2, at least one nozzle 27 located at each of both ends of at least one ink-jet head (liquid-drop material discharge head) 22, for example, ten nozzles 27 at each of both ends of an ink-jet head (liquid-drop material discharge head) 22 may be designed not to eject the filter material to the filter element formation regions 7 on the substrate 2.

In this way, the ink-jet head (liquid-drop material discharge head) 22 ejects an appropriate amount of ink even when distribution characteristics of the ejected ink significantly vary along the nozzle row 28 of the ink-jet head (liquid-drop material discharge head) 22. The filter element having a uniform surface shape and a uniform thickness is formed in each filter element formation region 7 of the substrate 2.

When 180 nozzles 304 along a nozzle row 305 shown in FIG. 26(*a*) are used, the filter elements 303 formed of the material ejected from the nozzles 304 near the end of the nozzle row 305 become thick, and have a low transmissivity or reflectivity. As a result, an image observed through the filters suffers from streaks extending in the main scan direction.

If ten nozzles 27 on each of both ends are designed not to eject the filter material as illustrated in FIG. 1 and FIG. 2 above, the head becomes identical to that having 160 (180–10–10) nozzles 27. The filter elements 3 become uniform in surface shape and thickness. The resulting color filters become optically uniform.

The filter elements 3 are now formed on the substrate 2 using the print head (liquid-drop material discharge mechanism) 22*a* illustrated in FIG. 1 or FIG. 2. When the filter material is formed of the three types of ink of R (red), G (green), and B (blue), all nozzles 27 in one of the ink-jet heads (liquid-drop material discharge heads) 22 are used to eject only one of the three types of ink of R (red), G (green), and B (blue), thereby forming the filter element 3 of the corresponding color. Each of the ink-jet heads (liquid-drop material discharge heads) 22 is thus responsible for the corresponding one of the three primary colors.

The ink-jet heads (liquid-drop material discharge heads) 22 are arranged with a predetermined spacing permitted therebetween in the print head (liquid-drop material discharge mechanism) 22*a*. When the print head (liquid-drop material discharge mechanism) 22*a* scans the substrate 2, one single scan concurrently produces the filter elements 3 corresponding to the colors of R (red), G (green), and B (blue). For this reason, the pixel formation success rate, namely, the printing efficiency is improved.

When the filter material includes the three types of ink of R (red), G (green), and B (blue), a plurality of passages, for example, three passages are arranged in at least one of the plurality of ink-jet heads (liquid-drop material discharge heads) 22, and the three passages allow the three types of ink of R (red), G (green), and B (blue), respectively to allow pass therethrough.

In this case, the same ink-jet head (liquid-drop material discharge head) 22 ejects ink of different colors through the nozzles 27 therewithin. In this arrangement, as well, one single scan produces the filter elements 3 corresponding to the colors of R (red), G (green), and B (blue). For this reason, the pixel formation success rate, namely, the printing efficiency is improved.

Referring to FIG. 1, the apparatus for manufacturing the color filter of the present invention produces a color filter 1 with the filter elements 3 having a predetermined shape and a predetermined thickness, namely, the pixels on the substrate 2.

Figure 8:
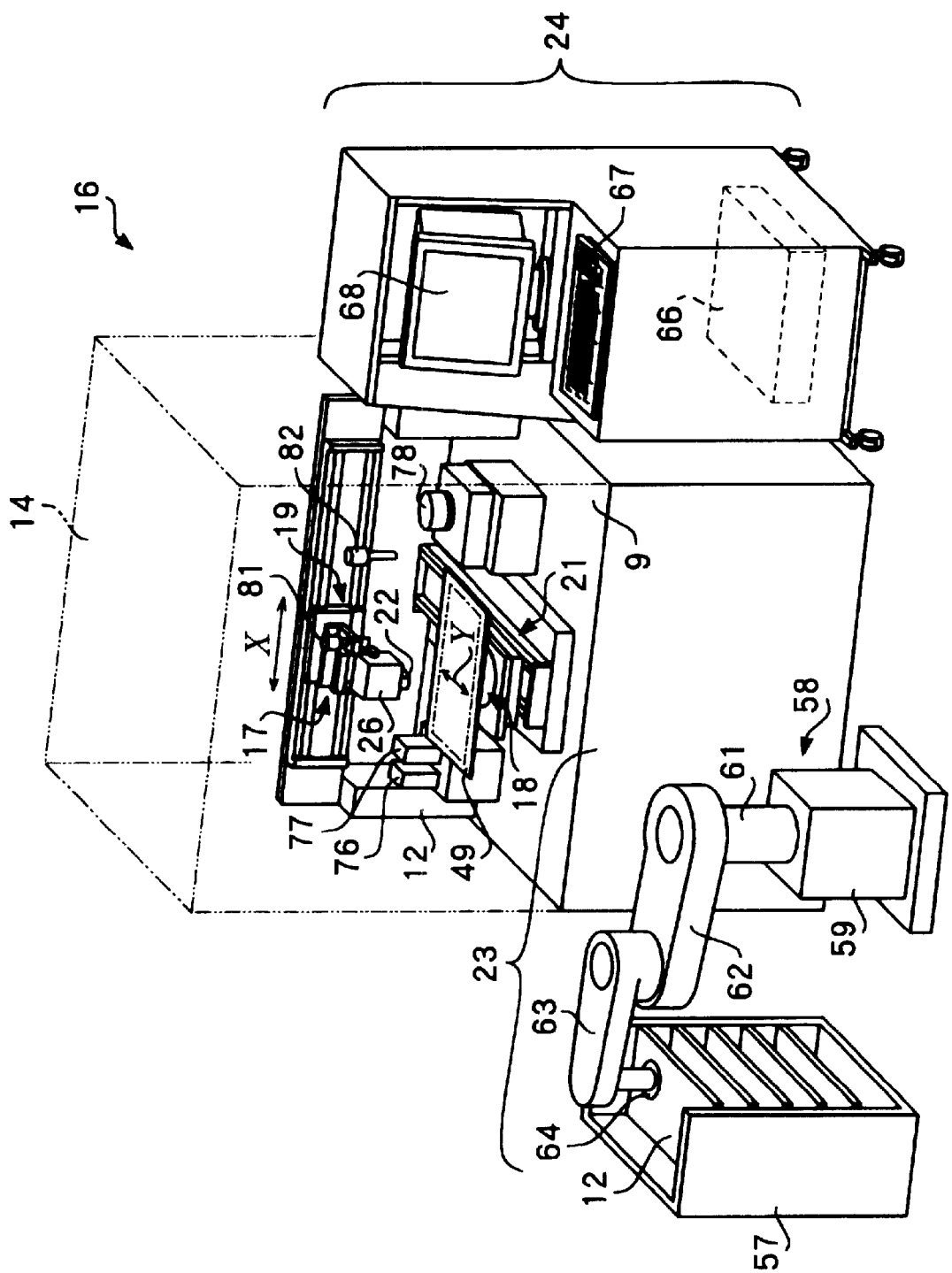
FIG. 8 is a perspective view of one embodiment of ink-jet device (liquid-drop material discharge device) forming a major portion of one of the apparatus for manufacturing the color filter, the apparatus for manufacturing a liquid-crystal display, and the apparatus for manufacturing an electroluminescence device, in accordance with the present invention.
Figure 9:
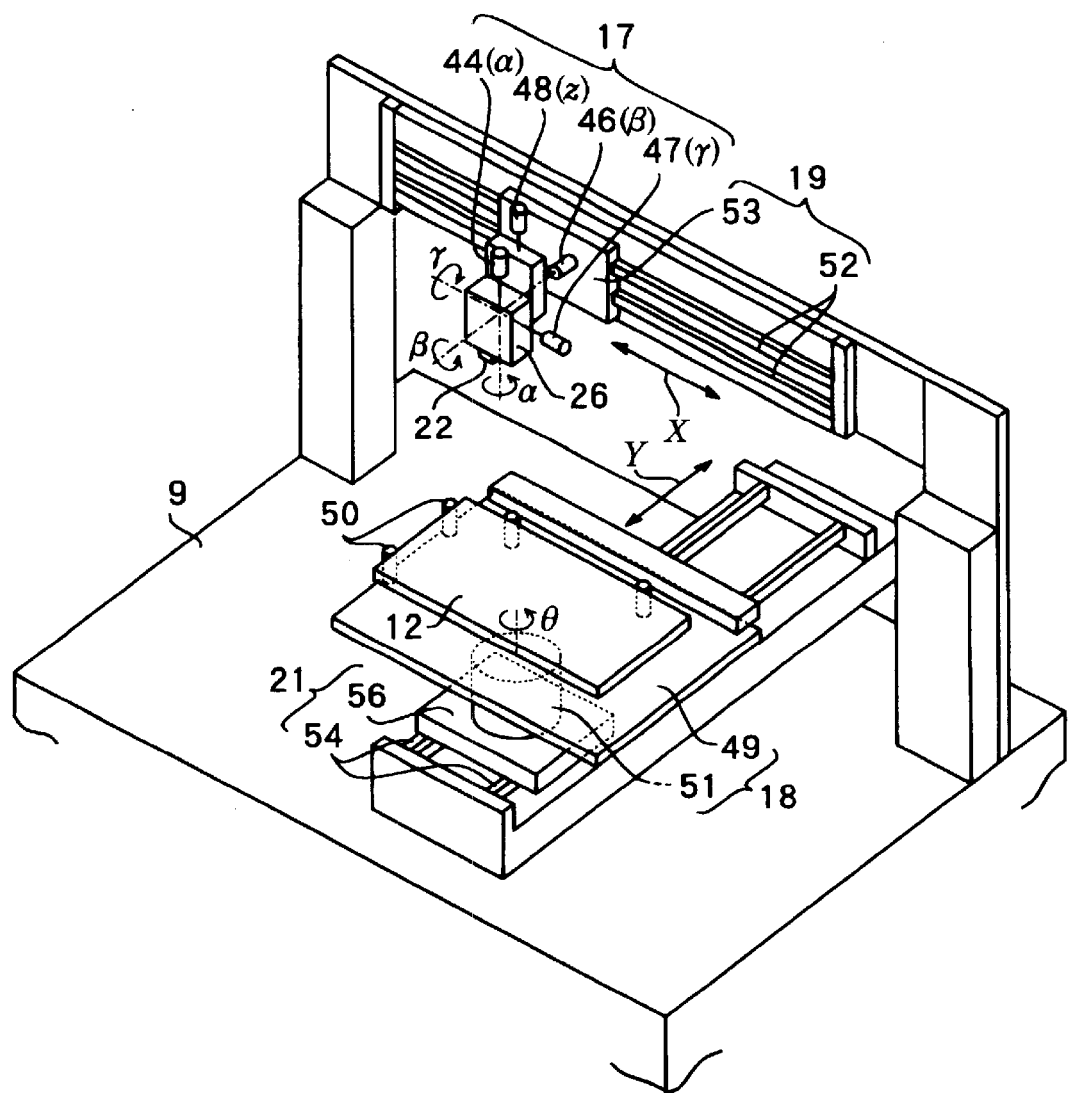
FIG. 9 is an enlarged perspective view of a major portion of the ink-jet device illustrated in FIG. 8.

FIG. 1, FIG. 8 and FIG. 9 illustrate one example of the apparatus for manufacturing the color filter in accordance with one embodiment of the present invention. The apparatus for manufacturing the color filter includes a print head (liquid-drop material discharge mechanism) 22*a* (see FIG. 1) including a plurality of nozzles 27, filter material feeder device (not shown) for supplying the plurality of nozzles 27 with the filter material, main scan driving device 19 (see FIG. 2 and FIG. 3) for moving the print head (liquid-drop material discharge mechanism) 22*a* to scan the substrate 2 in main scan operation, sub scan driving device 21 (see FIG. 2 and FIG. 3) for moving the print head (liquid-drop material discharge mechanism) 22*a* to scan the substrate 2 in sub scan operation, nozzle discharge control device (not shown) for controlling the operation of the nozzles 27, main scan control device (not shown) for controlling the operation of the main scan driving device 19, and sub scan control device (not shown) for controlling the operation of the sub scan driving device 21.

In this arrangement, the print head (liquid-drop material discharge mechanism) 22*a* includes at least one ink-jet head (liquid-drop material discharge head) 22 arranged with a predetermined spacing therebetween, each ink-jet head (liquid-drop material discharge head) 22 including a plurality of nozzles 27 arranged in a row with a predetermined constant layout pitch D. The filter material feeder means (not shown) supplies the filter material to the plurality of nozzles 27 forming the print head (liquid-drop material discharge mechanism) 22*a*. The supplied filter material is ejected through selected nozzles 27 to the filter element formation regions 7, namely, to the pixel formation regions on the substrate 2. The filter elements 3, namely, the pixels are thus formed.

The main scan driving means 19 moves the print head (liquid-drop material discharge mechanism) 22*a* in the head scan direction (namely, the vertical direction X in FIG. 1) as one fixed direction, thereby scanning the substrate 2. The sub scan driving means 21 moves the print head (liquid-drop material discharge mechanism) 22*a* in the head line-feed direction Y in steps of the motion pitch P (see FIG. 1(*b*)), thereby scanning the substrate 2 in the sub scan operation. The unshown nozzle discharge control device controls the discharge amount and the discharge time of the filter material ejected through the plurality of nozzles 27.

In the manufacturing apparatus of the color filter of this embodiment, the print head (liquid-drop material discharge mechanism) 22*a* is moved in the head scan direction (namely, in the vertical direction X in FIG. 1(*a*)) as one fixed direction to scan the substrate 2 in the main scan operation. Along with this motion, the print head (liquid-drop material discharge mechanism) 22*a* is moved in the head line-feed direction Y in steps of the motion pitch P to scan the substrate 2 in the sub scan operation.

During the main scan period and the sub scan period, the plurality of nozzles 27 in at least one ink-jet head (liquid-drop material discharge head) 22 selectively eject the filter material to the filter element formation regions 7, or the pixel formation regions on the substrate 2. As required, the main scan operation and the sub scan operation can be repeated several times to deposit the filter material onto the filter element formation regions 7 or the pixel formation regions on the substrate 2 in a predetermined shape and to a predetermined thickness. In this way, the filter element 3 or the pixel having the predetermined shape and the predetermined thickness is arranged on the substrate 2.

Referring to FIG. 1, in the apparatus for manufacturing the color filter of this embodiment, the spacing W between the two mutually closest nozzles 27 of the closest ends of adjacent ink-jet heads (liquid-drop material discharge heads) 22 is an integer multiple of the layout pitch D of the nozzles 27. In other words, the following equation holds:

$W=mD$ ($m$ is an integer of 2 or larger).

The sub scanning motion pitch P of the print head (liquid-drop material discharge mechanism) 22a in the head line-feed direction becomes an integer multiple of the constant layout pitch D of the nozzles 27 as expressed in the following equation:

$P=nD$ ($n$ is an integer of 1 or larger).

Figure 3:
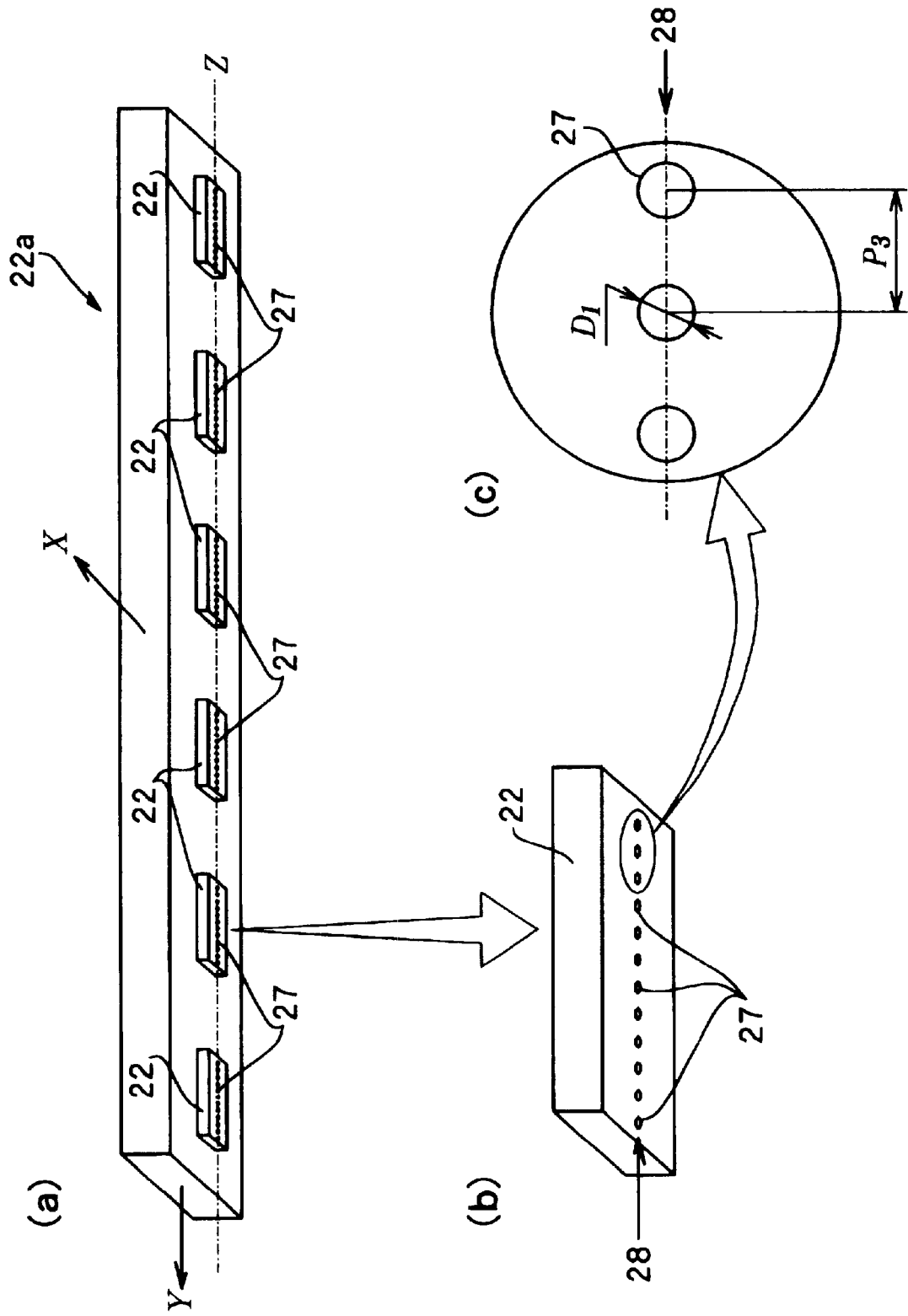
FIGS. 3(a) through 3(c) are perspective views illustrating one example of a print head (liquid-drop material discharge mechanism) for use in an apparatus of the present invention for manufacturing the color filter.

FIG. 3 illustrates one example of the print head (liquid-drop material discharge mechanism) 22a in the apparatus for manufacturing the color filter in accordance with the present invention. In this example, the print head (liquid-drop material discharge mechanism) 22a includes six ink-jet heads (liquid-drop material discharge heads) 22. Each ink-jet head (liquid-drop material discharge head) 22 includes a linearly arranged row of nozzles 27 composed of a plurality of nozzles 27, for example, 12 nozzles 27. For example, the layout pitch P3 of the nozzles 27 is 141 $\mu$m, the diameter D1 of the nozzle 27 is 28 $\mu$m, and the pitch of the filter element (or pixel) is 141 $\mu$m.

As already described with reference to FIG. 2, the ink-jet head (liquid-drop material discharge head) 22 may be arranged at an inclination angle $\theta$ with respect to the head line-feed direction Y. The angle $\theta$ is greater than 0° and smaller than 180°. The spacing W between two mutually closest nozzles 27 at the closest ends of the two adjacent ink-jet heads (liquid-drop material discharge head) 22 is an integer multiple of D cos $\theta$, namely, the layout pitch of the nozzles 27 in the head line-feed direction:

$W=mD \cos \theta$ ($m$ is an integer of 2 or larger).

At the same time, the sub scanning motion pitch P (see FIG. 1) of the print head (liquid-drop material discharge mechanism) 22a in the head line-feed direction is set to equal an integer multiple of D cos $\theta$, namely, the layout pitch of the nozzles 27 in the head line-feed direction Y. The following equation thus holds:

$P=nD \cos \theta$ ($n$ is an integer of 1 or larger).

Figure 4:
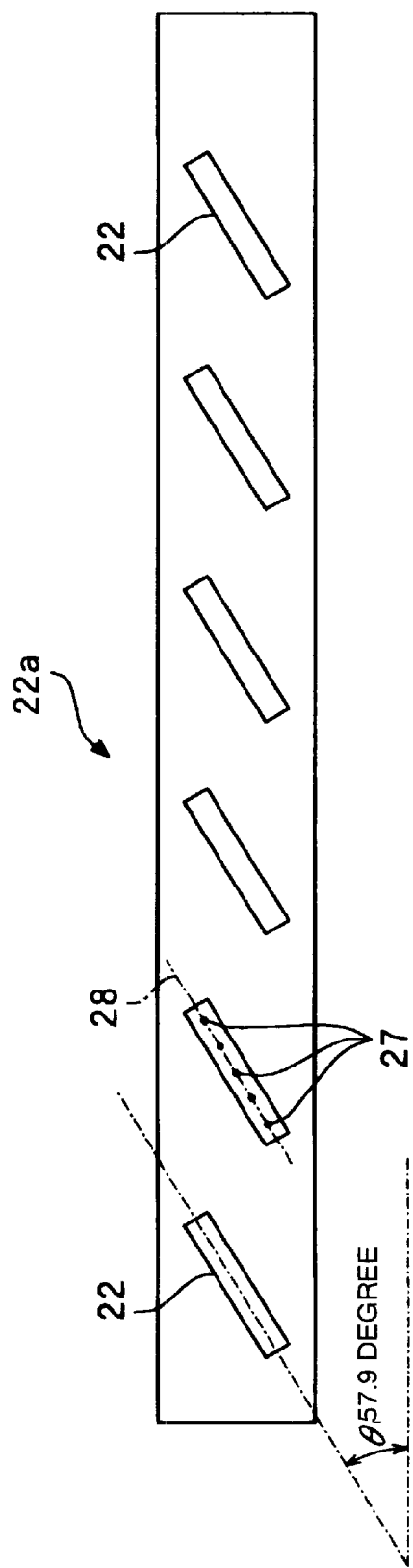
FIG. 4 is a plan view illustrating another example of the print head (liquid-drop material discharge mechanism) for use in the apparatus of the present invention for manufacturing the color filter.

FIG. 4 illustrates another example of the print head (liquid-drop material discharge mechanism) 22a in the apparatus for manufacturing the color filter in accordance with the present invention. In this example, the print head (liquid-drop material discharge mechanism) 22a includes six ink-jet heads (liquid-drop material discharge heads) 22. Each ink-jet head (liquid-drop material discharge head) 22 includes a nozzle row 28 composed of 12 nozzles 27. The ink-jet head (liquid-drop material discharge head) 22 is arranged at an inclination angle $\theta$. The inclination angle $\theta$ is 57.9°, for example.

For example, the layout pitch of the nozzles 27 is 141 $\mu$m, the diameter of the nozzle 27 is 28 $\mu$m, and the pitch of the filter element (or pixel) is 75 $\mu$m.

The color filter that is manufactured through the method and apparatus for manufacturing the color filter of the present invention is discussed below. FIGS. 5(a) and 5(b) are plan views illustrating the surface of the color filter. FIG. 5(a) illustrates the entire mother substrate prior to dicing into the color filter, and FIG. 5(b) illustrates a single color filter diced from the mother substrate.

FIGS. 6(a)–6(d) are process diagrams of the color filter in the order of manufacture, illustrating cross-sectional structures of the color filter taken along line VII—VII in FIG. 5(b). FIG. 6(a) illustrates the color filter prior to ejection of a filter material, FIG. 6(b) illustrates the color filter immediately subsequent to the ejection of the filter material, FIG. 6(c) illustrates the color filter with the filter element arranged thereon, and FIG. 6(d) illustrates the color filter with a protective layer attached thereto.

Referring to FIG. 5, a color filter 1 can be produced by arranging a plurality of filter elements 3 in a dot pattern (in a dot matrix in FIG. 5(b)) on the surface of the substrate 2 fabricated of glass, plastic, or the like, and then by depositing a protective layer 4 as illustrated in FIG. 6(d). FIG. 5(b) illustrates the color filter 1 with the protective layer 4 removed.

Referring to FIG. 6(d), the filter element 3 is formed in a region defined by partitioning walls 6. The partitioning walls 6, fabricated of light non-transmissive resin material, have a grid pattern if viewed from an arrow B in FIG. 6(a). The partitioning walls 6 form a plurality of rectangular regions in a matrix, and these regions are filled with a color material. The filter elements 3 thus result.

Figure 7:
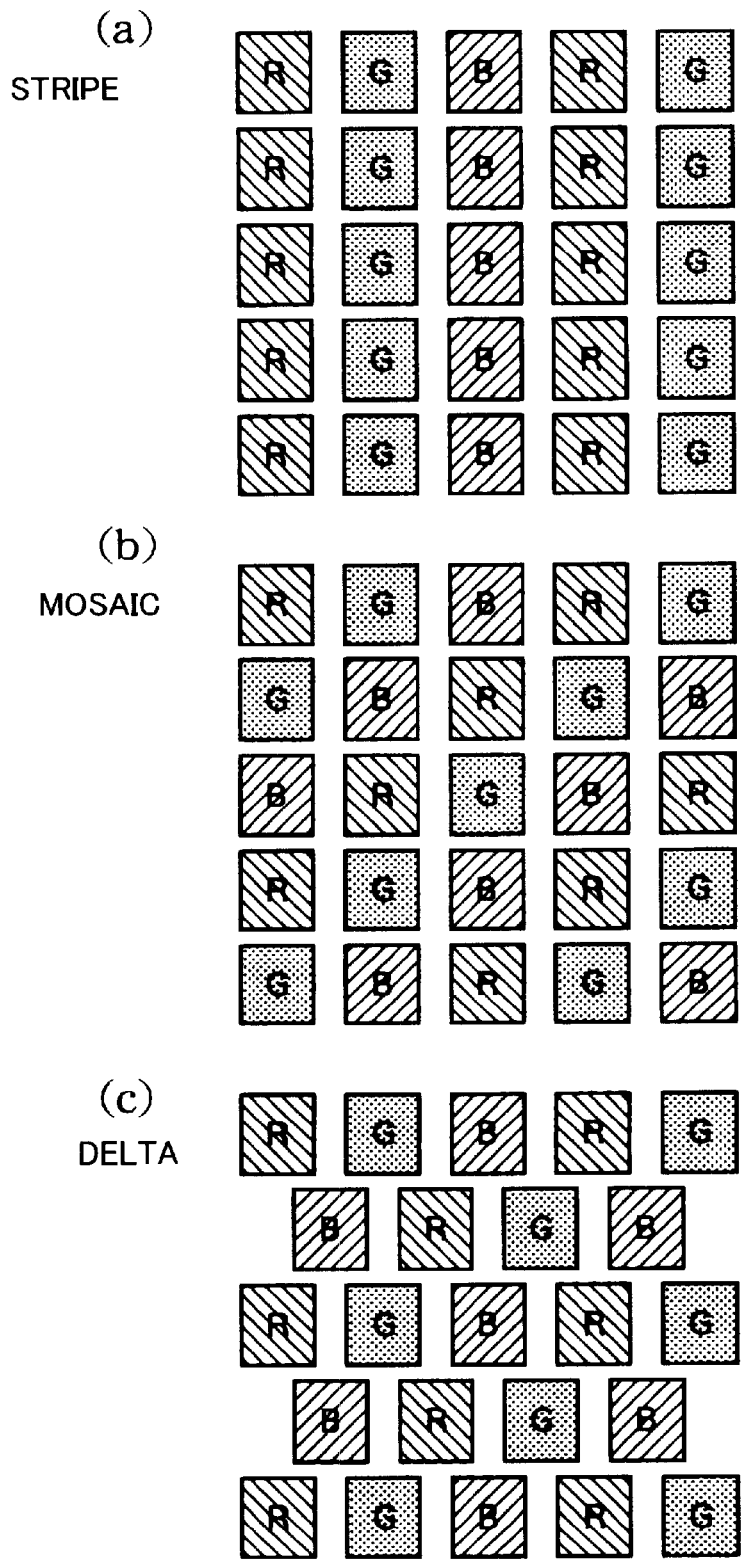
FIGS. 7(a) through 7(c) are plan views illustrating configuration examples of three display dots of R (red), G (green), and B (blue) colors in color filter.

The filter element 3 is formed of a filter material of one of the colors R (red), G (green), and B (blue). The filter elements of these colors are arranged in a predetermined configuration. The examples of configuration may be any of the stripe configuration, the mosaic configuration, and the delta configuration respectively illustrated in FIG. 7(a), FIG. 7(b), and FIG. 7(c).

In the stripe configuration, each column of matrix has the same color. In the mosaic configuration, any three filter elements arranged in each of a horizontal line and a vertical line are R (red), G (green), and B (blue). In the delta configuration, the filter elements are repeatedly shifted every two rows, and any adjacent three filter elements are R (red), G (green), and B (blue).

Referring to FIG. 5(b), the size T0 of the color filter 1 is 1.8 inches. A single filter element 3 is as large as horizontal×vertical=L0×L1=30 $\mu$m×100 $\mu$m. The spacing P4 between the filter elements 3 (an element pitch) is 75 $\mu$m, for example.

The pitch of the color filter 1 in the sub scan direction preferably equals an integer multiple of the layout pitch of the filter elements 3. This arrangement allows the filter element 3 to be manufactured even more efficiently.

When the color filter 1 is used as an optical element for full-color display, three filter elements 3 of R (red), G (green), and B (blue) as a unit form a single pixel. The full-color display is presented by allowing light beams to be selectively transmitted through one of or a combination of the R (red), G (green), and B (blue) elements within a single pixel. The partitioning walls 6, fabricated of light non-transmissive resin, function as a black matrix.

The above-referenced color filter 1 is diced from a large mother substrate shown in FIG. 5(*a*). Specifically, the pattern of a single color filter 1 is formed in each of a plurality of color filter areas 11 formed in a mother substrate 12, a guide groove is formed surrounding the color filter area 11, and the mother substrate 12 is diced along the groove. Each color filter 1 thus results.

The method and apparatus for manufacturing the color filter of the present invention is further discussed with reference to the color filter 1 shown in FIG. 5(*b*). Referring to FIG. 6(*a*), the partitioning walls 6, having a grid pattern if viewed in the arrow B, are fabricated of a resin material having no light transmissivity on the surface of the mother substrate 12. An grid hole 7 of the grid pattern is a portion where the filter element 3 is formed. The two-dimensional size of the filter element formation region 7 defined by the partitioning walls 6, if viewed in the arrow B, can be horizontal dimension×vertical dimension=30 $\mu$m×100 $\mu$m.

The partitioning walls 6 serves both the function of blocking the flow of the filter material deposited in the filter element formation region 7 and the function of a black matrix. The partitioning walls 6 may be produced using any patterning technique, such as the photolithographic technique, and may be fired by a heater as required.

Subsequent to the formation of the partitioning walls 6, each filter element formation region 7 is filled with a filter material 13 by supplying the filter element formation region 7 with a liquid drop 8 of the filter material as illustrated in FIG. 6(*b*). Referring to FIG. 6(*b*), a filter material 13R of R (red), a filter material 13G of G (green), and a filter material 13B of B (blue) are used.

When the filter element formation region 7 is supplied with a predetermined amount of the filter material 13, the mother substrate 12 is heated at 70° C. or so by a heater to evaporate a solvent of the filter material 13. Through the evaporation process, the volume of the filter material 13 is reduced as illustrated in FIG. 6(*c*). When a reduction in volume is too large, the supply of the liquid drop 8 of the filter material 13 and then heating of the liquid drop 8 are repeated until a sufficient thickness is reached as a color filter. The above process leaves only a solid component of the filter material 13 in the form of film.

After the formation of the filter material 13, the mother substrate 12 is heated to fully dry the filter element 3 at a predetermined temperature and for a predetermined time. Then, the protective layer 4 is formed using any appropriate techniques such as a spin coating method, a roll coating method, or a lipping method. The protective layer 4 is used to protect the filter element 3, etc., and to planarize the surface of the color filter 1.

FIG. 8 illustrates one embodiment of ink-jet device (liquid-drop material discharge device) for supplying the filter material 13 illustrated in FIG. 6(*b*). This ink-jet device (liquid-drop material discharge device) 16 discharges and deposits an ink drop of one of R (red), G (green), and B (blue), for example, an ink drop of R here, in a predetermined location of a color filter formation area 11 within the mother substrate 12 (see FIG. 5(*a*)). Each of the ink-jet device (liquid-drop material discharge device) of G color filter material and the B color filter material is also prepared, and the construction of these device remains unchanged from that illustrated in FIG. 8.

Referring to FIG. 8, the ink-jet device (liquid-drop material discharge device) 16 includes a head unit 26 including a print head (liquid-drop material discharge mechanism) 22*a* (see FIG. 1) having at least one ink-jet head (liquid-drop material discharge head) 22 arranged with a predetermined spacing allowed therebetween, head position control means 17 for controlling the position of the print head (liquid-drop material discharge mechanism) 22*a*, substrate position control device 18 for controlling the position of the mother substrate 12, main scan driving device 19 for moving the ink-jet head (liquid-drop material discharge head) 22 with respect to the mother substrate 12 in a main scan operation, sub scan driving device 21 for moving the ink-jet head (liquid-drop material discharge head) 22 with respect to the mother substrate 12 in a sub scan operation, a substrate supply unit 23 for supplying the mother substrate 12 to a predetermined work location within the ink-jet device (liquid-drop material discharge device) 16, and a controller 24 for generally controlling the ink-jet means (liquid-drop material discharge device) 16.

The head position control device 17, the substrate position control device 18, the main scan driving device 19, and the sub scan driving device 21 are all mounted on a base 9. These units are covered with a cover 14.

Figure 10:
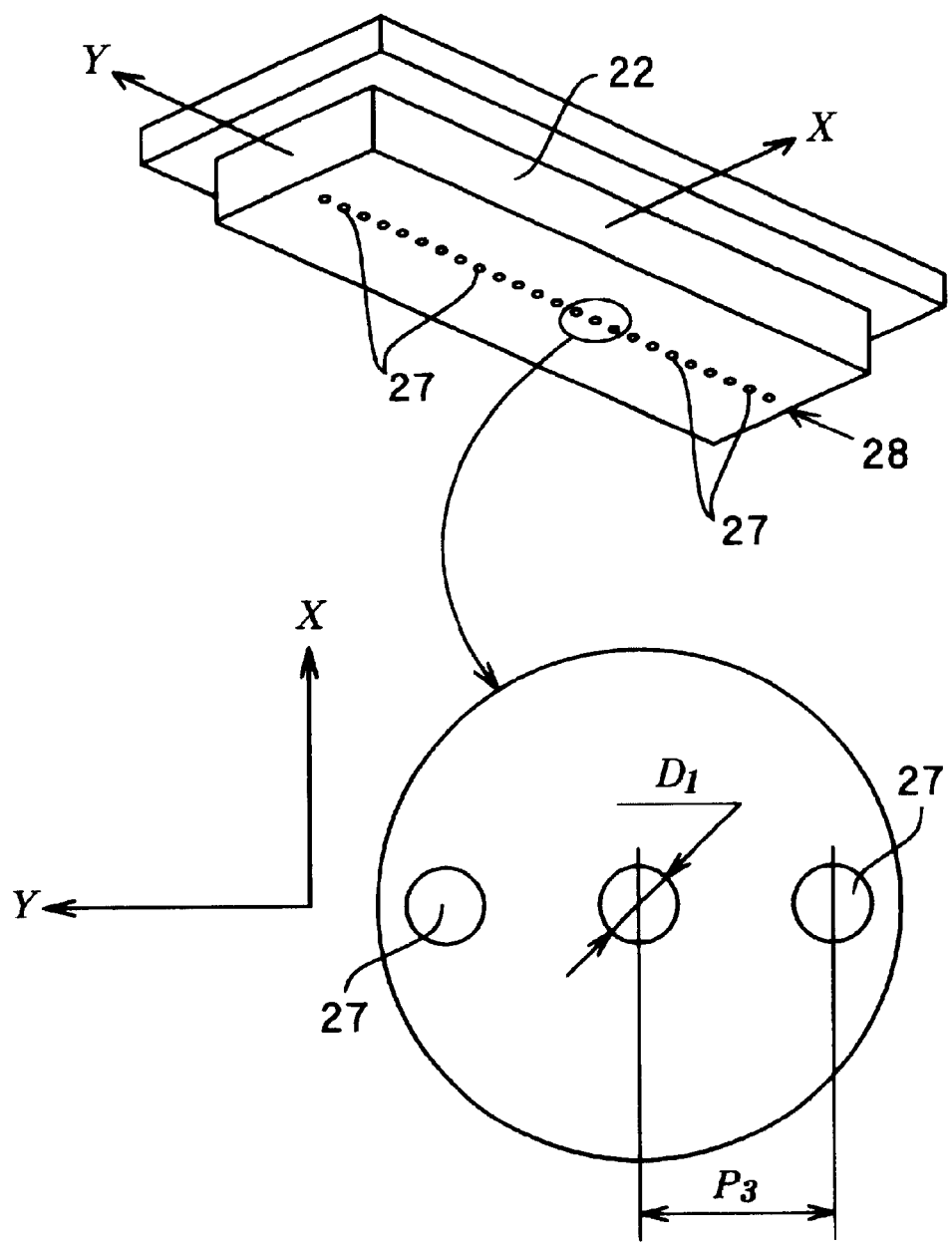
FIG. 10 is an enlarged perspective view of the ink-jet head (liquid-drop material discharge head) as a major portion of the ink-jet means in FIG. 9.

The ink-jet head (liquid-drop material discharge head) 22 includes a nozzle row 28 which is formed by arranging a plurality of nozzles 27 in a row. For example, the number of nozzles 27 is 180, a diameter of nozzle hole D1 is 28 $\mu$m, and a nozzle pitch P3 of the nozzles 27 is 141 $\mu$m. The head scan direction (namely, the main scan direction) X with respect to the color filter 1 and the mother substrate 12 in FIG. 5(*a*) and FIG. 5(*b*) and the sub scan direction Y perpendicular to the head scan direction respectively correspond to X and Y direction in FIG. 10.

Figure 11:
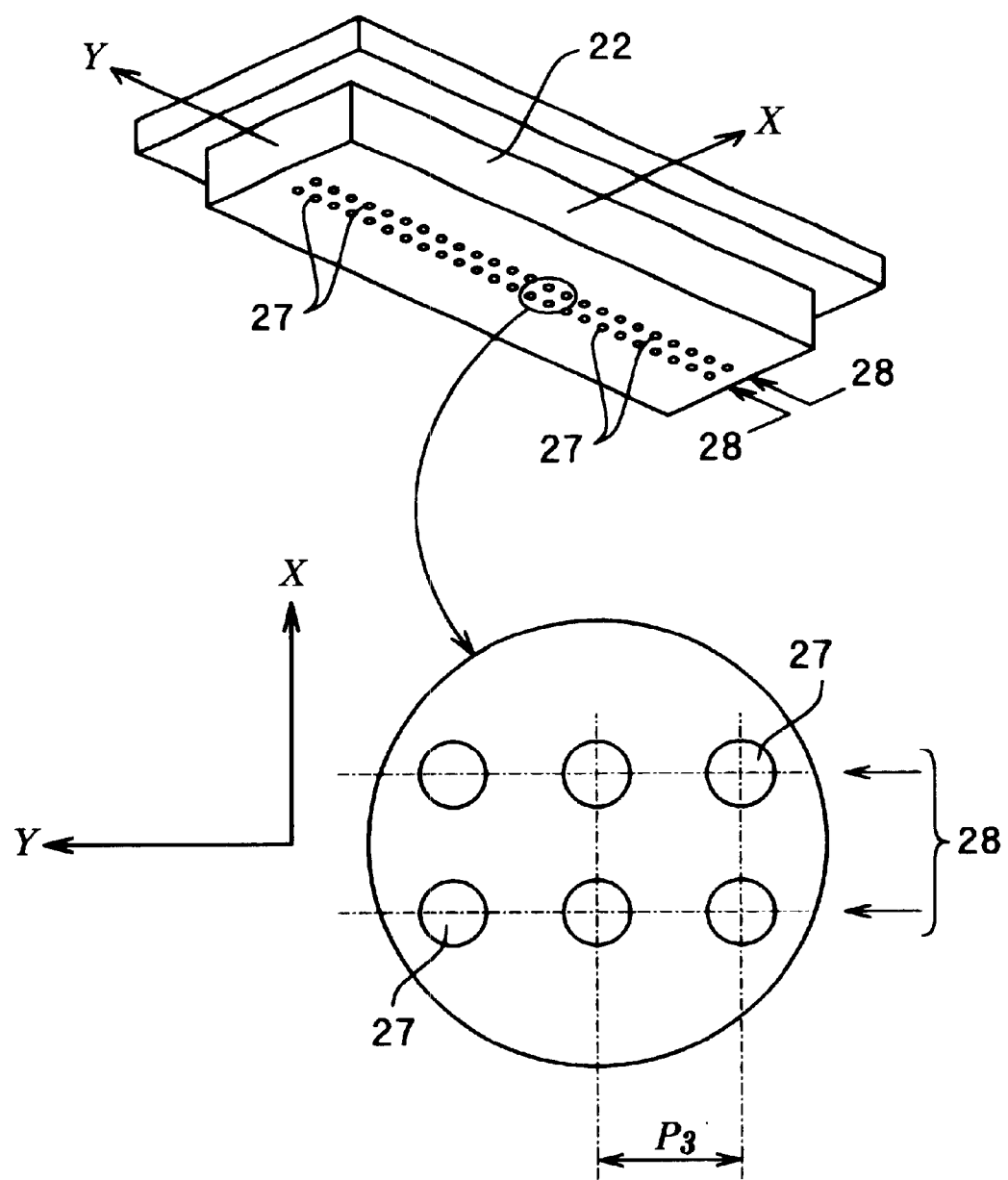
FIG. 11 is a perspective view of a modification of the ink-jet head (liquid-drop material discharge head)

Referring to FIG. 11, two nozzle rows 28 are arranged in the head scan direction X so that two nozzles 27 in the same scan line may supply a single filter element formation region 7 with the filter material. The layout pitch P3 of the nozzles 27 may be set to be 141 $\mu$m.

Figure 12:
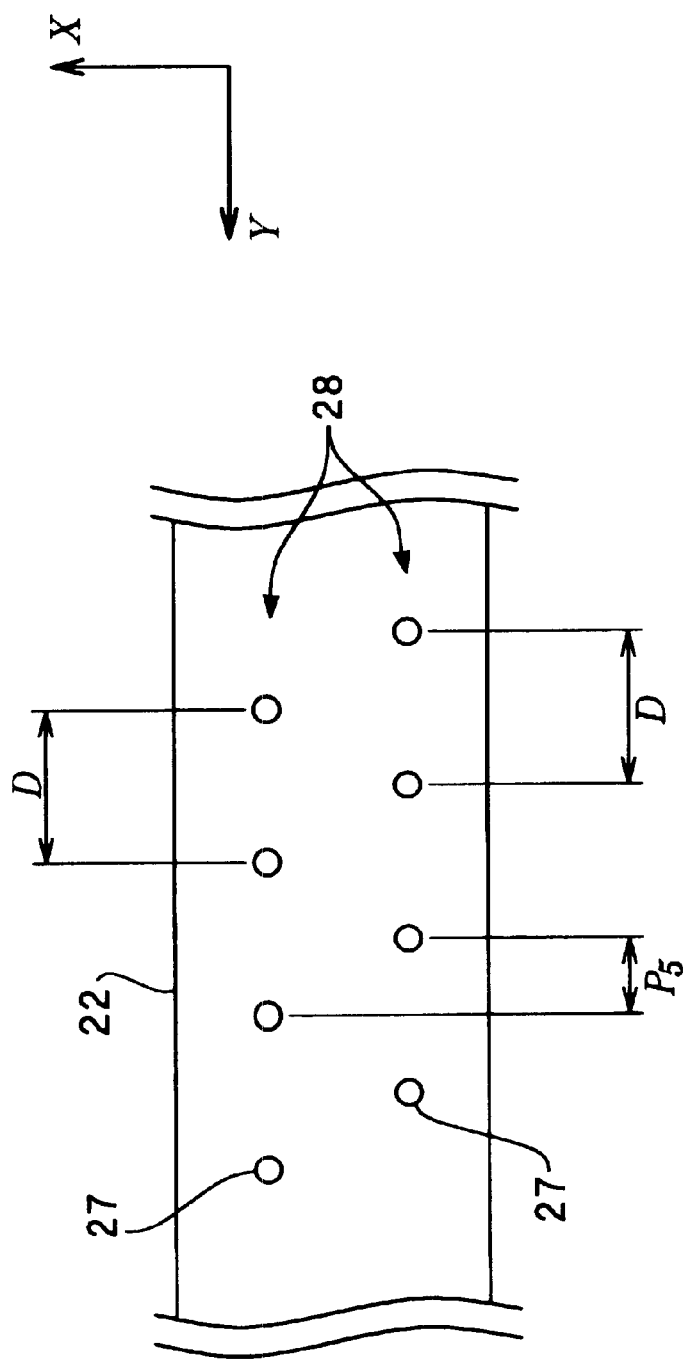
FIG. 12 is a plan view of another modification of the ink-jet head (liquid-drop material discharge head)

Referring to FIG. 12, the two nozzle rows 28 are arranged in the head scan direction X and a plurality of nozzles 27 is arranged in a mutually shifted configuration. Through these nozzles 27, the filter material is supplied to the filter element formation region 7 (see FIG. 1(*a*)). If the layout pitch D of the nozzles 27 is set to be 141 $\mu$m, a pitch P5 between the plurality of scanning lines extending in the main scan direction X is as half as the layout pitch D, namely, is 70.5 $\mu$m.

Figure 13:
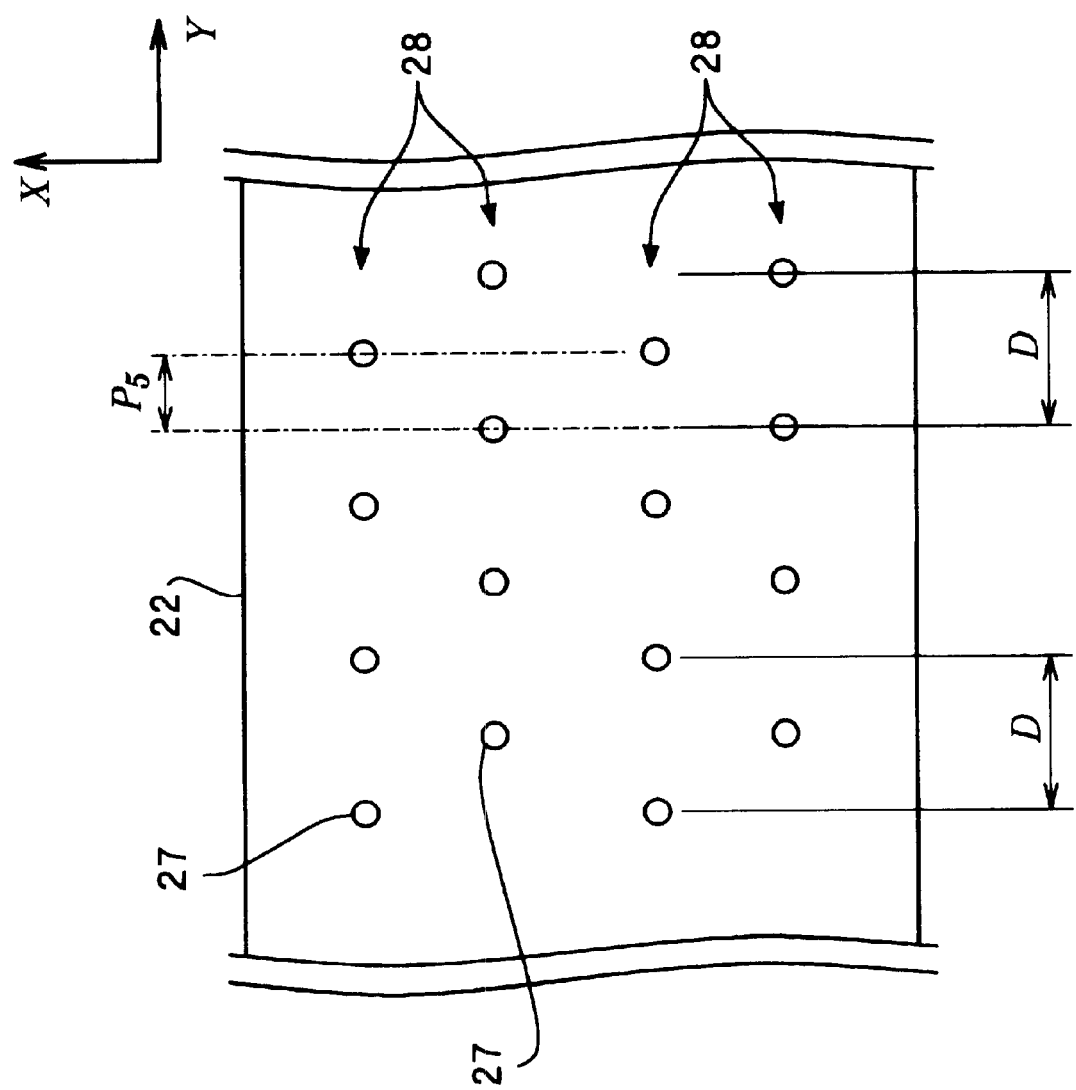
FIG. 13 is a plan view of yet another modification of the ink-jet head (liquid-drop material discharge head)

Referring to FIG. 13, the ink-jet head (liquid-drop material discharge head) 22 is formed so that a plurality of pairs of nozzle row 28 is mutually adjacent to each other in the head scan direction X, and so that the nozzles 27 in each pair of nozzle rows 28 are shifted. The filter material is then fed to the filter element formation regions 7 through these nozzles 27. FIG. 13 illustrates two pairs of nozzle rows 28 shifted from each other. The layout pitch D of the nozzles 27 is set to be 141 $\mu$m, and a practical pitch P5 between the plurality of scanning lines extending in the main scan direction X is as half as the layout pitch D, namely, is 70.5 $\mu$m.

Figure 14:
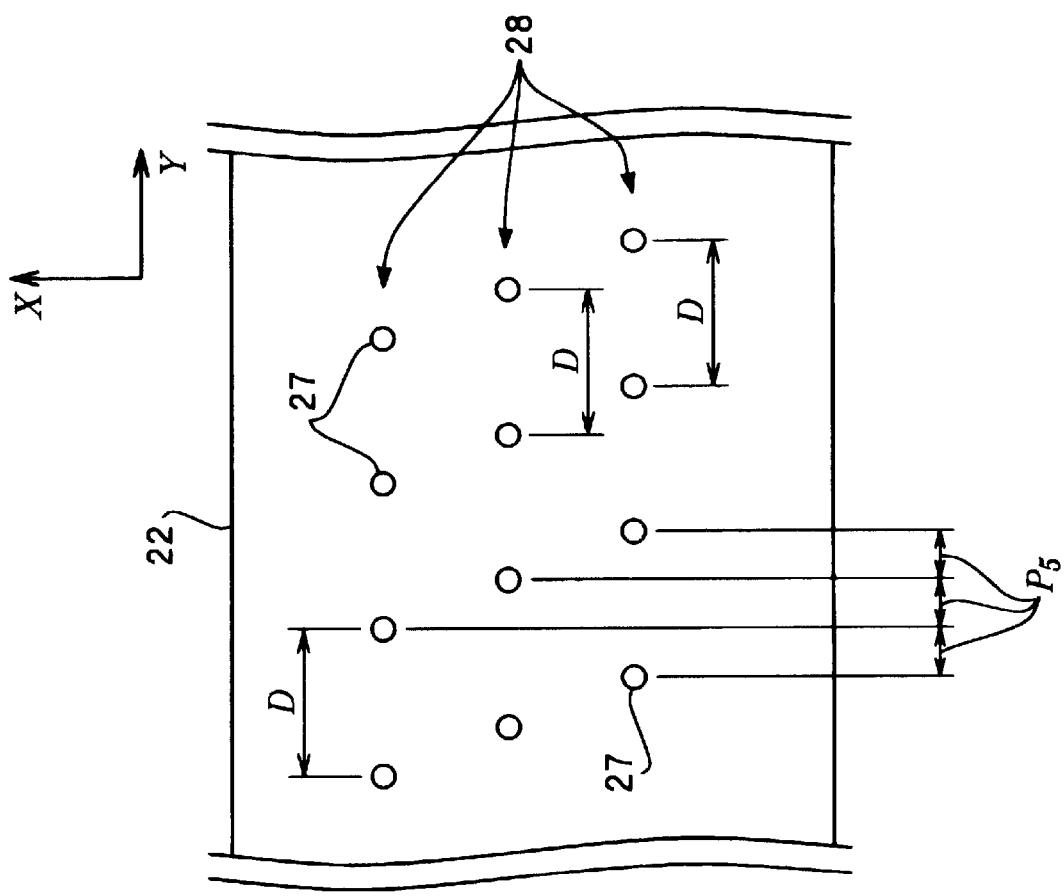
FIG. 14 is a plan view of still another modification of the ink-jet head (liquid-drop material discharge head)

Referring to FIG. 14, three rows 28 of nozzles may be shifted from each other by one-third the pitch thereof. Through these nozzles 27, the filter element is fed to the filter element formation regions 7. The layout pitch D of the nozzles 27 is 141 $\mu$m, and the pitch P5 of the main scanning lines extending in the X direction is one-third the layout pitch D, namely, 47 $\mu$m.

As shown in FIG. 1, the ink-jet head (liquid-drop material discharge head) 22 is arranged so that the nozzle row 28 is aligned perpendicular to the head scan direction X. In other cases, the nozzle row 28 may be inclined at a predetermined angle θ with respect to a direction perpendicular to the head scan direction X as shown in FIG. 2. The ink-jet head (liquid-drop material discharge head) 22 selectively ejects the filter material, namely, ink through the plurality of nozzles 27 while moving in a direction parallel to the head scan direction X. The filter material is thus deposited to the filter element formation regions 7 (see FIG. 6(a)) on the mother substrate 12 (see FIG. 5(a)). The ink-jet head (liquid-drop material discharge head) 22 moves in the sub scan direction Y by a predetermined distance, thereby shifting a main scan position by a predetermined spacing. The ink-jet head (liquid-drop material discharge head) 22 has an internal structure as shown in FIG. 15(a) and FIG. 15(b). Specifically, the ink-jet head (liquid-drop material discharge head) 22 includes a nozzle plate 29 fabricated of stainless steel, a vibrator plate 31 facing the nozzle plate 29, and a plurality of partitioning blocks 32 that connects the nozzle plate 29 to the vibrator plate 31. The partitioning blocks 32 form a plurality of ink chambers 33 and an ink reservoir 34 between the nozzle plate 29 and the vibrator plate 31. The plurality of ink chambers 33 communicate with the ink reservoir 34 through passages 38. An ink supply port 36 is formed in an appropriate location in the vibrator plate 31. An ink feeder 37 is connected to the ink supply port 36. The ink feeder 37 feeds the filter material M of one of R (red), G (green), and B (blue), for example, the R (red) filter material M to the ink supply port 36. The fed filter material M fills the ink reservoir 34, and then reaches the ink chambers 33 through the passages 38.

The nozzle plate 29 includes the nozzles 27 to eject the filter material M in jet from the ink chambers 33. An ink pressurizing unit 39 is attached on the back of the vibrator plate 31, opposite to the side of the ink chambers 33, in a location corresponding to the ink chambers 33. Referring to FIG. 15(b), the ink pressurizing unit 39 includes a piezoelectric element 41 and a pair of electrodes 42a and 42b sandwiching the piezoelectric element 41. The piezoelectric element 41 is deformed and changed in shape, outwardly projecting in a direction represented by an arrow C when a voltage is applied between the electrodes 42a and 42b. In this way, the volume of the ink chambers 33 increases. The filter material M corresponding to a volume increase enters the ink chambers 33 through the passages 38.

When the voltage supply to the piezoelectric element 41 is cut off, the piezoelectric element 41 and the vibrator plate 31 are restored back to the original states thereof. The ink chambers 33 also return to the original volumes thereof. The pressure of the filter material M in the ink chamber 33 rises. In response to the rise, the filter material M is ejected in droplets through the nozzles 27 to the mother substrate 12 (see FIG. 5(a)). An ink-repellant layer 43, fabricated of Ni-tetrafluoroethylene eutectoid plated layer, is deposited on the area surrounding each nozzle 27 to prevent the flight of the liquid drop 8 from being bent and the hole of the nozzle 27 from being clogged.

Referring to FIG. 9, the head position control device 17 includes an α motor 44 for rotating the print head (liquid-drop material discharge mechanism) 22a in in-plane rotation, a β motor 46 for rotating the print head (liquid-drop material discharge mechanism) 22a about an axis parallel to the sub scan direction Y in a yaw motion, a γ motor 47 for rotating print head (liquid-drop material discharge mechanism) 22a in an axis parallel to the head scan direction X in a yaw motion, and a Z motor 48 for translating vertically the print head (liquid-drop material discharge mechanism) 22a.

Referring to FIG. 9, the substrate position control device 18 illustrated in FIG. 8 includes a table 49 on which the mother substrate 12 is set, and a θ motor 51 for rotating the table 49 in in-plane rotation as represented by an arrow θ. Referring to FIG. 9, the main scan driving means 19 illustrated in FIG. 8 includes guide rails 52 extending in the head scan direction X, and a slider 53 housing a pulse-driven linear motor. The slider 53 is moved in the head scan direction X along the guide rails 52 when the linear motor housed in the slider 53 operates.

Referring to FIG. 9, the sub scan driving device 21 illustrated in FIG. 8 includes guide rails 54 extending in the sub scan direction Y, and a slider 56 housing a pulse-driven linear motor. The slider 56 is moved along the guide rails 54 in the sub scan direction Y when the linear motor housed in the slider 56 operates.

The pulse-driven linear motors housed in the slider 53 and the slider 56 are precisely controlled in angle of rotation of the output shafts thereof in response to pulse signal fed thereto. The ink-jet head (liquid-drop material discharge head) 22 supported by the slider 53 is precisely controlled in position in the head scan direction X and the table 49 is precisely controlled in position in the sub scan direction Y.

The print head (liquid-drop material discharge mechanism) 22a and the table 49 are controlled in position by position control through the pulse motor. Alternatively, the print head (liquid-drop material discharge mechanism) 22a may be controlled by feedback control through a servo motor, or any other control method.

The substrate supply unit 23 illustrated in FIG. 8 includes a substrate container 57 storing the mother substrates 12 and a robot 58 for conveying the mother substrate 12. The robot 58 includes a mount base 59 planted on a mounting surface such as a floor or ground, a lifting shaft 61 which moves with respect to the mount base 59, a first arm 62 which rotates about the lifting shaft 61, a second arm 63 which rotates about the first arm 62, and a suction pad 64 arranged on the bottom surface of one end of the second arm 63. The suction pad 64 sucks in air to hold the mother substrate 12.

Referring to FIG. 8, capping device 76 and cleaning device 77 are arranged beside the sub scan driving device 21 under the path of the print head (liquid-drop material discharge mechanism) 22a which is driven in the main scan operation by the main scan driving device 19. An electronic scale 78 is arranged beside the other end of the sub scan driving means 21. The cleaning means 77 cleans the ink-jet head (liquid-drop material discharge head) 22. The electronic scale 78 measures the weight of a liquid drop of ink ejected from each nozzle 27 (see FIG. 10) in the ink-jet head (liquid-drop material discharge head) 22 on a per nozzle basis. The capping device 76 prevents the nozzles 27 (see FIG. 10) from being dried when the ink-jet head (liquid-drop material discharge head) 22 is on a standby state.

A camera 81 for the head, mounted in the print head (liquid-drop material discharge mechanism) 22a, is integrally moved together with the print head (liquid-drop material discharge mechanism) 22a. A camera 82 for the substrate, supported on a support unit (not shown) mounted on the base 9, is arranged in a location that permits the mother substrate 12 to be photographed.

The controller 24 illustrated in FIG. 8 includes a computer main unit 66 having a processor, a keyboard 67 as an input device, and a CRT (Cathode-Ray Tube) display 68 as a display. The processor includes a CPU (Central Processing Unit) for performing arithmetic operations, and a memory 71 as an image storage medium for storing a variety of pieces of information.

The head position control device 17, the substrate position control device 18, the main scan driving device 19, the sub scan driving device 21, a head driving circuit 72 for driving the piezoelectric element 41 (see FIG. 15(*b*)) in the ink-jet head (liquid-drop material discharge head) 22, all illustrated in FIG. 8, are interconnected to the CPU 69 through an input/output interface 73 and a bus 74. Furthermore, the substrate supply unit 23, the input device 67, the display 68, the electronic scale 78, the cleaning device 77, and the capping device 76 are also interconnected to the CPU 69 through the input/output interface 73 and the bus 74.

The concept of the memory 71 includes semiconductor memories, such as a RAM (Random-Access Memory), a ROM (Read-Only Memory), etc., or an external storage device such as a hard disk, a CD-ROM reader, or a disk type storage medium. The memory 71 includes a storage area for storing a software program describing a control process of the operation of the ink-jet device (liquid-drop material discharge device) 16, a storage area for storing a discharge position, as coordinates data, in the mother substrate 12 (see FIG. 5(*a*)) of one color (for the R color) of R (red), G (green), and B (blue) in each configuration of the R (red), G (green), and B (blue) elements illustrated in FIG. 7, a storage area for storing a sub scan distance of travel of the mother substrate 12 in the sub scan direction Y in FIG. 9, a storage area for a temporary file serving as a working area for the CPU 69, and a storage area for other data.

The CPU 69 controls the manufacturing apparatus of the present invention so that the filter material, namely, ink is ejected to a predetermined location on the surface of the mother substrate 12 in accordance with the software program stored in the memory 71. To control the manufacturing apparatus, the CPU 69 includes a cleaning processor for performing a cleaning process, a capping processor for performing a capping process, a weight measurement processor for performing arithmetic operations for weight measurement using the electronic scale 78 (see FIG. 8), and a printing processor for performing arithmetic operations for printing the filter material in ink jet.

The printing processor includes a variety of processor blocks, such as a printing start position processor block for setting the print head (liquid-drop material discharge mechanism) 22*a* to a start position for printing, a main scanning control processor block for controlling the print head (liquid-drop material discharge mechanism) 22*a* to move the print head (liquid-drop material discharge mechanism) 22*a* at a predetermined speed in the head scan direction X for the main scan operation, a sub scanning control processor block for controlling the mother substrate 12 to move the mother substrate 12 in the sub scan direction Y by a predetermined sub scanning motion pitch corresponding to a sub scan amount, and a nozzle discharge control processor block for controlling the plurality of nozzles 27 in the ink-jet head (liquid-drop material discharge head) 22 to allow the nozzles 27 to selectively eject the ink, namely, the filter material.

Instead of performing the above-mentioned functions in software using the CPU 69 in whole or in part, it should be understood that a standalone logical circuit or electronic circuit without CPU may be used to perform the above-mentioned functions. In that case, such an electronic circuit is used in stead of the CPU 69 or in addition to the CPU 69.

The operation of the ink-jet device (liquid-drop material discharge device) 16 thus constructed as illustrated in FIG. 8 is discussed below with reference to a flow diagram in FIG. 18.

When the ink-jet device (liquid-drop material discharge device) 16 runs with an operator switching on the apparatus, an initial setting is performed in step S1. Specifically, the head unit 26, the substrate supply unit 23, the controller 24, etc., are set to the default settings thereof. If it is weight measurement timing (YES in step S2), the main scan driving device 19 moves the head unit 26 to the electronic scale 78 illustrated in FIG. 8 (step S3). The amount of ink ejected through the nozzle 27 is measured using the electronic scale 78 (step S4). The weight measurement is performed for all nozzles 27. The voltage applied to the piezoelectric element 41 corresponding to each nozzle 27 is adjusted in accordance ink discharge characteristics of the nozzles 27 (step S5).

When it is cleaning timing (YES in step S6), the main scan driving device 19 moves the head unit 26 to the cleaning device 77 (step S7). The cleaning device 77 cleans the ink-jet head (liquid-drop material discharge head) 22 (step S8).

When it is not yet the weight measurement timing and when it is not yet the cleaning timing (NO in step S2 and NO in step S6), or when the weight measurement and the cleaning are completed, the substrate supply unit 23 illustrated in FIG. 8 operates to supply the mother substrate 12 to the table 49 in step S9. Specifically, the suction pad 64 attracts and holds the mother substrate 12 from the substrate container 57, and then, the lifting shaft 61, the first arm 62, and the second arm 63 are moved, conveying the mother substrate 12 to the table 49, and pressing the mother substrate 12 to alignment pins 50 (see FIG. 9) arranged beforehand in appropriate locations on the table 49. To prevent the mother substrate 12 from being deviated from the position thereof on the table 49, the mother substrate 12 is preferably secured to the table 49 with air suction device.

Observing the mother substrate 12 through the substrate camera 82 illustrated in FIG. 8, the output shaft of the θ motor 51 illustrated in FIG. 9 is rotated in steps of fine angle. The table 49 is thus rotated in steps of fine angle in in-plane rotation, thereby aligning the mother substrate 12 (step S10). Observing the mother substrate 12 through the head camera 81 illustrated in FIG. 8, a printing start position of the ink-jet head (liquid-drop material discharge head) 22 is determined (step S11). The ink-jet head (liquid-drop material discharge head) 22 is moved to the printing start position by appropriately operating the main scan driving means 19 and the sub scan driving means 21 (step S12).

Referring to FIG. 2, the nozzles 27, namely, the nozzle row 28 in the print head (liquid-drop material discharge mechanism) 22*a* is preferably arranged at an inclination angle θ with respect to the sub scan direction Y of the print head (liquid-drop material discharge mechanism) 22*a*. In the ink-jet means (liquid-drop material discharge means) 16, the nozzle pitch D of the adjacent nozzles 27 is typically different from the element pitch of the adjacent filter elements 3, namely, the adjacent filter element formation regions 7. This arrangement is intended to make the dimension of the nozzle pitch D in the sub scan direction Y geometrically equal to the element pitch when the print head (liquid-drop material discharge mechanism) 22*a* is moved in the head scan direction X.

Figure 18:
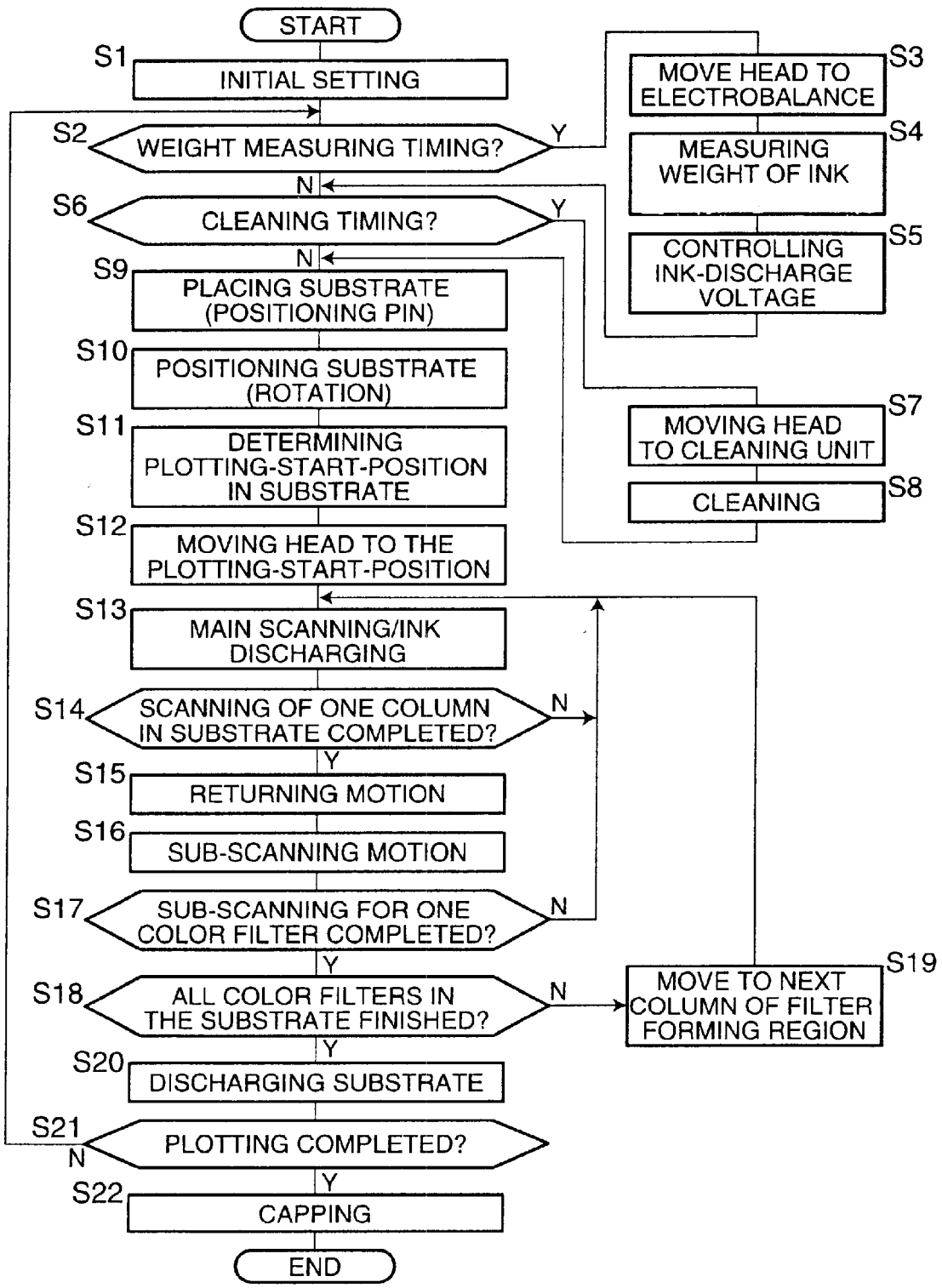
FIG. 18 is a flow diagram illustrating the control flow carried out by the control system illustrated in FIG. 17.

The ink-jet head (liquid-drop material discharge head) 22 is placed at the printing start position in step S12 with reference to FIG. 18. In step S13 illustrated in FIG. 18, the ink-jet head (liquid-drop material discharge head) 22 starts main scan, moving in the head scan direction X. At the same time, ejection of ink starts. Specifically, the main scan driving means 19 operates, causing the print head (liquid-drop material discharge mechanism) 22*a* to linearly move at a constant speed in the head scan direction X. At the moment the corresponding nozzle 27 reaches the filter element formation region 7 to which ink must be supplied in the course of the movement of the head, the filter material, namely, ink is ejected through the nozzle 27.

The amount of ejected ink is a fraction of, specifically, one-quarter of the entire amount filling the full volume of the filter element formation region 7, rather than the amount filling the full volume. As will be discussed later, each filter element formation region 7 is filled with several ejections of ink rather than a single ejection of ink. For example, the full volume of the filter element formation region 7 is fully filled with four ejections of ink.

If the print head (liquid-drop material discharge mechanism) 22a completes one line of main scan to the mother substrate 12 (YES in step S14), the print head (liquid-drop material discharge mechanism) 22a moves in a reverse direction, returning to the initial position (see FIG. 1(a)) (step S15). The print head (liquid-drop material discharge mechanism) 22a, driven by the sub scan driving means 21, moves by a predetermined sub scanning motion pitch P in the sub scan direction Y (step S16).

The print head (liquid-drop material discharge mechanism) 22a, which has moved to the position illustrated in FIG. 1(b) in the sub scan operation, repeats the main scan operation while ejecting ink in step S13. The print head (liquid-drop material discharge mechanism) 22a again perform the sub scan operation while repeating the main scan motion and the ink ejection (step S13 through step S16). In this way, an ink deposition process for one column of the color filter formation area 11 of the mother substrate 12 is completed.

In this embodiment, several ejections of ink, specifically, four ejections of ink becomes a full amount or a predetermined thickness of ink, or filter material.

When the nozzle row 28 successively moves in the sub scan operation, one position of the nozzle row 28 does not overlap another position of the nozzle row 28 in the sub scan direction Y. The positions taken by the nozzle row 28 become lined in the sub scan direction Y in the sub scan operation. The thickness of the ejected filter material thus becomes uniform.

When ink ejection is completed for one column of color filter formation areas 11 in the mother substrate 12 shown in FIG. 5(a), the sub scan driving means 21 drives the ink jet head (liquid-drop material discharge head) 22 to a start position of a next column of color filter formation areas 11 (step S19). The main scan operation, the sub scan operation, the ink ejection are repeated to form the filter elements in the filter element formation regions 7 (steps S13 through S16).

When the filter elements 3 of one color of R (red), G (green), and B (blue), for example, the filter elements 3 of R are formed in all color filter formation areas 11 in the mother substrate 12 (YES in step S17 and S18), the mother substrate 12 is outwardly discharged by the substrate supply unit 23 or another conveyance apparatus in step S20.

Unless the operator gives a process end command (NO in step S21), the algorithm loops to step S2 to perform ink ejection operation to another mother substrate 12 for R color.

When the operator gives a process end command (YES in step S21), the CPU 69 shifts the print head (liquid-drop material discharge mechanism) 22a shown in FIG. 8 to the capping means 76. The capping means 76 performs a capping operation to the print head (liquid-drop material discharge mechanism) 22a (step S22).

In this way, the patterning for one of the R (red), G (green), and B (blue) colors constituting the color filter, for example, the patterning for the R color ends. The mother substrate 12 is then conveyed to ink-jet means (liquid-drop material discharge means) 16 which employs a second one of the R (red), G (green), and B (blue) colors, for example, the G color for the G color patterning. Furthermore, the mother substrate 12 is conveyed to ink-jet device (liquid-drop material discharge device) 16 which employs a third one of the R (red), G (green), and B (blue) colors, for example, the B color for the B color patterning. In this way, the mother substrate 12 having a plurality of color filters 1 (see FIG. 5(b)) in a desired dot configuration of the R (red), G (green), and B (blue), such as a stripe configuration, results.

When the color filter 1 is used for color display on a liquid-crystal display, electrodes and alignment layers are further laminated on the color filter 1. If the mother substrate 12 is diced into individual color filters 1 in such a case prior to the lamination of the electrodes and alignment layers, the subsequent formation process of the electrodes, etc., becomes extremely complex. The mother substrate 12 is preferably diced subsequent to the completion of required steps such as formation steps of the electrodes and the alignment layers, rather than being diced into the color filters 1 subsequent to the formation of the color filter 1 on the mother substrate 12.

The individual filter elements 3 within the color filter 1 shown in FIG. 5(b) are not formed by only one main scan of the ink-jet head (liquid-drop material discharge head) 22 in the X direction. The individual filter elements 3 are formed to a predetermined thickness when a plurality of nozzles 27 repeatedly ejects by n times, for example, four times, each time with the individual filter elements 3 scanned with nozzles 27 assigned in a different nozzle group. Even if the ejected amount of ink varies from nozzle group to nozzle group, variations in thickness from filter element 3 to filter element 3 are controlled. The light transmissivity through the color filter is made uniform in plan view.

Figure 16:
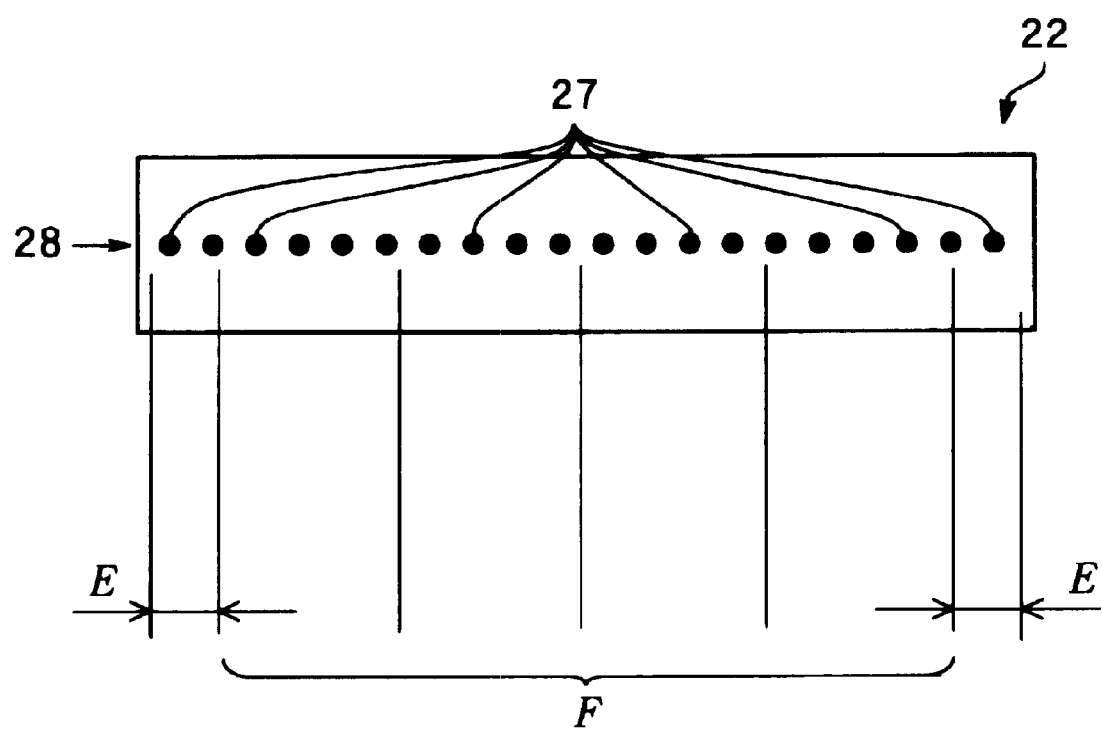
FIG. 16 is a plan view of a still further modification of the ink-jet head (liquid-drop material discharge head)

Referring to FIG. 16, at least one of the plurality of nozzles 27 (10 nozzles 27, for example) in each of both ends of the nozzle row 28 in the ink-jet head (liquid-drop material discharge head) 22 is preferably designed not to eject ink. This arrangement is intended to resolve the previously discussed problem that the distribution of ejected amount of ink becomes non-uniform in the plurality of nozzles 27 forming the nozzle row 28 of the ink-jet head (liquid-drop material discharge head) 22, particularly, with at least one of the plurality of nozzles 27 (10 nozzles 27, for example) in each of both ends of the nozzle row 28 resulting in a large ejected amount of ink. For example, when the number of nozzles is 180, a total of 20 nozzles 27, namely 10 nozzles 27 in each of both ends, is biased to a voltage not to eject ink so that the remaining 160 nozzles 27 eject ink.

In the above discussion, the partitioning walls 6 are fabricated of a light non-transmissive resin. Alternatively, the partitioning walls 6 may be fabricated of a light transmissive material. In this case, a light-blocking metal film or a light-blocking resin material, each serving a black matrix, may be arranged in the location where the filter elements 3 are not present, namely, on or beneath the partitioning walls 6.

The filter elements 3 are R (red), G (green), and B (blue). Alternatively, the filter elements 3 may be C (cyan), M (magenta), and Y (yellow). In this case, the filter materials for C, M, and Y may be used instead of the filter materials for R (red), G (green), and B (blue).

In the above discussion, the partitioning walls 6 are produced through the photolithographic technique. Alternatively, the partitioning walls 6 may be produced using the ink-jet method as the filter elements 3.

Figure 19:
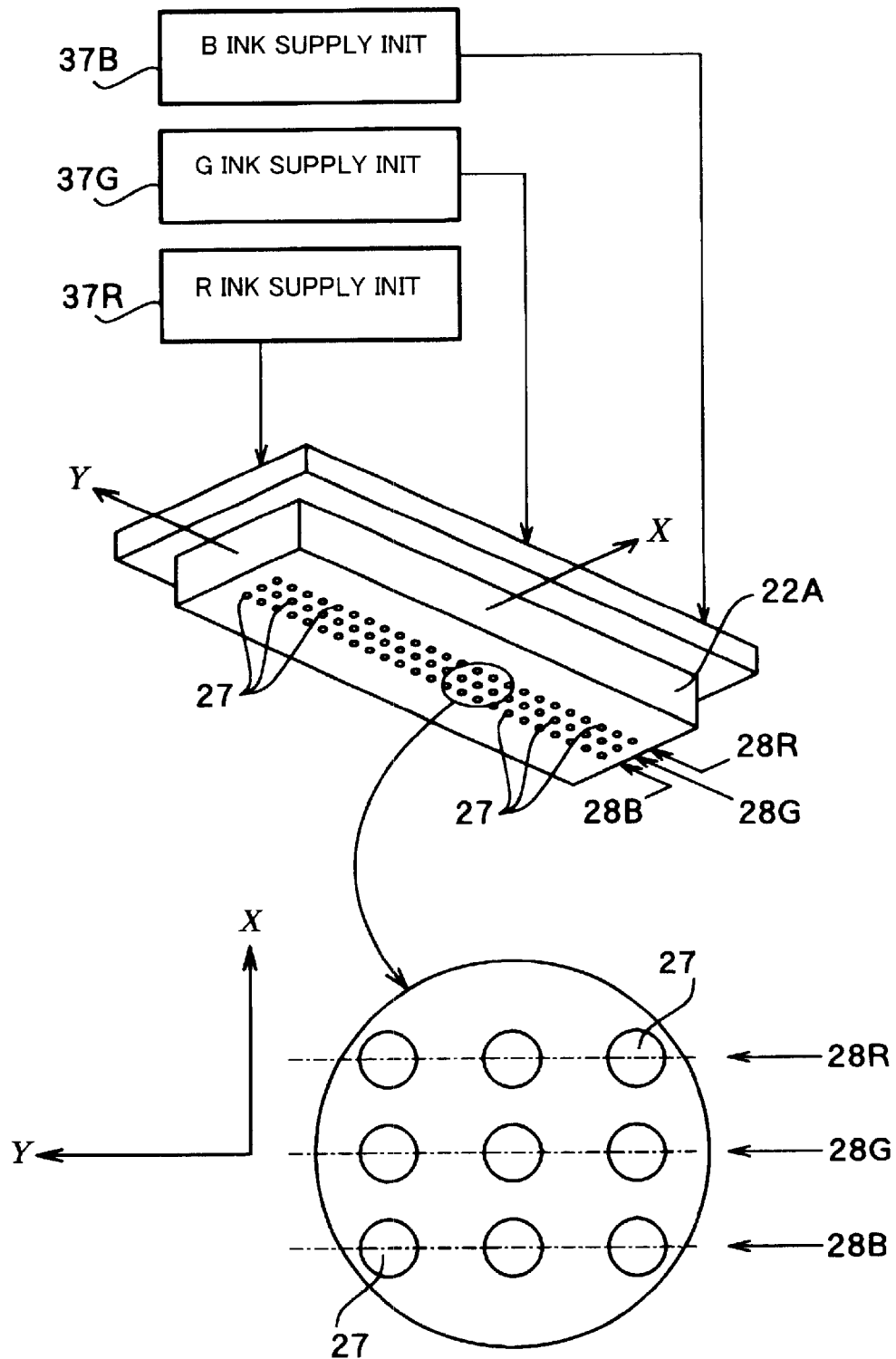
FIG. 19 is a perspective view of a still further modification of the ink-jet head (liquid-drop material discharge head)

FIG. 19 illustrates an ink-jet head (liquid-drop material discharge head) 22A for use in the method and apparatus for manufacturing the color filter in accordance with another embodiment of the present invention. The ink-jet head (liquid-drop material discharge head) 22A is different from the ink-jet head (liquid-drop material discharge head) 22 illustrated in FIG. 10 as below. A single ink-jet head (liquid-drop material discharge head) 22A is formed of three nozzle rows of a nozzle row 28R for ejecting a R color ink, a nozzle row 28G for ejecting a G color ink, and a nozzle row 28B for ejecting a B color ink. The three nozzle rows have their own respective ink ejection systems shown in FIGS. 15(a) and 15(b). The ejection system for the R color nozzle row 28R is connected to an R ink feeder 37R, the ejection system for the G color nozzle row 28G is connected to a G ink feeder 37G, and the ejection system for the B color nozzle row 28B is connected to a B ink feeder 37B.

In the above-referenced method and apparatus for manufacturing the color filter, a plurality of color filter formation areas 11 is formed in the mother substrate 12 as illustrated in FIG. 5(a). Using the ink-jet head (liquid-drop material discharge head) 22 smaller than the color filter formation area 11, the filter elements 3 are formed in the color filter formation area 11. Alternatively, a nozzle row 28 having a length longer than one side of a single color filter formation area 11 but shorter than one side of the mother substrate 12 may be used to form the filter elements 3 in a single mother substrate 12.

In the above discussion, the plurality of color filter formation areas 11 is formed in the mother substrate 12. In this case, a single column of color filter formation areas 11 may be formed in the mother substrate 12. Alternatively, a single color filter formation area 11, having the size substantially equal to that of the mother substrate 12 or significantly smaller than that of the mother substrate 12, may be formed in the mother substrate 12.

In the ink-jet device (liquid-drop material discharge device) 16 shown in FIG. 8 and FIG. 9, the print head (liquid-drop material discharge mechanism) 22a moves in the X direction to scan the mother substrate 12 in the main scan operation while the mother substrate 12 is moved by the sub scan driving means 21 in the Y direction so that the print head (liquid-drop material discharge mechanism) 22a sub scans the mother substrate 12. Conversely, the mother substrate 12 may be moved in the Y direction in the main scan operation while the ink-jet head (liquid-drop material discharge head) 22 may be moved in the X direction in the sub scan operation.

Figure 20:
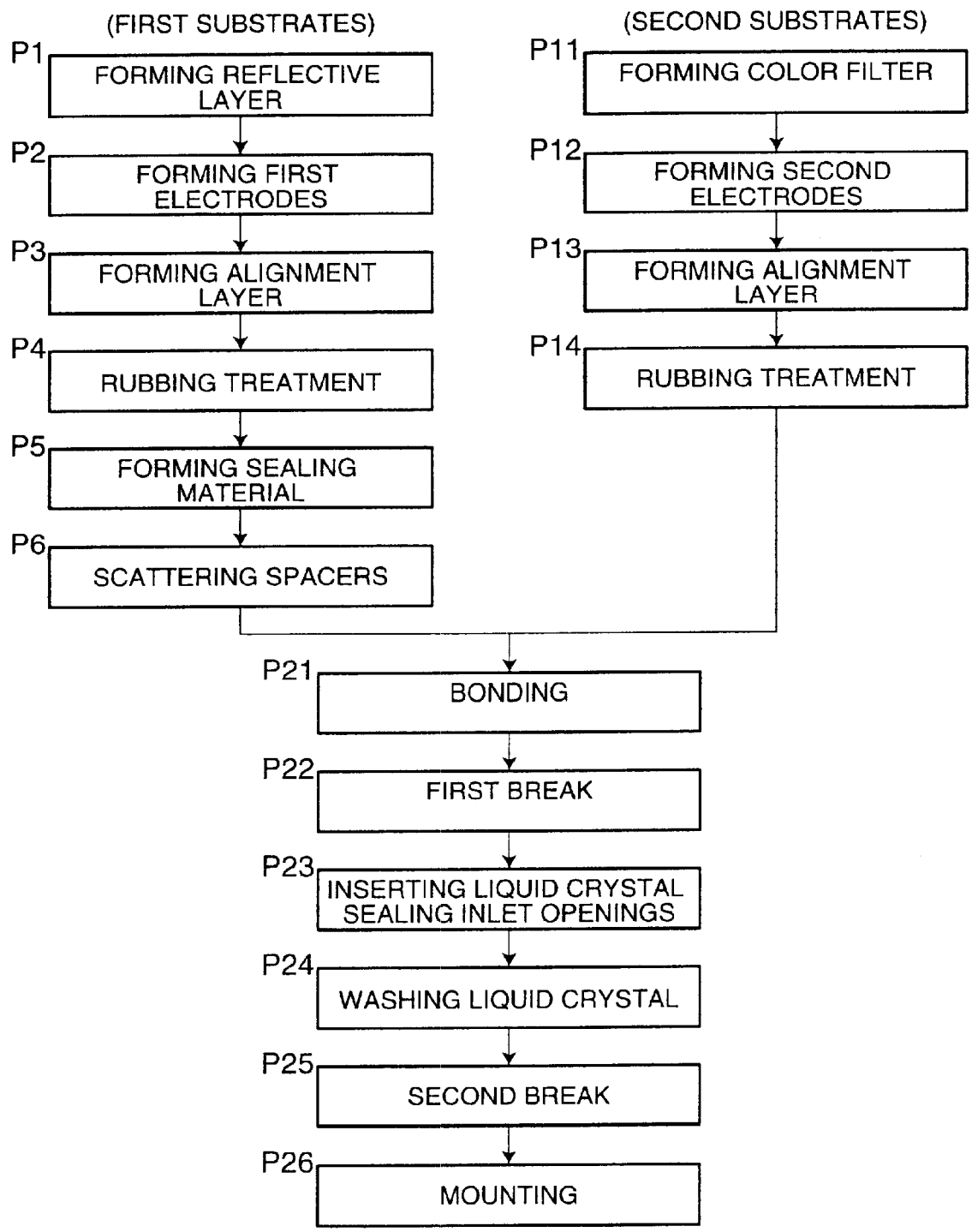
FIG. 20 is a process chart of a method of the present invention for manufacturing a liquid-crystal display in accordance with one embodiment of the present invention.
Figure 21:
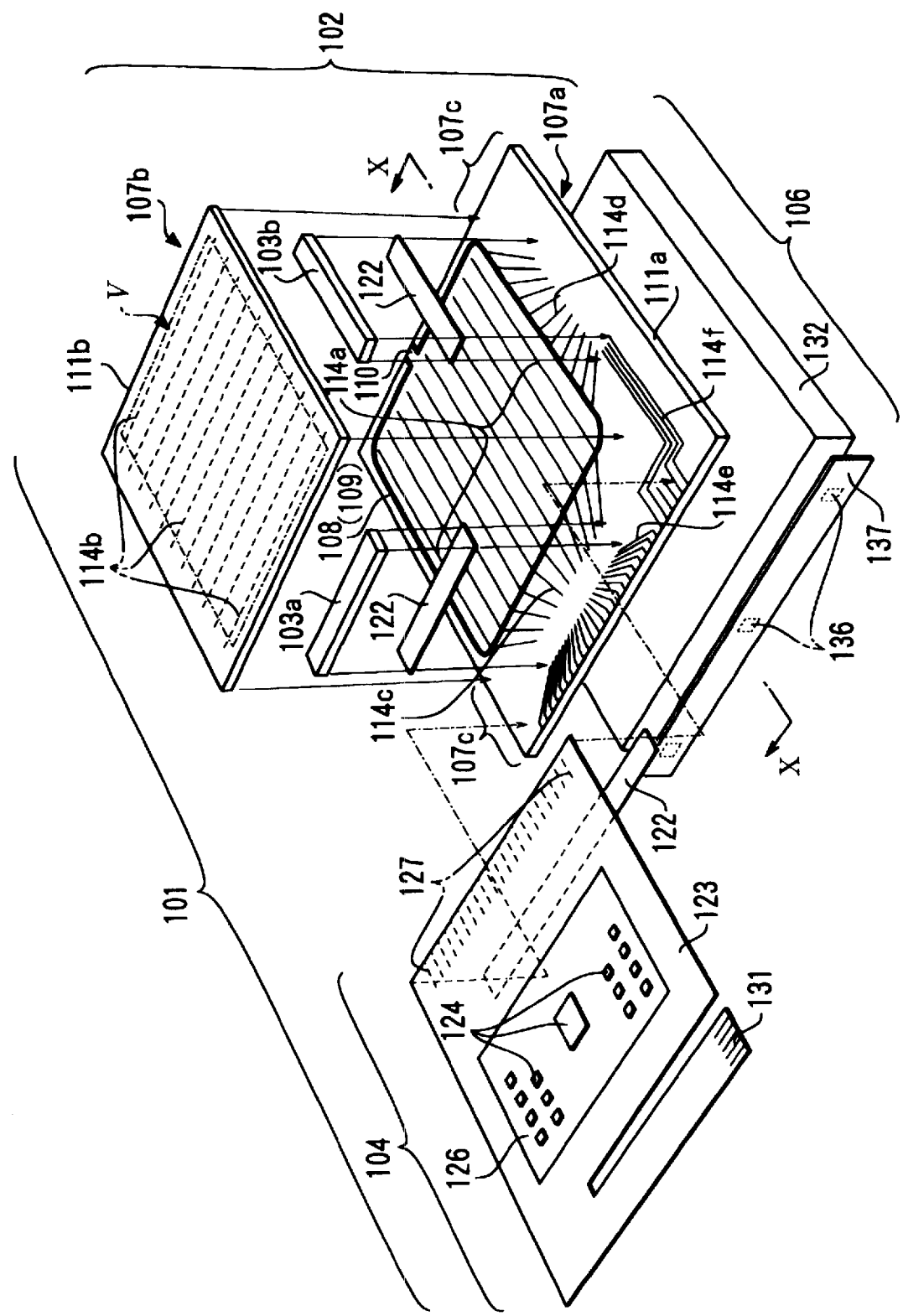
FIG. 21 is an exploded perspective view of the liquid-crystal display manufactured in accordance with the manufacturing method of the present invention of the liquid-crystal display.
Figure 22:
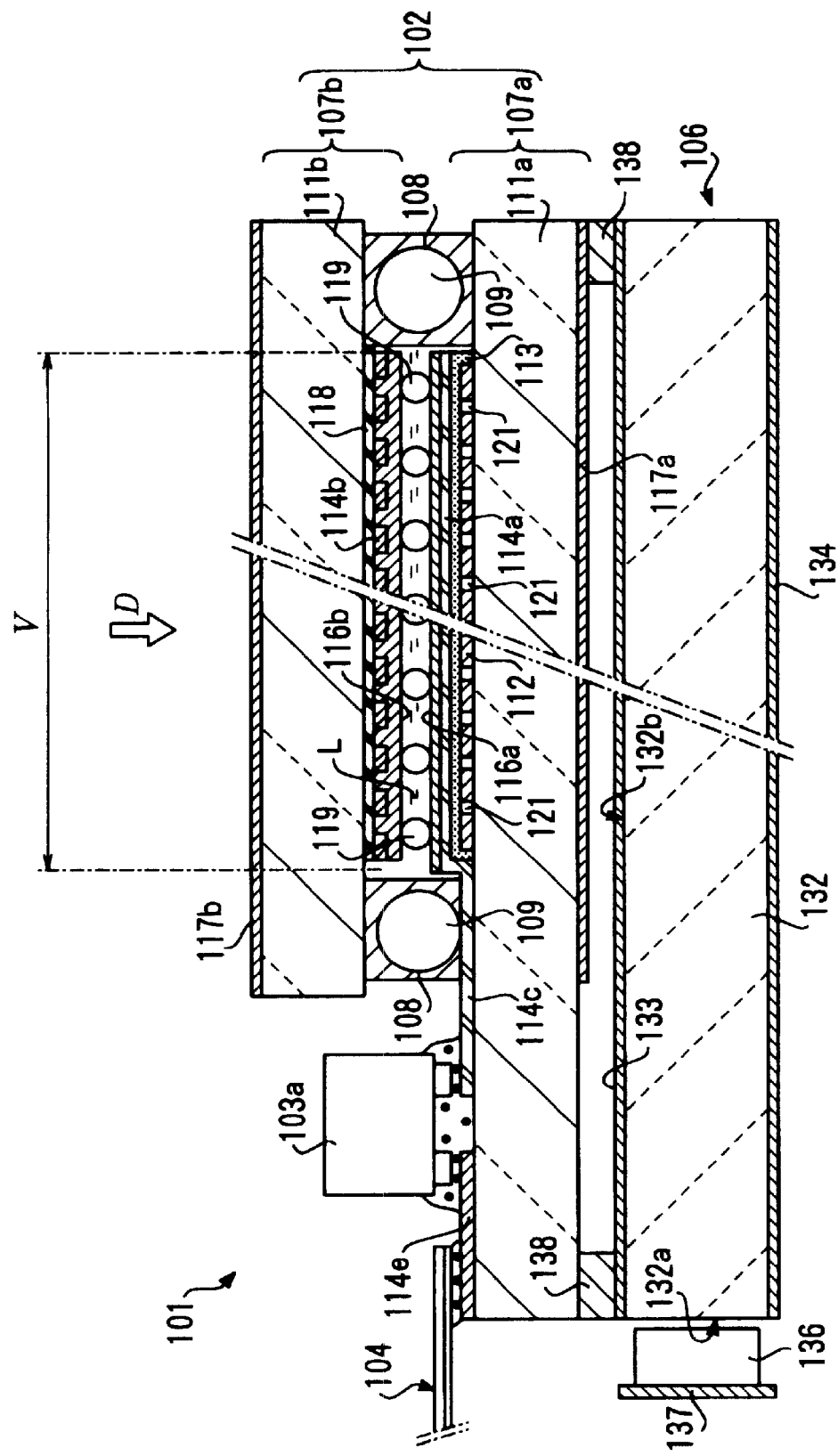
FIG. 22 is a cross-sectional view illustrating the liquid-crystal display taken along line X—X in FIG. 21.

FIG. 20 is a process chart of the method for manufacturing the liquid-crystal display in accordance with one embodiment of the present invention. FIG. 21 illustrates the liquid-crystal display manufactured in accordance with the manufacturing method. FIG. 22 is a cross-sectional view of the liquid-crystal display taken along line X–X in FIG. 21.

The liquid-crystal display to be discussed here is a passive-matrix, transflective liquid-crystal display that presents a full-color display.

Referring to FIG. 21, a liquid-crystal display 101 includes driving ICs 103a and 103b as semiconductor chips mounted on a liquid-crystal panel 102, an FPC (Flexible Printed Circuit) 104 as a wiring connection element connected to the liquid-crystal panel 102, and an illumination unit 106 mounted on the back of the liquid-crystal panel 102 as a back light.

The liquid-crystal panel 102 is produced by bonding a first substrate 107a and a second substrate 107b using a sealing member 108. For example, the sealing member 108 is formed by depositing epoxy resin in a ring configuration on the internal surface of the first substrate 107a or the second substrate 107b using the screen printing technique. Spherical or cylindrical conductors 109 fabricated of an electrically conductive material are dispersed in the sealing member 108 as shown in FIG. 22.

As shown in FIG. 22, the first substrate 107a includes planar base member 111a formed of transparent glass or transparent plastic. A reflective layer 112 is formed on the inner surface of the base member 111a (the top surface of the base member 111a in FIG. 22), an insulator layer 113 is laminated on the reflective layer 112, and first electrodes 114a (see FIG. 21) are formed on the insulator layer 113 in stripes if viewed from an arrow D in FIG. 22. Furthermore, an alignment layer 116a is formed on the first electrode 114a. A polarizer 117a is glued on the external surface of the base member 111a (the bottom surface of the base member 111a in FIG. 22).

Referring to FIG. 21, for clarity, the first electrodes 114a are drawn with the spacing therebetween wider than an actual spacing and the number of first electrodes 114a is smaller than the actual number thereof. In practice, a large number of first electrodes 114a are arranged on the base member 111a.

Referring to FIG. 22, the second substrate 107b includes a base member 111b fabricated of transparent glass or transparent plastic. A color filter 118 is formed on the inner surface of the base member 111b (the underside of the base member 111b in FIG. 22). Second electrodes 114b, arranged on the color filter 118, extend in stripes, if viewed from the arrow D, in a direction perpendicular to the first electrodes 114a (as shown in FIG. 21). An alignment layer 116b is formed on the second electrodes 114b. A polarizer 117b is glued on the external surface of the base member 111b (the top side of the base member 111b in FIG. 22).

Referring to FIG. 21, for clarity, the second electrodes 114b are drawn with the spacing therebetween wider than the actual spacing thereof and the number of the second electrodes 114b is smaller than the actual number thereof. In practice, a large number of first electrodes 114b are arranged on the base member 111b.

Referring to FIG. 22, the gap (the so-called cell gap), enclosed by the first substrate 107a, the second substrate 107b, and the sealing member 108, is filled with a liquid crystal, such as an STN (Super Twisted Nematic) liquid crystal L. A large number of small spherical spacers 119 are dispersed within the region between the first substrate 107a and the second substrate 107b. The presence of these spacers 119 in the cell gap keeps the thickness of the cell gap constant.

The first electrodes 114a and the second electrodes 114b are arranged mutually perpendicular to each other, thereby forming intersections thereof in a dot matrix if viewed from the arrow D in FIG. 22. An intersection at each point of matrix constitutes a display dot. In the color filter 118, R (red), G (green), and B (blue) display dots are arranged in a predetermined pattern such as a stripe configuration, a delta configuration, or a mosaic configuration, if viewed from the arrow D. The single display dot corresponds to each of R (red), G (green), and B (blue) dots, and the three R (red), G (green), and B (blue) display dots correspond to a single pixel.

By selectively turning on a plurality of display dots (namely, pixels) arranged in a dot matrix, characters and numbers are presented on the second substrate 107b of the liquid-crystal panel 102. An area where an image is presented is an effective pixel area. A planar rectangular area indicated by an arrow V in FIG. 21 and FIG. 22 is the effective display area.

Referring to FIG. 22, the reflective layer 112 is fabricated of a light reflective material such as an APC alloy or Al (aluminum). An aperture 121 is opened corresponding to a display dot where one first electrode 114a intersects one second electrode 114b. The apertures 121 are thus formed in a dot matrix, if viewed from the arrow D, in the same manner as the display dot.

The first electrodes 114a and the second electrodes 114b are fabricated of an ITO, which is an electrically conductive, transparent material. The alignment layers 116a and 116b are formed by applying a polyimide based resin to a uniform thickness. When the alignment layers 116a and 116b are subjected to a rubbing process, the initial orientation of liquid crystal molecules are determined on the first substrate 107a and the second substrate 107b.

Referring to FIG. 21, the first substrate 107a is wider in area than the second substrate 107b. When they are bonded using the sealing member 108, the first substrate 107a has a substrate extension portion 107c outwardly projecting out of the formation area of the second substrate 107b. A substrate extension area 107c bears extension lines 114c leading from the first electrodes 114a, extension lines 114d connected to the second electrodes 114b on the second substrate 107b through conductor members 109 (see FIG. 22) present within the sealing member 108, input bumps for the liquid-crystal driving IC 103a (namely, the input terminals) and metal wirings 114f connected to input bumps of the liquid-crystal driving IC 103b.

In this embodiment, the extension lines 114c leading from the first electrodes 114a and the extension lines 114d leading to the second electrodes 114b are fabricated of ITO, which is the same material as that for the electrode, namely, the electrically conductive oxide. The metal wirings 114e and 114f on the input side of the liquid-crystal driving ICs 103a and 103b are fabricated of a low electrical resistance metal, such as the APC alloy. The APC alloy mainly contains Ag, and smaller contents of Pd and Cu. For example, the APC alloy contains 98% Ag, 1% Pd, and 1% Cu.

The liquid-crystal driving IC 103a and the liquid-crystal driving IC 103b are mounted on the surface of the substrate extension area 107c using an ACF (Anisotropic Conductive Film) 122. This embodiment employs a so-called COG (Chip On Glass) liquid-crystal panel, in which a semiconductor chip is directly mounted on the substrate. In the COG structure, electrically conductive particles contained in the ACF 122 electrically connect the input bumps of the liquid-crystal driving IC 103a and the liquid-crystal driving IC 103b to the metal wirings 114e and 114f, and the output bumps of the liquid-crystal driving IC 103a and the liquid-crystal driving IC 103b to the extension lines 114c and 114d.

Referring to FIG. 21, the FPC 104 includes a circuit 126 including a flexible resin film 123 and chip components 124, and metal wiring terminals 127. The circuit 126 is directly mounted on the surface of the resin film 123 using an electrical connection method such as a soldering technique. The metal wiring terminals 127 are fabricated of an APC alloy, Cr, Cu, or other electrically conductive material. The metal wiring terminals 127 of the FPC 104 are respectively connected to the metal wirings 114e and 114f of the first substrate 107a through the ACF 122. The electrically conductive particles contained in the ACF 122 respectively electrically connect the metal wirings 114e and 114f of the substrate to the metal wiring terminals 127 of the FPC.

External connection terminals 131, arranged on the opposed edge of the FPC 104, are connected to an unshown external circuit. Signals from the external circuit drive the liquid-crystal driving ICs 103a and 103b so that one of the first electrode 114a and the second electrode 114b is supplied with a scanning signal, and so that the other of the first electrode 114a and the second electrode 114b is supplied with a data signal. A dot matrix of display dots arranged in the effective display area are thus voltage controlled on a pixel by pixel basis. As a result, the orientation of the liquid crystal L is controlled on a pixel by pixel basis.

Referring to FIG. 21, the illumination unit 106, functioning as a back light, includes a light guide body 132 of acrylic resin, a diffusion sheet 133 arranged on a light exit surface 132b of the light guide body 132, a reflective sheet 134 arranged on the opposite surface of the light guide body 132 opposed to the light exit surface 132b, and an LED (Light Emitting Diode) 136 as a light source as shown in FIG. 22.

The LED 136 is supported by an LED board 137, and the LED board 137 together with the light guide body 132 is fixed on a base (not shown). With the LED board 137 mounted in a predetermined position on the base, the LED 136 is positioned to face a light entrance surface 132a which is the end face of the light guide body 132. Designated reference numeral 138 is a buffer material for lessening a shock that can act on the liquid-crystal panel 102.

When the LED 136 lights, light is guided through the light entrance surface 132a into the light guide body 132, and travels while being reflected from the reflective sheet 134 and the walls of the light guide body 321, and is then output through the light exit surface 132b and then the diffusion sheet 133 as flat light.

Since the liquid-crystal device 101 is constructed as described above, external light is captured into the liquid-crystal panel 102 from the second substrate 107b as shown in FIG. 22 when the external light, such as sunlight or ambient light, is sufficiently strong. The light is then transmitted through the liquid crystal L, is then reflected from the reflective layer 112, and is fed to the liquid crystal L. The first electrodes 114a and the second electrodes 114b sandwiching the liquid crystal L control the liquid crystal L in orientation according to R (red), G (green), and B (blue) display dots. Light fed to the liquid crystal L is modulated on a display dot by display dot basis. A combination of light transmitted through the polarizer 117b and light not transmitted through the polarizer 117b thus presents an image such as characters and numbers on the liquid-crystal panel 102. The reflective type display is thus presented.

When no sufficiently strong light is obtained, the LED 136 operates, emitting flat light from the light exit surface 132b of the light guide body 132. The light is fed to the liquid crystal L through the aperture 121 formed in the reflective layer 112. In the same manner as in the reflective type display, the light supplied is modulated through the liquid crystal L which is controlled in orientation on a display dot by display dot basis, and an image is thus displayed. A transmissive type display is thus presented.

The liquid-crystal display 101 having the above-referenced construction is manufactured using the method and apparatus for manufacturing the liquid-crystal display in accordance with the present invention, specifically, using the method described in FIG. 20. In this manufacturing method, a series of step P1 through step P6 produces the first substrate 107a, and a series of step P11 through step P14 produces the second substrate 107b. The first substrate manufacturing process and the second substrate manufacturing process are typically independently performed.

In the first substrate manufacturing process, a plurality of reflective layers 112 of the liquid-crystal panel 102 is formed on the mother substrate material having a large area and fabricated of transparent glass, transparent plastic, etc., using the photolithographic technique. The insulator layer 113 is then formed on the reflective layer 112 (step P1) using a known technique. The first electrodes 114a, lines 114c, 114d, 114e, and 114f are then formed through the photolithographic process (step P2).

The alignment layer 116a is applied on the first electrodes 114a through a printing process (step P3). A rubbing process is then performed on the alignment layer 116a to determine the initial alignment of the liquid crystal (step P4). The sealing member 108 is deposited in a ring configuration through the screen print technique, for example (step P5). The spherical spacers 119 are then dispersed on the sealing member 108 (step P6). The large-area first mother substrate having a plurality of panel patterns of the first substrate 107a of the liquid-crystal panel 102 is thus obtained.

The second substrate manufacturing process (step P11 through step P14 in FIG. 20), different from the first substrate manufacturing process, is performed. A large-area mother substrate, fabricated of transparent glass, transparent plastic, etc., is prepared. A plurality of color filters 118 of the liquid-crystal panels 102 is formed on the surface of the mother substrate (step P11). The color filter is produced using the manufacturing method illustrated in FIG. 6. In accordance with the manufacturing method, the filter elements for R (red), G (green), and B (blue) are produced using the ink-jet means (liquid-drop material discharge means) 16 illustrated in FIG. 8. The method for manufacturing the color filter and the control method of the ink-jet means (liquid-drop material discharge means) remain the same as those already discussed.

When the color filter 1, namely, the color filter 118 is formed on the mother substrate 12 as illustrated in FIG. 6(d), namely, on the mother substrate material, the second electrodes 114b are then formed using the photolithographic technique (step P12). Through an application process or printing process, the alignment layer 116b is then formed (step P13). The rubbing process is performed on the alignment layer 116b to determine the initial alignment of the liquid crystal (step P14). The large-area second mother substrate having a plurality of panel patterns of the second substrates 107b of the liquid-crystal panels 102 is thus obtained.

After the production of the large-area first and second mother substrates, the mother substrates are aligned to each other and bonded together with the sealing member 108 sandwiched therebetween (step P21). A blank panel structure having a plurality of blank liquid-crystal panels with no liquid crystal encapsulated results.

The completed blank panel structure is scribed along predetermined lines, and is then broken or diced along the scribe lines (step P22). In this way, the square blank panels with liquid-crystal injection ports 110 (see FIG. 21) of the sealing members 108 outwardly exposed are produced.

The liquid crystal L is introduced into each liquid-crystal panel through the exposed liquid-crystal injection port 110, and the liquid-crystal injection port 110 is then closed with resin or the like (step P23). In a typical liquid-crystal injection process, a liquid crystal is stored in a container, the container and the rectangular blank panel are placed into a chamber, the chamber is then evacuated, the blank panel is then immersed into the liquid crystal, and then the chamber is opened to the atmospheric pressure. Since the blank panel is now in vacuum, the liquid crystal pressurized by the atmospheric pressure is injected into the panel through the liquid-crystal injection port 110. Since the liquid crystal clings to the panel, the rectangular panel is cleaned in step P24 subsequent to the liquid-crystal injection process.

Subsequent to the liquid-crystal injection and cleaning, the rectangular mother panel is scribed, and the rectangular panel is then diced along the scribe lines into individual liquid-crystal panels (step P25). Referring to FIG. 21, the driving ICs 103a and 102b are mounted on, the illumination unit 106 is attached to, and then the FPC 104 is connected to the individual liquid-crystal panels 102 thus produced. A desired liquid-crystal display 101 results (step P26).

In the method and apparatus for manufacturing the liquid-crystal display, the features of the manufacturing method is taken advantage of in the manufacturing phase of the color filter in particular. The light transmissivity of the color filter is thus efficiently made uniform in plan view. The liquid-crystal display 101 shown in FIG. 22 presents a sharp color display free from non-uniformity in color.

In the method and apparatus of the present invention for manufacturing the liquid-crystal display, the ink-jet head (liquid-drop material discharge head) 22 in the ink-jet device (liquid-drop material discharge device) 16 illustrated in FIG. 8 ejects ink to form the filter elements 3. The present invention thus eliminates the need for complex steps like the photolithographic process, and does not waste materials.

The method of the present invention for manufacturing the electroluminescence substrate remains substantially identical to the above-referenced method for manufacturing the color filter except that a functional layer forming material is used instead of the filter material. One embodiment of the method for manufacturing the electroluminescence substrate is discussed below. The functional layer here includes a hole injection and transfer layer or a light emission layer. The functional layer forming material here includes a hole injection and transfer layer forming material or a light emission layer forming material.

Referring to FIG. 1(a), a print head (liquid-drop material discharge mechanism) 22a is formed by arranging at least one ink-jet head (liquid-drop material discharge head) 22 with a predetermined spacing therebetween, each head 22 including a plurality of nozzles 27 with a constant layout pitch of (D). The print head (liquid-drop material discharge mechanism) 22a scans a substrate 2 for main scan in a head scan direction at a fixed direction (namely, an X direction which is a vertical direction in FIG. 1(a)) while scanning, by a predetermined motion pitch (P), the substrate 2 for sub scan in a head line-feed direction (namely, a Y direction which is a horizontal direction in FIG. 1(a)) which is perpendicular to the head scan direction X.

During the main scan operation and the sub scan operation, a plurality of nozzles 27 arranged in at least one ink-jet head (liquid-drop material discharge head) 22 selectively ejects the functional layer forming material to a functional layer formation regions (namely, display dots). As required, the ink-jet head (liquid-drop material discharge head) 22 repeats the main scan and the sub scan, thereby depositing the functional layer forming material on the functional layer formation regions of the substrate 2 to a predetermined shape and to a predetermined thickness. In this way, the functional layer having the predetermined shape and the predetermined thickness is formed in each display dot in the substrate 2.

In the method of this embodiment for manufacturing the electroluminescence substrate, let "D" represent the constant layout pitch of the nozzles 27 and let "W" represent the spacing between two closest nozzles 27 at the closest ends of the two adjacent ink-jet head (liquid-drop material discharge head) 22, and the following equation holds:

$$W=mD \text{ (}m \text{ is an integer of 2 or larger).}$$

In other words, the spacing W between two mutually closest nozzles 27 at the closest ends of the two adjacent ink-jet heads (liquid-drop material discharge heads) 22 equals an integer multiple of the layout pitch D of the nozzles 27.

Similarly, referring to FIG. 1(b), let "P" represent a sub scanning motion pitch of the print head (liquid-drop material discharge mechanism) 22a in the head line-feed direction, and let "D" represent a constant layout pitch of the nozzles 27, and the following equation holds:

$$P=nD \text{ (}n \text{ is an integer of 1 or larger).}$$

In other words, the sub scanning motion pitch P of the ink-jet head (liquid-drop material discharge head) 22 equals an integer multiple of the layout pitch D of the nozzles 27.

When the above relationships hold among the nozzle spacing W between the adjacent ink-jet heads (the liquid-drop material discharge heads), the sub scanning motion pitch P, and the layout pitch D of the nozzles, all nozzles 27 are precisely aligned with the functional layer formation regions, and then pass right above the functional layer formation regions during the main scan operation and the sub scan operation. For this reason, printing efficiency is heightened, and ink is ejected at an appropriate position. The functional layer, namely, the pixel having a uniform surface shape and a uniform thickness is formed on the substrate 2.

In this embodiment, at least one and each of ink-jet head (liquid-drop material discharge head) 22 is arranged at an inclination angle of $\theta$ with respect to the head line-feed direction Y. The angle $\theta$ is greater than 0° but smaller than 180°.

At least one nozzle 27 located at each of both ends of at least one ink-jet head (liquid-drop material discharge head) 22 is designed not to eject the functional layer forming material to the functional layer formation region on the substrate 2.

The functional layer forming material may include materials of three emission colors of R (red), G (green), and B (blue). At least one ink-jet head (liquid-drop material discharge head) 22 may have the structure shown in FIG. 15.

The apparatus of the present invention for manufacturing the electroluminescence substrate is substantially identical in construction to the apparatus for manufacturing the color filter device. Specifically, the apparatus of the present invention for manufacturing the electroluminescence substrate produces an electroluminescence substrate with the functional layer having a predetermined shape and a predetermined thickness. One embodiment of the apparatus for manufacturing the electroluminescence substrate is discussed below. The functional layer here includes a hole injection and transfer layer or a light emission layer. The functional layer forming material here includes a hole injection and transfer layer forming material or a light emission layer forming material.

Referring to FIG. 1, the apparatus of this embodiment for manufacturing the electroluminescence substrate includes a print head (a liquid-drop material discharge mechanism) 22a including at least one ink-jet head (a liquid-drop material discharge head) 22 arranged with a predetermined spacing, each head 22 having a plurality of nozzles 27 arranged with a predetermined layout pitch (D). The plurality of nozzles 27 selectively ejects the functional layer forming material to the functional layer formation regions on the substrate 2, forming the functional layer on the substrate 2.

Unshown functional layer forming material feeder device is connected to the plurality of nozzles 27 in the print head (liquid-drop material discharge mechanism) 22a. The functional layer forming material feeder device supplies the nozzles 27 with the functional layer forming material. Unshown main scan driving means is connected to the print head (liquid-drop material discharge mechanism) 22a. When the main scan driving means works, the print head (liquid-drop material discharge mechanism) 22a scans a substrate 2 for main scan in a head scan direction at a fixed direction (namely, a vertical direction X in FIG. 1(a)).

Unshown sub scan driving device is connected to the print head (liquid-drop material discharge mechanism) 22a. When the sub scan driving device works, the print head (liquid-drop material discharge mechanism) 22a scans the substrate 2 for sub scan in a head line-feed direction (namely, a horizontal direction Y in FIG. 1(a)) which is perpendicular to the head scan direction X by a predetermined motion pitch (P). Furthermore, nozzle discharge control device is connected to the nozzles 27. When in operation, the nozzle discharge control device controls the discharge amount and the discharge time of the functional layer forming material.

The operation of the main scan driving means is controlled by main scan control means including a CPU. The operation of the sub scan driving means is controlled by sub scan control device including a CPU.

The print head (liquid-drop material discharge mechanism) 22a moves in the head scan direction (namely, a vertical direction X in FIG. 1(a)) which is a fixed direction, thereby main-scanning the substrate 2. At the same time, the print head (liquid-drop material discharge mechanism) 22a moves in the head line-feed direction Y in steps of a predetermined motion pitch (P), thereby sub-scanning the substrate 2.

During the main scan operation and the sub scan operation, a plurality of nozzles 27 arranged in at least one ink-jet head (liquid-drop material discharge head) 22 selectively ejects the functional layer forming material to a functional layer formation regions on the substrate 2. As required, the ink-jet head (liquid-drop material discharge head) 22 repeats the main scan and the sub scan, thereby depositing the functional layer forming material on the functional layer formation regions of the substrate 2 to a predetermined shape and to a predetermined thickness. In this way, the functional layer having the predetermined shape and the predetermined thickness is formed on the substrate 2.

In the apparatus of this embodiment for manufacturing the electroluminescence substrate, let "D" represent the constant layout pitch of the nozzles 27 and let "W" represent the spacing between two closest nozzles 27 at the closest ends of the two adjacent ink-jet head (liquid-drop material discharge head) 22, and the following equation holds:

$$W=mD \text{ (}m \text{ is an integer of 2 or larger).}$$

In other words, the spacing W between two mutually closest nozzles 27 at the closest ends of the two adjacent ink-jet heads (liquid-drop material discharge heads) 22 equals an integer multiple of the layout pitch D of the nozzles 27.

Similarly, referring to FIG. 1(b), let "P" represent a sub scanning motion pitch of the print head (liquid-drop material discharge mechanism) 22a in the head line-feed direction, and let "D" represent a constant layout pitch of the nozzles 27, and the following equation holds:

$P=nD$ ($n$ is an integer of 1 or larger).

In other words, the sub scanning motion pitch P of the ink-jet head (liquid-drop material discharge head) 22 equals an integer multiple of the layout pitch D of the nozzles 27.

When the above relationships hold among the nozzle spacing W between the adjacent ink-jet heads (the liquid-drop material discharge heads), the sub scanning motion pitch P, and the layout pitch D of the nozzles, all nozzles 27 are precisely aligned with the functional layer formation regions, and then pass right above the functional layer formation regions during the main scan operation and the sub scan operation. For this reason, printing efficiency is heightened, and ink is ejected at an appropriate position. The functional layer, namely, the pixel having a uniform surface shape and a uniform thickness is formed on the substrate 2.

In this embodiment, at least one and each of ink-jet head (liquid-drop material discharge head) 22 is arranged at an inclination angle of θ with respect to the head line-feed direction Y as shown in FIG. 2. The angle θ is greater than 0° but smaller than 180°. (Modifications of the Method and Apparatus for Manufacturing the Electroluminescence Substrate)

In the above-referenced method and apparatus for manufacturing the electroluminescence device, a plurality of panels 11 is formed in the mother substrate 12. Using the ink-jet head (liquid-drop material discharge head) 22 smaller than the panel 11, the functional layer is formed in the panel 11. Alternatively, a nozzle row 28 having a length longer than one side of a single panel 11 but shorter than one side of the mother substrate 12 may be used to form the functional layer in a single mother substrate 12.

In the above discussion, the plurality of panels 11 is formed in the mother substrate 12. In this case, a single column of panels 11 may be formed in the mother substrate 12. Alternatively, a single panel 11, having the size substantially equal to that of the mother substrate 12 or significantly smaller than that of the mother substrate 12, may be formed in the mother substrate 12.

In the ink-jet device (liquid-drop material discharge device) 16 shown in FIG. 8 and FIG. 9, the print head (liquid-drop material discharge mechanism) 22a moves in the X direction in the main scan operation while the mother substrate 12 is moved by the sub scan driving means 21 in the Y direction so that the print head (liquid-drop material discharge mechanism) 22a sub scans the mother substrate 12. Conversely, the mother substrate 12 may be moved in the Y direction in the main scan operation while the ink-jet head (liquid-drop material discharge head) 22 may be moved in the X direction in the sub scan operation.

The method and apparatus for manufacturing the electroluminescence substrate in accordance with the present invention are substantially identical in construction to the method and apparatus for constructing the liquid-crystal display, respectively. Specifically, the method for manufacturing the electroluminescence device in accordance with one embodiment of the present invention produces the electroluminescence substrate. The produced electroluminescence substrate is diced into a predetermined number of panels.

A protective layer and a common electrode are formed on the substrate (namely, a common electrode substrate) used as the electroluminescence substrate of the panel. Display-dot electrodes, including a pair of electrodes, and facing the common electrode, are formed on a substrate opposed to and paired with the common electrode substrate (namely, a display-dot electrode substrate).

The apparatus for manufacturing the electroluminescence device in accordance with the present invention produces an electroluminescence device including one substrate, for example, a common electrode substrate, and a counter substrate, opposed to the first substrate, such as a display-dot electrode substrate. The functional layer having a predetermined shape and a predetermined thickness is formed on the common electrode substrate, thereby fabricating the electroluminescence substrate. Furthermore, a protective layer and a common electrode are formed on the common electrode substrate. Display-dot electrodes, including a pair of electrodes, and facing the common electrode, are formed on a substrate opposed to and paired with the common electrode substrate.

Figure 23:
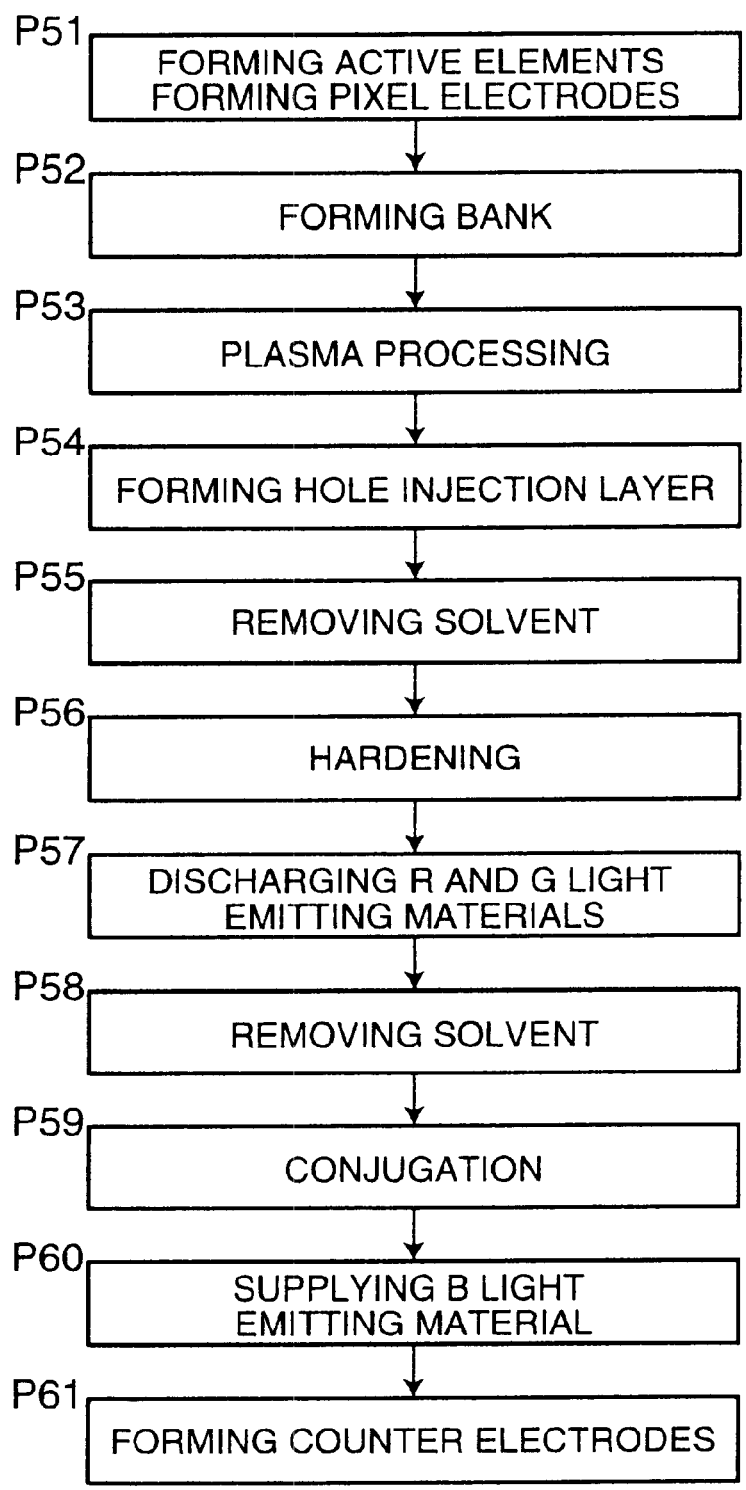
FIG. 23 is a process chart of a method for manufacturing an electroluminescence device in accordance with one embodiment of the present invention.
Figure 24:
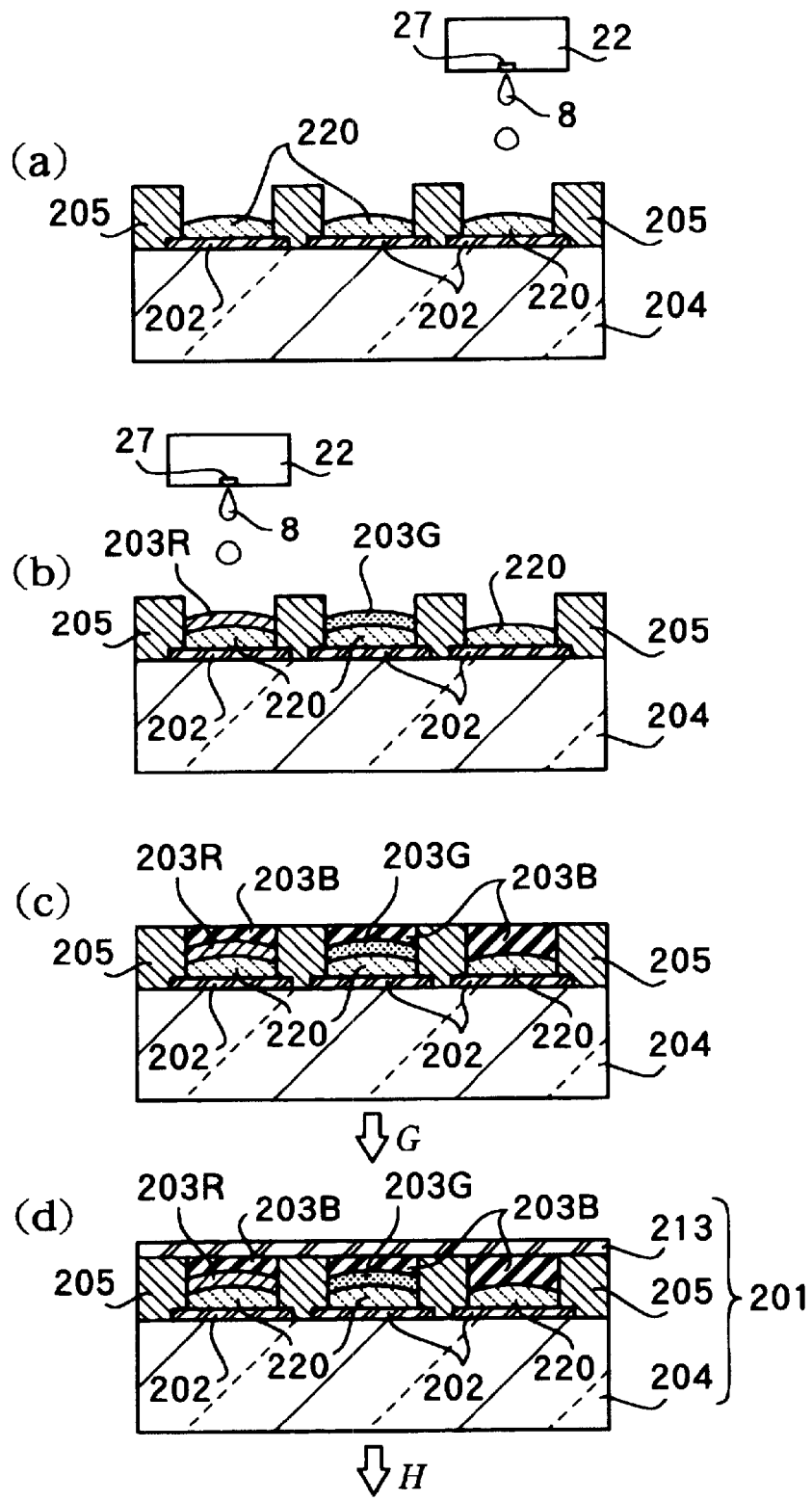
FIGS. 24(*a*) through 24(*d*) are cross-sectional views of the electroluminescence device manufactured in accordance with the process chart illustrated in FIG. 23.

FIG. 23 is a process chart of the method for manufacturing the electroluminescence device in accordance with one embodiment of the present invention. FIG. 24 illustrates cross-sectional structures of the electroluminescence device corresponding to the process chart illustrated in FIG. 23. Referring to FIG. 24(d), in the manufacturing of the electroluminescence device 201, pixel electrodes 202 are formed on a transparent substrate 204, banks 205 are arranged between the pixel electrodes 202 in a grid configuration, if viewed from an arrow G, an R color light emission layer (functional layer) 203R, a G color light emission layer (functional layer) 203G, and a B color light emission layer (functional layer) 203B are formed in the respective recesses of the grid in a predetermined configuration such as a stripe configuration if viewed from the arrow G, and a counter electrode 213 is then formed on the light emission layers.

When the pixel electrode 202 is formed of a two-terminal active element, such as a TFD (Thin-Film Diode), the counter electrode 213 is shaped into stripes if viewed from the arrow G. When the pixel electrode 202 is formed of a three-terminal active element such as a TFT (Thin-Film Transistor), the counter electrode 213 is shaped as a single and planar electrode.

A region sandwiched between each pixel electrode 202 and the counter electrode 213 becomes a single display dot. Three display dots of the R (red), G (green), and B (blue) colors as a unit form a single pixel. By controlling a current flowing into the display dot, any desired one of the plurality of display dots is selected to light. In this way, a desired full-colored image is presented in the direction represented by an arrow H.

The electroluminescence device 201 is manufactured in accordance with the manufacturing method illustrated in FIG. 23. Referring to step P51 and FIG. 24(a), active elements such as TFD elements or TFT elements are formed on the surface of the transparent substrate 204, and then the pixel electrodes 202 are formed. Used as the formation method is a photolithographic method, a vacuum deposition method, a sputtering method, or a pyrosol method. Available as a pixel electrode material is ITO (Indium Tin Oxide), tin oxide, or a composite oxide from indium oxide and zinc oxide, for example.

Referring to step S52 and FIG. 24(a), banks 205, namely, partitioning walls are formed using a known patterning method, for example, the photolithographic method. The bank 205 fills the gap between the pixel electrodes 202. This arrangement improves contrast, and prevents color mixing of the functional layer forming materials, and light leaking between the pixels. The material of the bank 205 is not limited to any particular one as long as the material has sufficient resistance to a solvent of the functional layer forming material. A preferred material for the bank 205 may be the one which is resinified through the fluorocarbon plasma process. For example, organic materials, such as acrylic resin, epoxy resin, photosensitive polyimide, and the like are preferable.

Prior to the application of the hole injection and transfer layer forming material (the functional layer forming material), the transparent substrate 204 is subjected to a continuous plasm process of oxygen gas and fluorocarbon gas plasma (step P53). The surface of polyimide becomes water repellant, and the surface of ITO becomes wettable. In this way, the wettability of the substrate is controlled to precisely pattern the substrate through the ink-jet drops. A device for generating plasma may be either a device for generating plasma in vacuum or a device for generating plasma in air.

Referring to step P54 and FIG. 24(*a*), the ink-jet head (liquid-drop material discharge head) 22 in the ink-jet device (liquid-drop material discharge device) 16 illustrated in FIG. 8 ejects the hole injection and transfer layer forming material (the functional layer forming material), thereby applying the functional layer forming material in a pattern in the substrate 2. Specifically, the control method of the ink-jet head (liquid-drop material discharge head) is the one that has already discussed. After the application of the material, the solvent is removed in vacuum (1 torr, for example), at room temperature, and for 20 minutes (step P55). A hole injection and transfer layer (functional layer) 220 not dissolved by the light emission layer forming material (the functional layer forming material) is formed by subjecting the substrate 2 to a heat treatment of 20° C. (on a hot plate, for example) in the atmosphere for 10 minutes (step P56). The thickness of the layer is 40 mn or so.

Referring to step S57 and FIG. 24(*b*), the R light emission layer forming material (the functional layer forming material) and the G light emission layer forming material (the functional layer forming material) are applied through the hole injection and transfer layer 220 in each filter element region through an ink-jet method. Here again, the ink-jet head (liquid-drop material discharge head) 22 in the ink-jet device (liquid-drop material discharge device) 16 illustrated in FIG. 8 ejects each light emission layer forming material (function layer forming material). The control method of the ink-jet head (liquid-drop material discharge head) is the one already discussed. Using the ink-jet method, fine patterning is easily performed for a short period of time. The film thickness of the functional layer is controlled by changing the concentration of solid component of the ink and the discharge amount of the ink.

After the application of the light emission layer forming materials (functional layer forming materials), the solvent is removed in vacuum (1 torr, for example), at room temperature, and for 20 minutes (step P58). The light emission layer forming materials are then subjected to heat treatment at a temperature of 150° C. and for 4 hours under a nitrogen environment for conjugation, thereby becoming the R color light emission layer (functional layer) 203R and the G color light emission layer (functional layer) 203G (step P59). The thickness of the layers is 50 nm or so. The light emission layers conjugated in the heat treatment remain undissolved by solvents.

Prior to the formation of the light emission layers, the hole injection and transfer layer (functional layer) 220 is subjected to the continuous plasma process of oxygen gas and fluorocarbon gas plasma. In this way, a fluorine compound is formed on the hole injection and transfer layer (functional layer) 220, raising ionization potential and increasing hole injection efficiency. An organic electroluminescence device having a high light emission efficiency results.

Referring to step P60 and FIG. 24(*c*), the B color light emission layer 203B is deposited on the display dots of the R color light emission layer 203R, the G color light emission layer 203G, and the hole injection and transfer layer 220. This arrangement not only allows light of the three primary colors of R (red), G (green), and B (blue) to emit, but also fills and planarizes steps between the R color light emission layer 203R, the G color light emission layer 203G and the bank 205. Short circuiting between the upper and lower electrodes is thus reliably controlled. By adjusting the thickness of the B color light emission layer 203B, the B color light emission layer 203B functions as an electron injection and transfer layer in the laminate structure thereof with the R color light emission layer 203R and the G color light emission layer 203G, and does not emit B color light.

To form the B color light emission layer 203B, a spin coating technique typical of wet method may be used. Alternatively, the ink-jet method may be used like the formation method of the R color light emission layer 203R and the G color light emission layer 203G. Referring to step P61 and FIG. 24(*d*), the counter electrode 213 is formed. Thus, a desired electroluminescence device 201 results. When the counter electrode 213 is a surface electrode, the material for the counter electrode 213 may be Mg, Ag, Al, Li, or the like, and a film forming method such as deposition or sputtering may be used. When the counter electrode 213 is a stripe electrode, a film-formed electrode layer may be subjected to a patterning technique such as the photolithographic process.

In accordance with the above-referenced method and apparatus for manufacturing the electroluminescence device, the control method of the ink-jet head (liquid-drop material discharge head) is the one that has already been discussed. Even if the ejected amount of functional layer forming material varies from nozzle to nozzle in the nozzles 27, variations in thickness from display dot to display dot in the plurality of dots are controlled. The light emission distribution characteristics of the light emission surface of the electroluminescence device are made uniform in plan view. In this way, the electroluminescence device 201 shown in FIG. 24(*d*) presents a sharp color display free from non-uniformity in color.

In the method and apparatus of the present invention for manufacturing the electroluminescence device, the ink-jet head (liquid-drop material discharge head) 22 in the ink-jet device (liquid-drop material discharge device) 16 illustrated in FIG. 8 ejects the functional layer forming material to form the color display dots of R (red), G (green), and B (blue). The present invention thus eliminates the need for complex steps like the photolithographic process, and does not waste materials.

A film forming apparatus of the present invention is constructed using the ink-jet device (liquid-drop material discharge device) 16 illustrated in FIG. 8. The ink-jet head (liquid-drop material discharge head) 22 used in the ink-jet device (liquid-drop material discharge device) 16 may be the ink-jet head (liquid-drop material discharge head) illustrated in FIG. 1, FIG. 2, FIG. 3, FIG. 4, FIG. 10, FIG. 11, FIG. 12, FIG. 13, FIG. 14, FIG. 15, FIG. 16 or FIG. 19.

The ink ejected from the nozzles 27 in the ink-jet head (liquid-drop material discharge head) 22 is a film forming material in this embodiment. The pattern of the film is freely selected by appropriately controlling the nozzles 27 that emits the film forming material when the ink-jet head (liquid-drop material discharge head) 22 main-scans and sub-scans the substrate.

Figure 17:
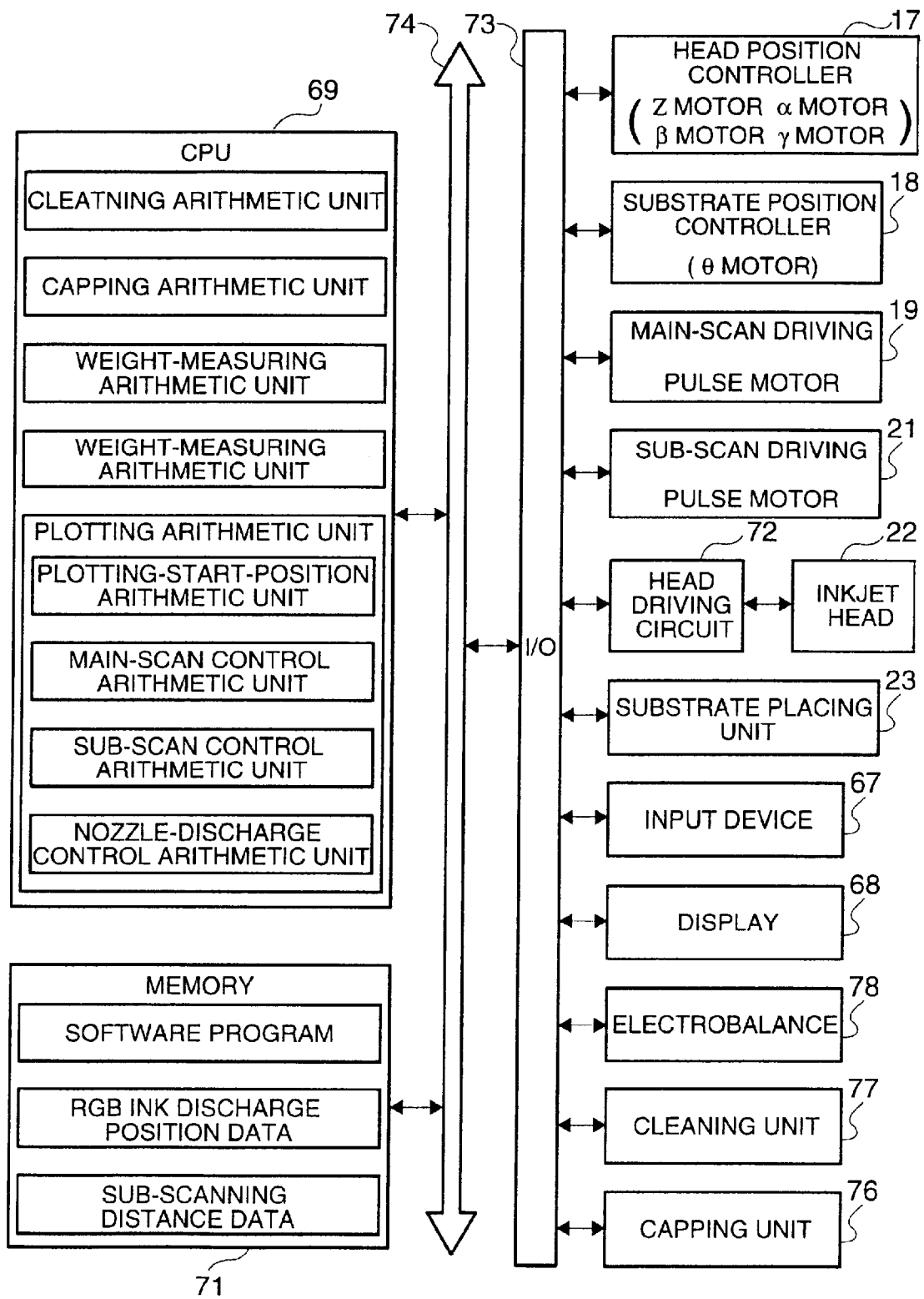
FIG. 17 is a block diagram of an electrical control system for use in the ink-jet head (liquid-drop material discharge head) illustrated in FIG. 8.

The film forming method of the present invention is carried out when the ink-jet device (liquid-drop material discharge device) 16 illustrated in FIG. 8 is controlled by the control circuit illustrated in FIG. 17 in accordance with the control program illustrated in FIG. 18. In this case, as well, the ink ejected from the ink-jet head (liquid-drop material discharge head) 22 is a film forming material selected in accordance with the type of a film desired on the substrate.

Electronic equipment employing the liquid-crystal display of the present invention as an electrooptical device of the present invention is discussed here. Although the electronic equipment employing the liquid-crystal display of the present invention is discussed here, it should be understood that the present invention is not limited to this. The electronic equipment of the present invention may be the one which employs the electroluminescence device of the present invention or the electrooptical device that is manufactured in accordance with the film forming method of the present invention.

Figure 27:
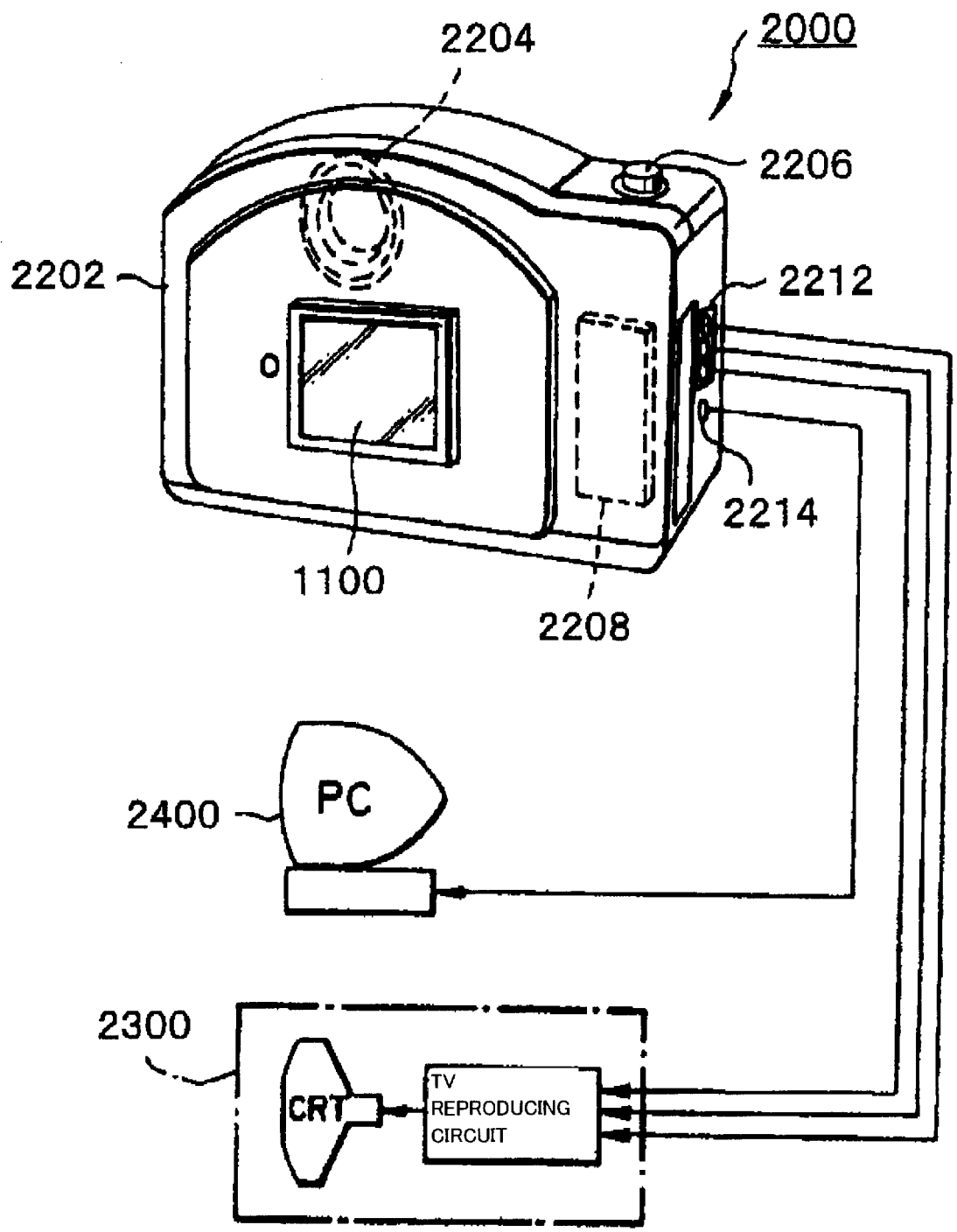
FIG. 27 is a perspective view of a digital still camera as one example of electronic equipment in accordance with one embodiment of the present invention.

FIG. 27 shows a digital still camera in which a liquid-crystal display 1100 of a fourth embodiment of the present invention is incorporated as a finder. FIG. 27 is a perspective view showing the construction of the digital still camera, and also simply showing a connection with external devices.

Ordinary cameras expose a film to the image of a subject, while a digital still camera 1200 produces a video signal by photoelectrically converting the image of a subject through an image pickup device, such as a CCD (Charge Coupled-Device). The digital still camera 2000 can include the liquid-crystal display panel, such as the above-referenced liquid-crystal display unit 1100, behind a case 2202 (in front of the case 2202 in FIG. 27), and presents a display in accordance with the video signal from the CCD. The liquid-crystal display 1100 functions as a finder for presenting the image of the subject. A light receiving unit 2204, including an optical lens and the CCD, is arranged on the front of the case 2202 (on the back of the case 2202 in FIG. 27).

When a photographer presses a shutter button 2206 recognizing the subject image presented on the liquid-crystal display 1100, the video signal on the CCD at the moment is transferred to and stored in a memory in a circuit board 2208. In the digital still camera 2000, video signal output terminals 2212 and an input/output terminal 2214 for data communication are provided on one side surface of the case 2202. As shown in FIG. 27, as necessary, a television monitor 2300 is connected to the video signal output terminals 2212, and a personal computer 2400 is connected to the input/output terminal 2214 for data communication. In response to predetermined operations, the video signal stored in the memory in the circuit board 2208 is output to the television monitor 2300 or the personal computer 2400.

FIGS. 28(A), 28(B) and 28(C) are external views of electronic equipment which incorporates a liquid-crystal display unit as the electrooptical apparatus of the present invention. FIG. 28(A) shows a mobile telephone 3000, which includes the liquid-crystal display 1100 on the upper front surface thereof. FIG. 28(B) shows a wristwatch 4000, which includes the liquid-crystal display 1100 on the center front thereof. FIG. 28(C) shows mobile information equipment 5000, which includes the liquid-crystal display 1100 as a display and an input unit 5100.

Besides the liquid-crystal display 1100, these pieces of electronic equipment include a variety of circuits, such as a display information output source, a display information processing circuit, a clock generator circuit, and a display signal generator unit including a power source circuit for supplying these circuits with power. The display presents a video image in the mobile information equipment 5000, when it is supplied with the video signal generated by the display signal generator in response to information from the input unit 5100.

It should be understood that electronic equipment which incorporates the liquid-crystal display unit 1100 of the present invention is not limited to the digital still camera, the mobile telephone, the wristwatch, and the mobile information equipment, and may be any of diversity of electronic equipment, such as electronic pocketbook, pager, POS terminal, IC card, mini disc player, liquid-crystal projector, multi-media grade personal computer (PC), engineering workstation (EWS), notebook type personal computer, word processor, television, viewfinder type or direct-monitor viewing type video tape recorder, electronic pocketbook, electronic tabletop calculator, car navigation system, apparatus having a touch panel, clock, and the like.

It should also be understood that the present invention is not limited to the above-referenced embodiments, and may be applied to industrial applications which require a fine pattern on a substrate. For example, the present invention finds applications in the formation of a variety of semiconductor elements (such as thin-film transistors, thin-film diodes, and the like), wiring patterns, and insulators.

The discharge material in this invention may be any of a variety of materials depending on an element to be produced. For example, besides the filter material, the functional layer forming material, and the film forming material, silica glass precursor, electrically conductive materials such as metal compounds, dielectric materials or semiconductor materials may be used. The present invention may be applied to form a metal wiring on a substrate or on a thin film arranged on the substrate.

In the discussion of the above-referenced embodiments, the phrase "ink-jet head (liquid-drop material discharge head)" is used to differentiate it from the other elements. The discharge material ejected from the ink-jet head (liquid-drop material discharge head) is not limited to ink. For example, the discharge material may be the above-described functional layer forming material, the silica glass precursor, the electrically conductive material such as the metal compound, the dielectric material, or the semiconductor material.

In the above-referenced embodiments, the ink-jet head (liquid-drop material discharge head) for ejecting the ink (the liquid material) by means of deformation of a piezoelectric element is used. An ink-jet head (liquid-drop material discharge head) having any construction may be used. For example, a thermal ink-jet head (liquid-drop material discharge head) making use of thermal expansion of the ink (the liquid material) may be used.

It should also be understood that the present invention is not limited to the electrooptical device, such as the liquid-crystal device and the electroluminescence device, but also to a variety of electrooptical devices which needs film formation of metal wirings. For example, the present invention may be applied to electrooptical devices including an inorganic electroluminescence device, a plasma display (PDP), an electrophoretic display (EPD), and a field emission display (FED).

The liquid-crystal display as one example of the electrooptical device shown in FIG. 21 is a passive-matrix liquid-crystal display. The present invention is applied to an active-matrix electrooptical device, such as a TFD (Thin-Film Diode) which uses a two-terminal switching element as an active element, and to an active-matrix electrooptical device, such as a TFT (Thin-Film Transistor) which uses a three-terminal switching element as an active element.

As described above, the present invention allows all nozzles, namely, elements of an ink-jet head (a liquid-drop material discharge head) to precisely pass over pixel formation regions when a print head (a liquid-drop material discharge mechanism) scans. Printing efficiency is high. The ink-jet head (the liquid-drop material discharge head) is precisely moved to scan an object to eject ink at an appropriate position.

The present invention controls variations in color from pixel to pixel, thereby making uniform optical characteristics of an optical member in plan view, such as light transmissivity characteristics of a color filter, color presentation characteristics of the liquid-crystal display, and light emission characteristics of the functional layer.

What is claimed is:

1. A method for manufacturing a color filter, comprising:
    scanning a substrate for main scan by moving a plurality of heads in a head scan direction, each head having a plurality of nozzles arranged with a constant layout pitch;
    scanning the substrate for sub scan by moving the heads with a predetermined motion pitch in a head line-feed direction which is perpendicular to the head scan direction; and
    ejecting a filter material through the plurality of nozzles to filter element formation regions of the substrate,
    a relational equation of W=mD (m is an integer of 2 or larger) substantially holding where (W) is the spacing between a nozzle at one end of a head and a nozzle at an adjacent end of an adjacent head, and (D) is the constant layout pitch of the nozzles, and
    a relational equation of P=nD (n is an integer of 1 or larger) substantially holding where (P) is a sub scanning motion pitch of the heads and (D) is the constant layout pitch of the nozzles.

2. A method for manufacturing a color filter according to claim 1, the heads being arranged at an angle θ with respect to the head line-feed direction, the angle θ being within a range of 0°<θ<180°, a relational equation of W=mD cos θ (m is an integer of 2 or larger) substantially holding where (W) is the spacing between a nozzle at one end of a head and a nozzle at the adjacent end of an adjacent head, and (D cos θ) is a layout pitch of the nozzles in the head line-feed direction, and
    a relational equation P=nD cos θ (n is an integer of 1 or larger) substantially holding where (P) is the sub scanning motion pitch of the heads in the head line-feed direction and (D cos θ) is the layout pitch of the nozzles in the head line-feed direction.

3. A method for manufacturing a color filter according to claim 1, the nozzle positioned at the end of the head being designed not to eject the filter material to the filter element formation region of the substrate.

4. A method for manufacturing a color filter according to claim 1, the filter material containing liquid materials of a plurality of colors, and
    the plurality of nozzles in each of the plurality of heads ejecting a liquid material of one of the plurality of colors.

5. A method for manufacturing a color filter according to claim 1, the filter material containing liquid materials of a plurality of colors, and
    the plurality of nozzles in each of the plurality of heads respectively ejecting the liquid materials of the plurality of colors.

6. A method for manufacturing a liquid-crystal display, including a step of forming a color filter, the color filter being formed in accordance with the method for manufacturing a color filter according to claim 1.

7. Electronic equipment comprising a liquid-crystal display manufactured in accordance with the method for manufacturing the liquid-crystal display according to claim 6.

8. A apparatus for manufacturing a color filter, comprising:
    a plurality of nozzles for ejecting a filter material in droplets;
    a plurality of heads, each head having a plurality of nozzles arranged with a constant layout pitch of (D);
    a main scan driving device that moves the heads in a head scan direction; and
    a sub scan driving device that moves the heads with a predetermined motion pitch (P) in a head line-feed direction which is perpendicular to the head scan direction,
    a relational equation of W=mD (m is an integer of 2 or larger) substantially holding where (W) is the spacing between a nozzle at one end of a head and a nozzle at the adjacent end of an adjacent head, and (D) is the constant layout pitch of the nozzles, and
    a relational equation of P=nD (n is an integer of 1 or larger) substantially holding where (P) is the sub scanning motion pitch of the heads and (D) is the constant layout pitch of the nozzles.

9. A apparatus for manufacturing a color filter according to claim 8, the heads being arranged at an angle θ with respect to the head line-feed direction, the angle θ being within a range of 0°<θ<180°, a relational equation of W=mD cos θ (m is an integer of 2 or larger) substantially holding where (W) is the spacing between a nozzle at one end of a head and a nozzle at an adjacent end of an adjacent head, and (D cos θ) is the layout pitch of the nozzles in the head line-feed direction, and
    a relational equation P=nD cos θ (n is an integer of 1 or larger) substantially holding where (P) is the sub scanning motion pitch of the heads in the head line-feed direction and (D cos θ) is the layout pitch of the nozzles in the head line-feed direction.

10. An apparatus for manufacturing a liquid-crystal display including a color filter, the apparatus for manufacturing the liquid-crystal display comprising the apparatus for manufacturing the color filter according to claim 8.

11. A method for manufacturing an electroluminescence substrate, comprising:
    scanning a substrate for main scan by moving a plurality of heads in a head scan direction, each head having a plurality of nozzles arranged with a constant layout pitch;
    scanning the substrate for sub scan by moving the heads with a predetermined motion pitch in a head line-feed direction which is perpendicular to the head scan direction; and
    ejecting a functional layer forming material through the plurality of nozzles to functional layer forming regions of the substrate,
    a relational equation of W=mD (m is an integer of 2 or larger) substantially holding where (W) is the spacing between a nozzle at one end of a head and a nozzle at an adjacent end of an adjacent head, and (D) is the constant layout pitch of the nozzles, and
    a relational equation of P=nD (n is an integer of 1 or larger) substantially holding where (P) is a sub scanning motion pitch of the heads and (D) is the constant layout pitch of the nozzles.

12. A method for manufacturing an electroluminescence substrate according to claim 11, the heads being arranged at an angle θ with respect to the head line-feed direction, the angle θ being within a range of 0°<θ<180°, a relational equation of W=mD cos θ (m is an integer of 2 or larger) substantially holding where (W) is the spacing between a nozzle at one end of a head and a nozzle at the adjacent end of an adjacent head, and (D cos θ) is a layout pitch of the nozzles in the head line-feed direction, and a relational equation P=nD cos θ (n is an integer of 1 or larger) substantially holding where (P) is the sub scanning motion pitch of the heads in the head line-feed direction and (D cos θ) is the layout pitch of the nozzles in the head line-feed direction.

13. A method for manufacturing an electroluminescence substrate according to claim 11, the nozzle positioned at the end of the head being designed not to eject the functional layer forming material to the functional layer formation region of the substrate.

14. A method for manufacturing an electroluminescence substrate according to claim 11, the functional layer forming material being a light emission layer forming material.

15. A method for manufacturing an electroluminescence substrate according to claim 14, the light emission layer forming material containing a plurality of materials different from each other in emission color, and the plurality of nozzles in each head ejecting one of the plurality of materials different from each other in emission color.

16. A method for manufacturing an electroluminescence substrate according to claim 14, the light emission layer forming material containing a plurality of materials different from each other in emission color, and each of the plurality of nozzles in each head ejecting a respective one of the plurality of materials different from each other in emission color.

17. A method for manufacturing an electroluminescence substrate according to claim 11, the functional layer forming material being a hole injection and transport layer forming material.

18. A method for manufacturing an electroluminescence substrate according to claim 11, the functional layer forming material comprising a material selected from the group of a light emission layer forming material and a hole injection and transport layer forming material.

19. A method for manufacturing an electroluminescence device, including a step of forming a functional layer, the functional layer being formed in accordance with the method for manufacturing the electroluminescence substrate according to claim 11.

20. Electronic equipment comprising an electroluminescence device manufactured in accordance with the method for manufacturing the electroluminescence device according to claim 19.

21. A apparatus for manufacturing an electroluminescence substrate, comprising:

a plurality of nozzles that eject a functional layer forming material in droplets, a plurality of heads, each head having a plurality of nozzles arranged with a constant layout pitch of (D);

a main scan driving device that moves the heads in a head scan direction; and a sub scan driving device that moves the heads with a predetermined motion pitch (P) in a head line-feed direction which is perpendicular to the head scan direction, a relational equation of W=mD (m is an integer of 2 or larger) substantially holding where (W) is the spacing between a nozzle at one end of a head and a nozzle at an adjacent end of an adjacent head, and (D) is the constant layout pitch of the nozzles, and a relational equation of P=nD (n is an integer of 1 or larger) substantially holding where (P) is the sub scanning motion pitch of the heads and (D) is the constant layout pitch of the nozzles.

22. A apparatus for manufacturing an electroluminescence substrate according to claim 21, the heads being arranged at an angle θ with respect to the head line-feed direction, the angle θ being within a range of 0°<θ<180°, a relational equation of W=mD cos θ (m is an integer of 2 or larger) substantially holding where (W) is the spacing between a nozzle at one end of a head and a nozzle at the adjacent end of an adjacent head, and (D cos θ) is the layout pitch of the nozzles in the head line-feed direction, and a relational equation P=nD cos θ (n is an integer of 1 or larger) substantially holding where (P) is the sub scanning motion pitch of the heads in the head line-feed direction and (D cos θ) is the layout pitch of the nozzles in the head line-feed direction.

23. An apparatus for manufacturing an electroluminescence device including an electroluminescence substrate, the apparatus for manufacturing the electroluminescence device comprising the apparatus for manufacturing the electroluminescence substrate according to claim 21.

24. A head scanning method, comprising:

scanning a substrate for main scan by moving a plurality of heads in a head scan direction, each head having a plurality of nozzles arranged with a predetermined layout pitch;

scanning the substrate for sub scan by moving the heads with a predetermined motion pitch in a head line-feed direction which is perpendicular to the head scan direction; and ejecting a discharge material through the plurality of nozzles to the substrate, a relational equation of W=mD (m is an integer of 2 or larger) substantially holding where (W) is the spacing between a nozzle at one end of a head and a nozzle at the adjacent end of an adjacent head, and (D) is the constant layout pitch of the nozzles, and a relational equation of P=nD (n is an integer of 1 or larger) substantially holding where (P) is the sub scanning motion pitch of the heads and (D) is the constant layout pitch of the nozzles.

25. A head scanning method according to claim 24, the heads being arranged at an angle θ with respect to the head line-feed direction, the angle θ being within a range of 0°<θ<180°, a relational equation of W=mD cos θ (m is an integer of 2 or larger) substantially holding where (W) is the spacing between a nozzle at one end of a head and a nozzle at the adjacent end of an adjacent head, and (D cos θ) is the layout pitch of the nozzles in the head line-feed direction, and a relational equation P=nD cos θ (n is an integer of 1 or larger) substantially holding where (P) is the sub scanning motion pitch of the heads in the head line-feed direction and (D cos θ) is the layout pitch of the nozzles in the head line-feed direction.

26. A head scanning method according to claim 24, the nozzle positioned at the end of the head being designed not to eject the discharge material to a discharge material deposit region of the substrate.

27. A head scanning method according to claim 24, the discharge material containing a plurality of materials different from each other in characteristics, and the plurality of nozzles in each head ejecting one of the plurality of materials different from each other in the characteristics.

28. A head scanning method according to claim 24, the discharge material containing a plurality of materials different from each other in characteristics, and each of the plurality of nozzles in each head ejecting a respective one of the plurality of materials different from each other in the characteristics.

29. A head scanning apparatus, comprising:

a plurality of nozzles that eject a discharge material in droplets;

a plurality of heads, each head having a plurality of nozzles arranged with a constant layout of pitch of (D);

a main scan driving device that moves the heads in a head scan direction; and a sub scan driving device that moves the heads with a predetermined motion pitch (P) in a head line-feed direction which is perpendicular to the head scan direction, a relational equation of W=mD (m is an integer of 2 or larger) substantially holding where (W) is the spacing between a nozzle at one end of a head and a nozzle at the adjacent end of an adjacent head, and (D) is the constant layout pitch of the nozzles, and a relational equation of P=nD (n is an integer of 1 or larger) substantially holding where (P) is the sub scanning motion pitch of the heads and (D) is the constant layout pitch of the nozzles.

30. A head scanning apparatus according to claim 29, the heads being arranged at an angle θ with respect to the head line-feed direction, the angle θ being within a range of 0°<θ<180°, a relational equation of W=mD cos θ (m is an integer of 2 or larger) substantially holding where (W) is the spacing between a nozzle at one end of a head and a nozzle at an adjacent end of an adjacent head, and (D cos θ) is the layout pitch of the nozzles in the head line-feed direction, and a relational equation P=nD cos θ (n is an integer of 1 or larger) substantially holding where (P) is the sub scanning motion pitch of the heads in the head line-feed direction and (D cos θ) is the layout pitch of the nozzles in the head line-feed direction.

31. A film forming method, comprising:

scanning a substrate for main scan by moving a plurality of heads in a head scan direction, each head having a plurality of nozzles arranged with a constant layout pitch;

scanning the substrate for sub scan by moving the heads with a predetermined motion pitch in a head line-feed direction which is perpendicular to the head scan direction; and ejecting a film forming material through the plurality of nozzles to film formation regions of the substrate, a relational equation of W≈mD (m is an integer of 2 or larger) holding where (W) is the spacing between a nozzle at one end of a head and a nozzle at an adjacent end of an adjacent head, and (D) is the constant layout pitch of the nozzles, and a relational equation of P≈nD (n is an integer of 1 or larger) holds where (P) is the sub scanning motion pitch of the heads and (D) is the constant layout pitch of the nozzles.

32. A film forming method according to claim 31, the heads being arranged at an angle θ with respect to the head line-feed direction, the angle θ being within a range of 0°<θ<180°, a relational equation of W≈mD cos θ (m is an integer of 2 or larger) holding where (W) is the spacing between a nozzle at one end of a head and a nozzle at the adjacent end of an adjacent head, and (D cos θ) is the layout pitch of the nozzles in the head line-feed direction, and a relational equation P≈nD cos θ (n is an integer of 1 or larger) holding where (P) is the sub scanning motion pitch of the heads in the head line-feed direction and (D cos θ) is the layout pitch of the nozzles in the head line-feed direction.

33. A film forming method according to claim 31, the nozzle positioned at the end of the head being designed not to eject the film forming material to the film formation region of the substrate.

34. A film forming method according to claim 31, the film forming material containing a plurality of materials different from each other in characteristics, and the plurality of nozzles in each head ejecting one of the plurality of materials different from each other in the characteristics.

35. A film forming method according to claim 31, the film forming material containing a plurality of materials different from each other in characteristics, and each of the plurality of nozzles in each head ejecting a respective one of the plurality of materials different from each other in the characteristics.

36. A method for manufacturing an electrooptical device, the method using a film forming method according to claim 31.

37. A film forming apparatus, comprising:

a plurality of nozzles that ejects a film forming material in droplets;

a plurality of heads, each head having a plurality of nozzles arranged with a constant layout of pitch of (D);

a main scan driving device that moves the heads in a head scan direction; and a sub scan driving device that moves the heads with a predetermined motion pitch (P) in a head line-feed direction which is perpendicular to the head scan direction, a relational equation of W≈mD (m is an integer of 2 or larger) holding where (W) is the spacing between a nozzle at one end of a head and a nozzle at the adjacent end of an adjacent head, and (D) is the constant layout pitch of the nozzles, and a relational equation of P≈nD (n is an integer of 1 or larger) holding where (P) is the sub scanning motion pitch of the heads and (D) is the constant layout pitch of the nozzles.

38. A film forming apparatus according to claim 39, the heads being arranged at an angle θ with respect to the head line-feed direction, the angle θ being within a range of 0°<θ<180°, a relational equation of W≈mD cos θ (m is an integer of 2 or larger) holding where (W) is the spacing between a nozzle at one end of a head and a nozzle at the adjacent end of an adjacent head, and (D cos θ) is the layout pitch of the nozzles in the head line-feed direction, and a relational equation P≈nD cos θ (n is an integer of 1 or larger) holding where (P) is the sub scanning motion pitch of the heads in the head line-feed direction and (D cos θ) is the layout pitch of the nozzles in the head line-feed direction.

39. An electrooptical device manufactured in accordance with the method for manufacturing the electrooptical device according to claim 36.

40. Electronic equipment comprising the electrooptical device according to claim 37.

41. A method for manufacturing a color filter, comprising:
main scanning and sub scanning a substrate by moving a plurality of heads having a plurality of nozzles,
a relational equation of W=mD (m is an integer of 2 or larger) substantially holding where (W) is the spacing between a nozzle at one end of a head and a nozzle at an adjacent end of an adjacent head, and (D) is a constant layout pitch of the nozzles, and
a relational equation of P=nD (n is an integer of 1 or larger) substantially holding where (P) is a sub scanning motion pitch of the heads.

42. An apparatus for manufacturing a color filter, comprising:
a plurality of heads, each head having a plurality of nozzles arranged with a constant layout pitch of (D);
a main scan driving device that moves the heads in a head scan direction; and
a sub scan driving device that moves the heads with a predetermined motion pitch (P) in a head line-feed direction which is perpendicular to the head scan direction,
a relational equation of W=mD (m is an integer of 2 or larger) substantially holding where (W) is the spacing between a nozzle at one end of a head and a nozzle at an adjacent end of an adjacent head, and
a relational equation of P=nD (n is an integer of 1 or larger) substantially holding where (P) is the sub scanning motion pitch of the heads.

43. A method for manufacturing an electroluminescence substrate, comprising:
scanning a substrate for main scan by moving a plurality of heads in a head scan direction, each head having a plurality of nozzles arranged with a constant layout pitch; and
scanning the substrate for sub scan by moving the heads with a predetermined motion pitch in a head line-feed direction which is perpendicular to the head scan direction,
a relational equation of W=mD (m is an integer of 2 or larger) substantially holding where (W) is the spacing between a nozzle at one end of a head and a nozzle at an adjacent end of an adjacent head, and (D) is the constant layout pitch of the nozzles, and
a relational equation of P=nD (n is an integer of 1 or larger) substantially holding where (P) is a sub scanning motion pitch of the heads.

44. An apparatus for manufacturing an electroluminescence substrate, comprising:
a plurality of heads, each head having a plurality of nozzles arranged with a constant layout pitch of(D);
a main scan driving device that moves the heads in a head scan direction; and
a sub scan driving device that moves the heads with a predetermined motion pitch (P) in a head line-feed direction which is perpendicular to the head scan direction,
a relational equation of W=mD (m is an integer of 2 or larger) substantially holding where (W) is the spacing between a nozzle at one end of a head and a nozzle at an adjacent end of an adjacent head, and
a relational equation of P=nD (n is an integer of 1 or larger) substantially holding where (P) is the sub scanning motion pitch of the heads.

45. A head scanning method, comprising:
scanning a substrate for main scan by moving a plurality of heads in a head scan direction, each head having a plurality of nozzles arranged with a predetermined layout pitch; and
scanning the substrate for sub scan by moving the heads with a predetermined motion pitch in a head line-feed direction which is perpendicular to the head scan direction;
a relational equation of W=mD (m is an integer of 2 or larger) substantially holding where (W) is the spacing between a nozzle at one end of a head and a nozzle at the adjacent end of an adjacent head, and (D) is the constant layout pitch of the nozzles, and
a relational equation of P=nD (n is an integer of 1 or larger) substantially holding where (P) is the sub scanning motion pitch of the heads.

46. A head scanning apparatus comprising:
a plurality of heads, each head having a plurality of nozzles arranged with a constant layout of pitch of (D);
a main scan driving device that moves the heads in a head scan direction; and
a sub scan driving device that moves the heads with a predetermined motion pitch (P) in a head line-feed direction which is perpendicular to the head scan direction,
a relational equation of W=mD (m is an integer of 2 or larger) substantially holding where (W) is the spacing between a nozzle at one end of a head and a nozzle at an adjacent end of an adjacent head, and
a relational equation of P=nD (n is an integer of 1 or larger) substantially holding where (P) is the sub scanning motion pitch of the heads.

47. A film forming method, comprising:
scanning a substrate for main scan by moving a plurality of heads in a head scan direction, each head having a plurality of nozzles arranged with a constant layout pitch; and
scanning the substrate for sub scan by moving the heads with a predetermined motion pitch in a head line-feed direction which is perpendicular to the head scan direction,
a relational equation of W≈mD (m is an integer of 2 or larger) holding where (W) is the spacing between a nozzle at one end of a head and a nozzle at an adjacent end of an adjacent head, and (D) is the constant layout pitch of the nozzles, and
a relational equation of N≈nD (n is an integer of 1 or larger) holds where (P) is the sub scanning motion pitch of the heads.

48. A film forming apparatus, comprising:
a plurality of heads, each head having a plurality of nozzles arranged with a constant layout of pitch of(D);
a main scan driving device that moves the heads in a head scan direction; and
a sub scan driving device that moves the heads with a predetermined motion pitch (P) in a head line-feed direction which is perpendicular to the head scan direction,
a relational equation of W≈mD (m is an integer of 2 or larger) holding where (W) is the spacing between a nozzle at one end of a head and a nozzle at the adjacent end of an adjacent head, and
a relational equation of P≈nD (n is an integer of 1 or larger) holding where (P) is the sub scanning motion pitch of the heads.

* * * * *